United States Patent
Ha et al.

(10) Patent No.: US 8,373,928 B2
(45) Date of Patent: Feb. 12, 2013

(54) POLARIZER AND ORGANIC LIGHT EMITTING DISPLAY APPARATUS COMPRISING THE POLARIZER

(75) Inventors: Jae-Heung Ha, Suwon-si (KR);
Kyu-Hwan Hwang, Suwon-si (KR);
Sang-Hwan Cho, Suwon-si (KR);
Young-Woo Song, Suwon-si (KR);
Jong-Hyuk Lee, Suwon-si (KR);
Yong-Hee Lee, Suwon-si (KR); Jin-Kyu Yang, Suwon-si (KR)

(73) Assignees: Samsung Display Co., Ltd., Yongin, Gyeonggi-Do (KR); Korea Advanced Institute of Science and Technology, Yuseong-Gu, Daejeon (KR)

( * ) Notice: Subject to any disclaimer, the term of this patent is extended or adjusted under 35 U.S.C. 154(b) by 1045 days.

(21) Appl. No.: 12/105,641

(22) Filed: Apr. 18, 2008

(65) Prior Publication Data
US 2008/0258614 A1 Oct. 23, 2008

(30) Foreign Application Priority Data

Apr. 19, 2007 (KR) .................. 10-2007-0038324
Feb. 26, 2008 (KR) .................. 10-2008-0017435

(51) Int. Cl.
*G02B 5/30* (2006.01)

(52) U.S. Cl. ............................................. 359/485.05

(58) Field of Classification Search .......... None
See application file for complete search history.

(56) References Cited

U.S. PATENT DOCUMENTS

| | | | |
|---|---|---|---|
| 6,532,111 B2 * | 3/2003 | Kurtz et al. | 359/485.05 |
| 6,844,971 B2 * | 1/2005 | Silverstein et al. | 359/485.05 |
| 7,113,335 B2 | 9/2006 | Sales | |
| 2002/0191880 A1 | 12/2002 | Borrelli et al. | |
| 2004/0125449 A1 * | 7/2004 | Sales | 359/486 |
| 2005/0194896 A1 * | 9/2005 | Sugita et al. | 313/506 |
| 2008/0094547 A1 * | 4/2008 | Sugita et al. | 349/96 |
| 2008/0225389 A1 * | 9/2008 | Oh et al. | 359/486 |

FOREIGN PATENT DOCUMENTS

| | | |
|---|---|---|
| JP | 2002-28234 | 1/2002 |
| JP | 2004-349061 | 12/2004 |
| KR | 2001-108115 | 12/2001 |
| KR | 2006-90761 | 8/2006 |
| KR | 10-2007-0101814 | 10/2007 |
| KR | 10-2008-0001583 | 1/2008 |

OTHER PUBLICATIONS

Definition of "on" from http://www.merriam-webster.com/dictionary/on, Retrieved from the world wide web on Jun. 15, 2011.*

* cited by examiner

*Primary Examiner* — Derek S Chapel
(74) *Attorney, Agent, or Firm* — Lee & Morse, P.C.

(57) ABSTRACT

A polarizer includes a base and a plurality of grids arranged on a surface of the base parallel to one another. Each of the grids comprises an intermediate layer and a semi-transmissive metal layer that reflects a part of external light incident thereon and transmits a part of the external light incident thereon. The semi-transmissive metal layer and the intermediate layer are alternately deposited to include at least two semi-transmissive metal layers. The thicknesses of the semi-transmissive metal layers increases in a direction in which the semi-transmissive metal layer is disposed away from the external light. An organic light emitting display apparatus includes the polarizer and has improved contrast and brightness.

26 Claims, 35 Drawing Sheets

EXTERNAL LIGHT

EXTERNAL LIGHT

EXTERNAL LIGHT

EXTERNAL LIGHT

EXTERNAL LIGHT

EXTERNAL LIGHT

POLARIZER AND ORGANIC LIGHT EMITTING DISPLAY APPARATUS COMPRISING THE POLARIZER

CROSS-REFERENCE TO RELATED APPLICATIONS

This application claims the benefit of Korean Patent Application No. 2007-38324 filed on Apr. 19, 2007, in the Korean Intellectual Property Office and the benefit of Korean Patent Application No. 2008-17435 filed Feb. 26, 2008, in the Korean Intellectual Property Office, the disclosures of which are incorporated herein by reference.

BACKGROUND OF THE INVENTION

1. Field of the Invention

Aspects of the present invention relate to a polarizer and an organic light emitting display apparatus comprising the polarizer, and more particularly, to a polarizer having improved contrast and visibility, and an organic light emitting display apparatus having the same.

2. Description of the Related Art

Recently, display apparatuses have been replaced by portable thin flat panel devices. Of the flat panel devices, organic or inorganic light emitting display apparatuses that are self-light emitting display apparatuses draw attention as next generation display apparatuses because of their wide viewing angle, superior contrast, and fast response speed. Also, compared to an inorganic light emitting display apparatus, an organic light emitting display apparatus in which a light emitting layer is formed of an organic material is advantageous in that brightness, drive voltage, and response speed are excellent, and color displays are possible.

Flat panel devices have become portable; thus, the flat panel devices are manufactured to be light and thin. When a user views an image on a flat panel display outdoors, due to the reflection of sunlight, contrast and visibility of the image are deteriorated. In particular, it is a problem that such reflection becomes severe in a metal reflection film of the organic light emitting display apparatus.

To address such and/or other problems, a circularly polarized panel is arranged at a surface of the organic light emitting display apparatus. The circularly polarized panel typically includes a linearly polarized panel having a thin wire grid formed of a metal. Since the grid that is formed of a metal material reflects external light, there is a limit in improving contrast.

SUMMARY OF THE INVENTION

Aspects of the present invention provide a polarizer which improves contrast and visibility of a flat panel display and an organic light emitting display apparatus comprising the polarizer.

According to an aspect of the present invention, a polarizer comprises a base, and a plurality of grids arranged on a surface of the base parallel to one another, wherein each of the grids comprises at least one intermediate layer and at least two semi-transmissive metal layers that each reflects a part of external light incident thereon and each transmits a part of the external light incident thereon, the semi-transmissive metal layers and the intermediate layer are alternately disposed, and thicknesses of the semi-transmissive metal layers increase as the semi-transmissive metal layers are disposed farther away from the external light.

According to aspects of the present invention, the at least one intermediate layer is formed of any one selected from a group consisting of $SiO_x$ ($x \geqq 1$), $SiN_x$ ($x \geqq 1$), $MgF_2$, $CaF_2$, $Al_2O_3$, $SnO_2$, ITO, IZO, ZnO, $In_2O_3$, and combinations thereof.

According to aspects of the present invention, the semi-transmissive metal layers are formed of one selected from a group consisting of Fe, Co, V, Ti, Al, Ag, Si, Cr, Mo, Ge, Y, Zn, Zr, W, Ta, Cu, Pt, and combinations thereof.

According to aspects of the present invention, the semi-transmissive metal layers and the intermediate layer are formed to generate destructive interference within the external light reflected by the grids.

According to another aspect of the present invention, an organic light emitting display apparatus comprises a substrate, an organic light emitting device formed on the substrate to form an image, a sealing member formed on the organic light emitting device, a quarter wave layer formed on a surface of at least one of the substrate, the organic light emitting device, and the sealing member, and a linear polarization layer formed on a surface of at least one of the substrate, the organic light emitting device, the sealing member, and the quarter wave layer, and the linear polarization layer is located closer to a side of the organic light emitting display apparatus that displays the image than the quarter wave layer, wherein the linear polarization layer includes a plurality of grids arranged parallel to one another, each of the grids includes at least one intermediate layer and at least two semi-transmissive metal layers that each reflects a part of external light incident thereon and each transmits a part of the external light incident thereon, the semi-transmissive metal layer and the intermediate layer are alternately disposed, and thicknesses of the semi-transmissive metal layers increase as the semi-transmissive metal layers are disposed farther away from the external light.

According to aspects of the present invention, the image formed by the organic light emitting device is transmitted in a direction toward the substrate, the linear polarization layer is formed on the substrate, the quarter wave layer is formed on the linear polarization layer, and the organic light emitting device is formed on the quarter wave layer.

According to aspects of the present invention, the image formed by the organic light emitting device is transmitted in a direction toward the substrate, the quarter wave layer is formed on the substrate, the organic light emitting device is formed on the quarter wave layer, and the linear polarization layer is formed on a surface of the substrate opposite to the surface on which the quarter wave layer is formed.

According to aspects of the present invention, the image formed by the organic light emitting device is transmitted in a direction toward the substrate and the quarter wave layer and the linear polarization layer are sequentially formed on a surface of the substrate opposite to the surface on which the organic light emitting device is formed.

According to aspects of the present invention, the image formed by the organic light emitting device is transmitted in a direction toward the sealing member, the quarter wave layer is formed on the organic light emitting device, and the linear polarization layer is formed on the quarter wave layer.

According to aspects of the present invention, the organic light emitting display apparatus further comprises a protection film disposed between the organic light emitting device and the quarter wave layer.

According to aspects of the present invention, the image formed by the organic light emitting device is transmitted in a direction toward the sealing member and the quarter wave layer and the linear polarization layer are sequentially formed on a surface of the sealing member opposite to the surface on which the organic light emitting device is formed.

According to aspects of the present invention, the image is formed in a direction toward the sealing member, the quarter wave layer is formed on a surface of the sealing member that faces the organic light emitting device, and the linear polarization layer is formed on a surface of the sealing member opposite to the surface on which the quarter wave layer is formed.

According to aspects of the present invention, the image formed by the organic light emitting device is transmitted in a direction toward the sealing member, the linear polarization layer is formed on a surface of the sealing member that faces the organic light emitting device, and the quarter wave layer is formed on a surface of the linear polarization layer that faces the organic light emitting device.

According to aspects of the present invention, the image formed by the organic light emitting device is transmitted in a direction toward the sealing member, a reflection film is disposed on the organic light emitting device on a side of the organic light emitting device opposite to the direction toward the sealing member, the quarter wave layer is formed between the reflection film and the organic light emitting device, and the linear polarization layer is formed on the organic light emitting device.

According to another aspect of the present invention, a polarizer comprises a base, and a grid comprising a first metal layer formed on a surface of the base, a second metal layer formed on the first metal layer, and an intermediate layer arranged between the first and second metal layers, wherein one of the first and second metal layers that is located closer to external light is a semi-transmissive film that reflects a part of the external light incident thereon and transmits a part of the external light incident thereon and has a reflectance lower than a reflectance of the other metal layer.

According to another aspect of the present invention, an organic light emitting display apparatus comprises a substrate, an organic light emitting device formed on the substrate to form an image, a sealing member formed on the organic light emitting device, a quarter wave layer formed on a surface of at least one of the substrate, the organic light emitting device, and the sealing member, and a linear polarization layer formed on a surface of at least one of the substrate, the organic light emitting device, the sealing member, and the quarter wave layer, and the linear polarization layer is located closer to a side of the organic light emitting display apparatus that displays the image than the quarter wave layer, wherein the linear polarization layer includes a plurality of grids, each grid comprising a first metal layer, a second metal layer formed on the first metal layer, and an intermediate layer arranged between the first and second metal layers, and one of the first and second metal layers that is located closer to external light is a semi-transmissive film that reflects a part of the external light incident thereon and transmits a part of the external light incident thereon and has a reflectance lower than a reflectance of the other metal layer.

According to aspects of the present invention, the first metal layer is formed of chromium and the second metal layer is formed of aluminum. According to aspects of the present invention, the first metal layer, the second metal layer, and the intermediate layer are formed to generate destructive interference within the external light reflected by the grids.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages of the present invention will become more apparent by describing in detail exemplary embodiments thereof with reference to the attached drawings in which: These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
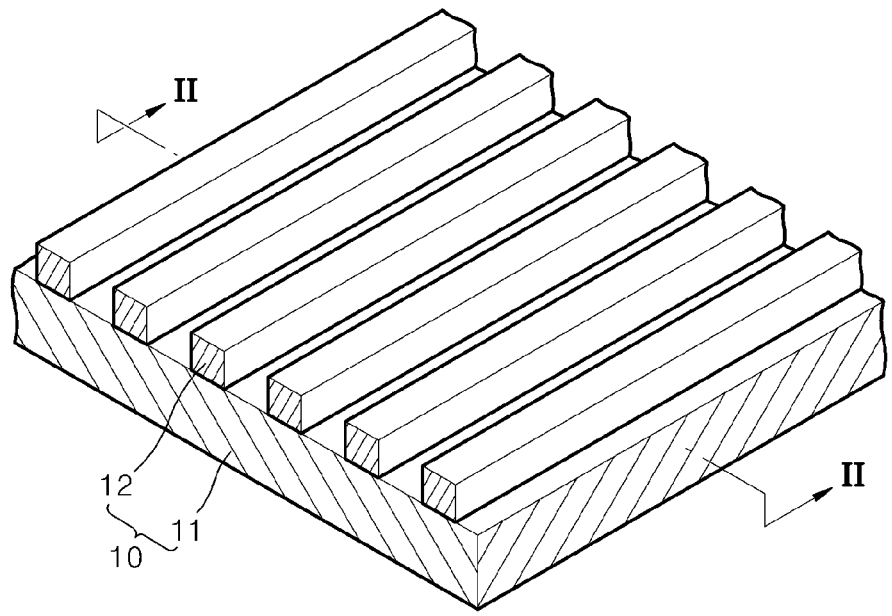
FIG. 1 is a perspective view of a polarizer according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures. Throughout this specification and the claims that follow, when it is described that an element is "formed on" or "electrically connected to" another element, the element may be directly formed on or electrically connected to the other element or formed on or electrically connected to the other element with one or more elements disposed therebetween. In addition, unless explicitly described to the contrary, the word "comprise" and variations such as "comprises" or "comprising" will be understood to imply the inclusion of stated elements but not the exclusion of any other elements.

Figure 2:
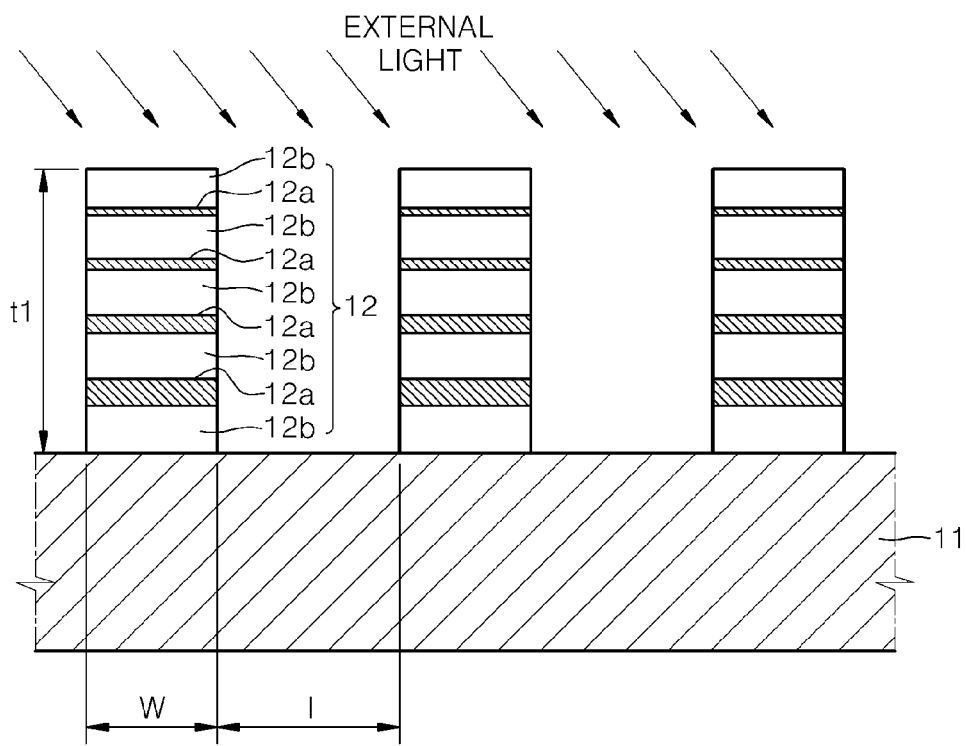
FIG. 2 is a partial cross-sectional view taken along line II-II of FIG. 1.
Figure 3:
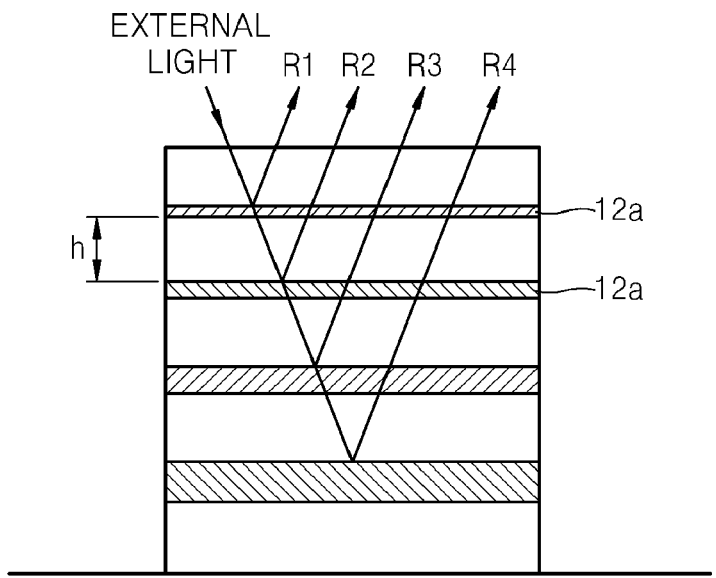
FIG. 3 illustrates the reflection of external light in each grid of FIG. 2.

FIG. 1 is a perspective view of a polarizer 10 according to an embodiment of the present invention. FIG. 2 is a partial cross-sectional view taken along line II-II of FIG. 1. FIG. 3 illustrates the reflection of external light in each grid of FIG. 2. Referring to FIGS. 1 and 2, the polarizer 10 includes a base 11 and a plurality of grids 12. The base 11 may be formed of a transparent material to facilitate the passage of light generated by a display apparatus in which the polarizer 10 is installed. If the base 11 is transparent, the base 11 may be formed of glass or flexible plastic, and preferably, a material including plastic so as to form the base 11 as a film.

The grids 12 are formed on the base 11 at a predetermined interval I and arranged parallel in strips so as to polarize light having a certain polarity in an electromagnetic wave. To use the polarizer 10 as a polarizer for visible rays, the width W and the thickness t1 of each of the grids 12 may be, respectively, formed to be 10-500 nm and 50-500 nm. The interval I of the grids 12 is a major factor in determining the performance of the polarizer 10. When the interval I of the grids 12 is longer than the wavelength of incident light, the polarizer 10 works as a diffraction grid rather than as a polarizer. When the interval I of the grids 12 is shorter than the wavelength of the incident light, the grids 12 work as the polarizer rather than as a diffraction grid.

An optical constant k is related to the absorption of light. As the value of k increases, the characteristic of the polarizer of absorbing the light that vibrates in a particular direction is improved. Metal typically having a high value of k is widely used for a conventional grid. However, since the reflectance of the metal at a surface is high, there is a limit in improving the overall contrast of a display apparatus due to the reflection of external light from the surface of the grid (i.e., the metal reflects incident light, thereby degrading the quality of the display).

Each of the grids 12 of the present embodiment includes a plurality of semi-transmissive metal layers 12a and intermediate layers 12b. The semi-transmissive metal layers 12a and the intermediate layers 12b are alternately deposited. Referring to FIGS. 1 through 3, each of the grids 12 includes four semi-transmissive metal layers 12a, but aspects of the present invention are not limited thereto and more layers may be deposited. The semi-transmissive metal layers 12a may be formed of Fe, Co, V, Ti, Al, Ag, Si, Cr, Mo, Ge, Y, Zn, Zr, W, Ta, Cu, or Pt. The intermediate layers 12b may include a transparent material. The intermediate layers 12b may be formed of an insulating transparent material, such as, $SiO_x$ ($x \geq 1$), $SiN_x$ ($x \geq 1$), $MgF_2$, $CaF_2$, $Al_2O_3$, or $SnO_2$. Also, the intermediate layers 12b may be formed of a transparent conductive material such as ITO (indium tin oxide), IZO (indium zinc oxide), ZnO, or $In_2O_3$.

Referring to FIGS. 2 and 3, the thickness of each of the semi-transmissive metal layers 12a increases as each of the semi-transmissive metal layers 12a is located closer to the base 11 in a direction along the thickness t1 of the grids 12. That is, as shown in FIG. 2, when external light is radiated from above the semi-transmissive metal layers 12a, the semi-transmissive metal layers 12a are arranged such that the thickness of each of the semi-transmissive metal layers 12a increases as the semi-transmissive metal layers 12a of each of the grids 12 are located farther from the external light.

Referring to FIG. 3, when the external light is incident on the semi-transmissive metal layers 12a, the semi-transmissive metal layers 12a work as a sort of a semi-transmissive film to transmit part of the external light and reflect part of the external light. The semi-transmissive metal layers 12a are formed into a thin film that is several to hundreds of nanometers thick so as to work as a semi-transmissive film. The external light is first incident on a surface of the outermost one of the semi-transmissive metal layers 12a and part R1 of the external light is reflected therefrom as shown in FIG. 3. The rest of the external light that passes through the outermost one of the semi-transmissive metal layers 12a arrives at the next one of the semi-transmissive metal layers 12a. Likewise, while part of the external light passes through the next one of the semi-transmissive metal layers 12a, part R2 of the external light is reflected by the next one of the semi-transmissive metal layers 12a. The parts of the external light reflected by each of the semi-transmissive metal layers 12a are sequentially defined from the first to the last reflected parts to be R1, R2, R3, and R4 in a direction in which the external light is incident. A phase difference exists between the reflected lights R1, R2, R3, and R4. The grids 12 are formed such that the reflected light may generate destructive interference due to a phase difference. The destructive interference may be generated by controlling the thickness and refractive index of each of the intermediate layers 12b. For example, the reflected lights R1 and R2 have a phase difference of $2\,nh/\lambda$, where n is a refractive index of the intermediate layers 12b, h is the thickness of one of the intermediate layers 12b as shown in FIG. 3, and $\lambda$ is the wavelength of the external light. When the phase difference is $(2 \times N+1)(1/2)$, where N is an integer (including 0), destructive interference is generated, i.e., when the phase difference between reflected light parts R1 and R2 is 1/2, 3/2, 5/2, etc., destructive interference is generated between parts R1 and R2. For example, when the wavelength of the external light is 480 nanometers, the refractive index of the intermediate layers 12b is 1.5, and the thickness of each of the intermediate layers 12b is 80 nanometers, since the phase difference is $2 \times 1.5 \times 80/480 = 1/2$, destructive interference is generated. A variety of structures to generate the destructive interference may be formed in consideration of the thickness and material of the intermediate layers 12b.

However, the strengths of R1 and R2 are different from each other. When the external light is incident on the grids 12a, part of the external light is reflected by the semi-transmissive metal layers 12a and part of the external light passes through the semi-transmissive metal layers 12a and proceeds further so that the amount of the external light arriving at the semi-transmissive metal layers 12a decreases in a direction in which the external light proceeds farther from the external light. Thus, when the semi-transmissive metal layers 12a are formed to have the same thickness using the same metal, the amounts of the external light reflected by the semi-transmissive metal layers 12a vary. However, as the thickness of each of the semi-transmissive metal layers 12a increases, the amount of the external light reflected by each of the semi-transmissive metal layers 12a increases.

Figure 4:
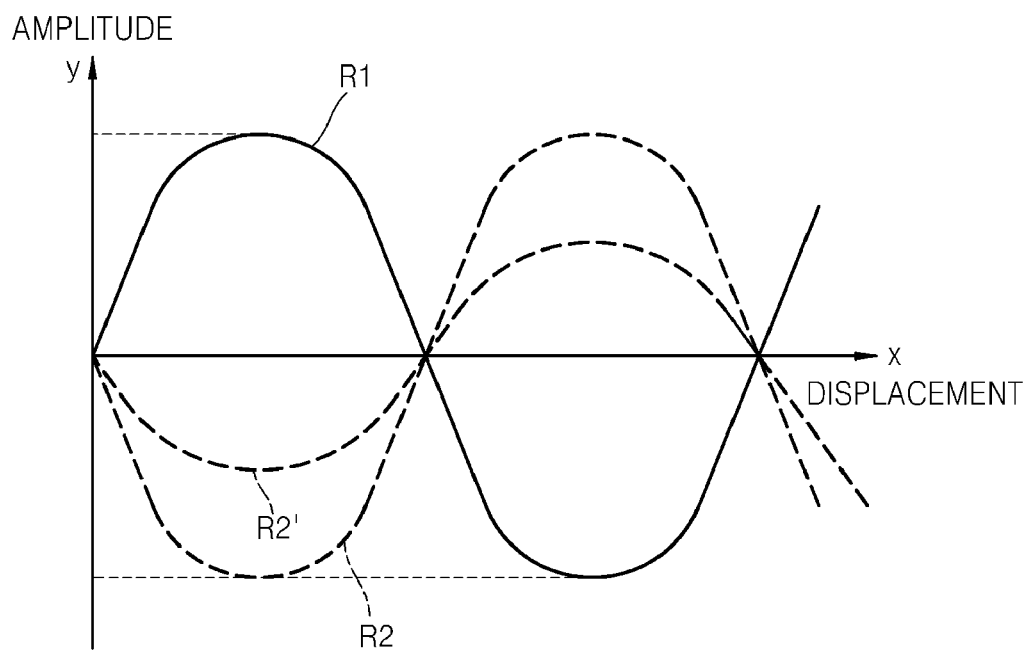
FIG. 4 is a graph schematically showing the phase of the reflected external light of FIG. 3.

FIG. 4 is a graph schematically showing the phase of the external light reflected by the semi-transmissive metal layers 12a. In the graph, the x axis denotes displacement and the y axis denotes amplitude. In FIG. 4, only R1 and R2 are illustrated for the convenience of explanation. The phase difference is controlled to generate the destructive interference as shown in FIG. 4 by controlling the thickness and material of the intermediate layers 12b. When the thicknesses of the semi-transmissive metal layers 12a are the same, the amounts of the reflected light part R1 that is first reflected by the outermost one of the semi-transmissive metal layers 12a and the reflected light part R2' that is secondly reflected by the next one of the semi-transmissive metal layers 12a become different from each other because there is less light to be reflected by the next one of the semi-transmissive metal layers 12a. As a result, even when the phase difference is controlled to generate the destructive interference by controlling the thickness and material of the intermediate layers 12b, since the amplitude, which is substantially the strength of light is different, the effect of the destructive interference is deteriorated.

However, the thickness of each of the semi-transmissive metal layers 12a increases as each of the semi-transmissive metal layers 12a is located farther from the surface where the external light is incident. The amount of the external light R1 reflected by the semi-transmissive metal layers 12a where the external light first arrives and the amount of the external light R2 reflected by the semi-transmissive metal layers 12a where the external light secondly arrives are controlled to be identical, i.e., R1=R2. In this case, the effect of the destructive interference is improved. That is, by controlling the amount of light reflected by each of the semi-transmissive layers 12a and the offsetting of the reflected light parts R1 and R2 (i.e., the amplitude and the displacement of the reflected light parts R1 and R2), the sum of the reflected light parts R1 and R2 becomes 0.

In the same manner, the strengths of R3 and R4 may be made similar to R1 by controlling the thickness of each of the semi-transmissive metal layers 12a. As a result, the effect of the destructive interference according to the phase difference between the reflected light parts R1, R2, R3, and R4 that are reflected by the semi-transmissive metal layers 12a may be improved. Thus, the reflection of the external light when the external light is incident on the grids 12 is decreased by increasing the effect of the destructive interference of the reflected light parts. As a result, contrast is improved. Although the semi-transmissive metal layers 12a are illustrated as including four layers, aspects of the present invention are not limited thereto such that there may more or fewer semi-transmissive metal layers 12a in the grids 12.

Figure 5:
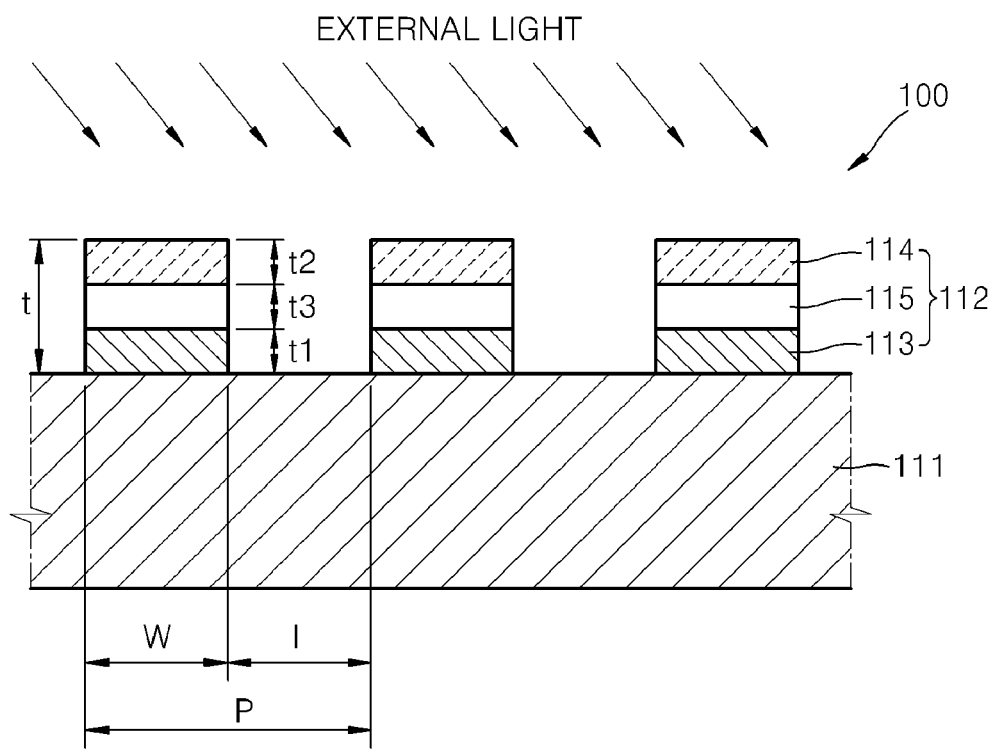
FIG. 5 is a cross-sectional view schematically showing a polarizer according to another embodiment of the present invention.
Figure 6:
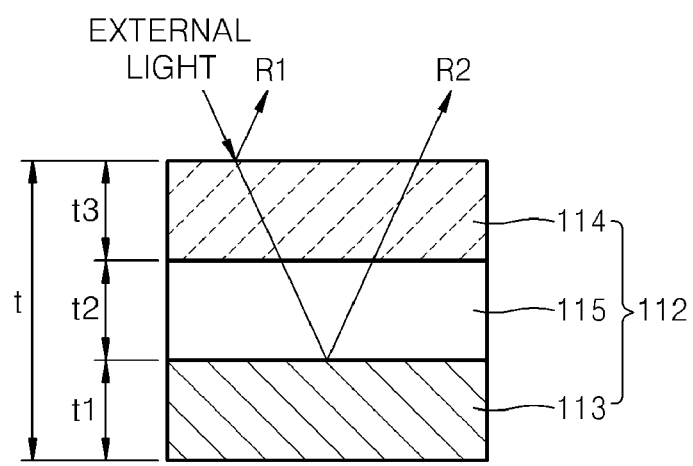
FIG. 6 is a cross-sectional view schematically showing the reflection of external light in each grid of FIG. 5.

FIG. 5 is a cross-sectional view schematically showing a polarizer 100 according to another embodiment of the present invention. FIG. 6 is a cross-sectional view schematically showing the reflection of external light in each grid of FIG. 5. Referring to FIG. 5, the polarizer 100 includes a base 111 and a plurality of grids 112. The base 111 may be formed of a transparent material to allow light generated in a display apparatus in which the polarizer 100 is to be arranged to adequately pass through the base 111. The base 111 may be formed of glass or flexible plastic, and preferably, a material including plastic so that the base 111 may be formed as a film.

The grids 112 are formed on the base 111 to be spaced from one another and arranged parallel to one another in strips so as to polarize light having a certain polarity. The width W and thickness t of each of grids 112 used as a polarizer for visible rays may be, respectively, 10-500 nm and 50-500 nm. The grids 112 are arranged at a pitch P. Thus, the width of a space between the separated grids 112 is defined to be interval I, i.e., the difference between the pitch P and the width W (P−W). The interval I is a major factor to determine the performance of the polarizer 100. When the interval I between the grids 112 is longer than the wavelength of incident light, the polarizer 100 works as a diffraction grid more than a polarizer. When the interval I between the grids 112 is shorter than the wavelength of the incident light, the grids 112 mainly work as the polarizer.

An optical constant k is related to the absorption of light. As the value of k increases, the characteristic of the polarizer of absorbing the light vibrating in a particular direction is improved. Metal typically having a high value of k is widely used for a conventional grid. However, since the reflectance of the metal at the surface is high, there is a limit in improving the overall contrast of a display apparatus due to the reflection of external light at the surface of the grids 112.

Each of the grids 112 of the present embodiment includes a first metal layer 113, a second metal layer 114, and an intermediate layer 115. The intermediate layer 115 is arranged between the first and second metal layers 113 and 114. Of the first and second metal layers 113 and 114, the one located closer to external light has a lower reflectance of the external light (i.e., the second metal layer 114 as illustrated in FIG. 5 has a lower reflectance). In FIGS. 5 and 6, the external light is radiated in a direction from the grids 112 to the base 111, i.e., from the top of the FIGS. 5 and 6. Thus, the reflectance of the second metal layer 114 located closer to the external light is lower than that of the first metal layer 113.

The first metal layer 113 may be formed of aluminum having a relatively higher reflectance than the reflectance of the second metal layer 114. The second metal layer 114 may be formed of chromium having a relatively lower reflectance than the reflectance of the first metal layer 113. However, aspects of the present invention are not limited thereto. The first and second metal layers 113 and 114 may be formed of any metals that have a sufficiently different reflectance to generate destructive interference which will be described later.

The intermediate layer 115 may include a transparent material. The intermediate layer 115 may be formed of an insulating transparent material such as $SiO_x$ ($x \geq 1$), $SiN_x$ ($x \geq 1$), $MgF_2$, $CaF_2$, $Al_2O_3$, or $SnO_2$. Also, the intermediate layer 115 may be formed of a transparent conductive material such as ITO, IZO, ZnO, or $In_2O_3$.

Referring to FIG. 6, when the external light is incident on the first and second metal layers 113 and 114, the first and second metal layers 113 and 114 work as a sort of a semi-transmissive film to transmit part of the external light and reflect part of the external light. In particular, the second metal layer 114 located closer to the external light transmits the external light so that the transmitted external light is reflected by the first metal layer 113.

The second metal layer 114 works as a semi-transmissive film and is formed to a thickness t3, which may be several to hundreds of nanometers. When the external light is incident, the external light is first incident on the second metal layer 114 of each of the grids 112 and reflected light part R1 of the external light is reflected by the second metal layer 114. The remaining or transmitted part of the external light passes through the second metal layer 114 and is incident on the first metal layer 113 to be reflected by the first metal layer 113. The external light reflected by the first metal layer 113 passes through the second metal layer 114 and exits from the second metal layer 114.

The external light sequentially reflected by the second and first metal layers 114 and 113 in a direction in which the external light is incident are defined to be R1 and R2, respectively. A phase difference exists between the reflected lights R1 and R2. The grids 112 are formed such that the reflected light generates destructive interference due to the phase difference. The destructive interference may be generated by controlling the thickness and refraction of the intermediate layer 115.

The lights R1 and R2 have a phase difference of $2 \times n \times t2/\lambda$ where n is a refraction of the intermediate layer 115, t2 is the thickness of the intermediate layer 115 as shown in FIG. 6, and $\lambda$ is the wavelength of the external light. When the phase difference is $(2 \times N+1)1/2$, where N is an integer, destructive interference is generated. For example, when the wavelength of the external light is 480 nanometers, the refraction of the intermediate layer 115 is 1.5, and the thickness of the intermediate layer 115 is 80 nanometers, since the phase difference is $2 \times 1.5 \times 80/480 = 1/2$, destructive interference is generated. A variety of structures to generate the destructive interference may be formed in consideration of the thickness and material of the intermediate layer 115.

However, the strengths of reflected light parts R1 and R2 are different from each other. When the external light is incident on the grids 112, the reflected light part R1 is reflected by the second metal layer 114 and part of the external light passes through the second metal layer 114. Thus, the amount of the external light arriving at the first metal layer 113 is less than that of the external light arriving at the second metal layer 114. However, when the first metal layer 113 is formed of a metal having a larger reflectance than that of the second metal layer 114, the amount of the reflect light part R2 reflected by the first metal layer 113 becomes identical to the amount of the external light R1 reflected by the second metal layer 114, i.e., the amplitudes of the reflected light parts R1 and R2 are the same.

Figure 7:
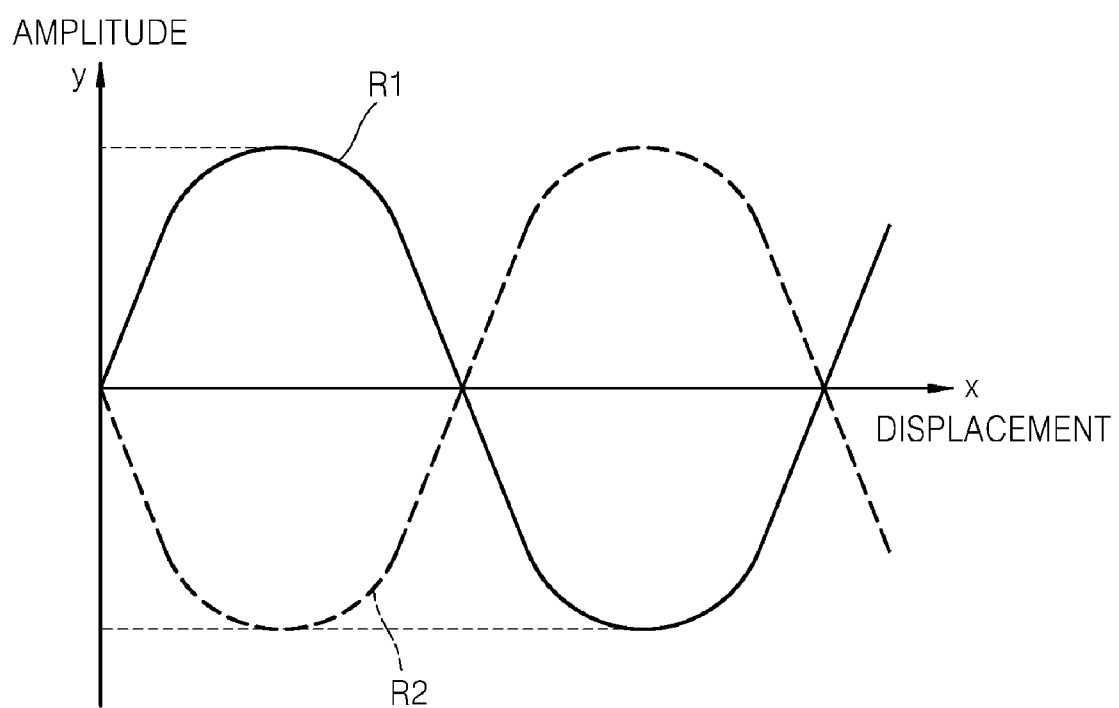
FIG. 7 is a graph schematically showing the phase of the reflected external light of FIG. 6.

FIG. 7 is a graph schematically showing the phase of the external light reflected by the first and second metal layers 113 and 114 of each of the grids 112. In the graph, the x axis indicates displacement and the y axis indicates amplitude. As described above, the phase difference is controlled to generate the destructive interference as shown in FIG. 7 by controlling the thicknesses and material of the intermediate layer 115. When the reflectance of the first and second metal layers 113 and 114 are the same, the amounts of the reflected light part R1 that is reflected by the second metal layer 114 and the reflected light part R2 that is reflected by the first metal layer 113 become different from each other. As a result, even when the phase difference is controlled to generate the destructive interference by controlling the thicknesses and material of the intermediate layer 115, since the amplitude that is substantially the strength of light is different, the effect of the destructive interference is deteriorated.

However, by increasing the reflectance of the external light of the first metal layer 113 to be greater than that of the second metal layer 114, which is located closer to the external light, the amount of the external light R1 reflected by the second metal layer 114 may be controlled to be the same as that of the external light R2 reflected by the first metal layer 113. In this case, the effect of the destructive interference is improved. That is, by controlling the amount of light reflected by each of the semi-transmissive layers 12a and the offsetting of the reflected light parts R1 and R2 (i.e., the amplitude and the displacement of the reflected light parts R1 and R2), the sum of the reflected light parts R1 and R2 becomes 0.

Thus, the reflection of the external light when the external light is incident on the grids 112 is decreased by increasing the effect of the destructive interference of the reflected external light. As a result, contrast is improved.

Figure 8:
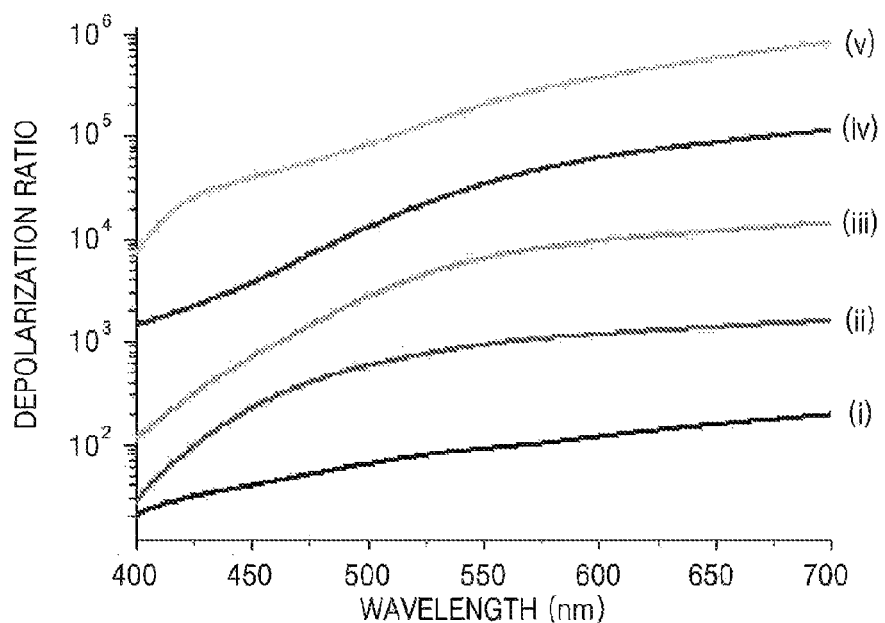
FIGS. 8 through 10 are graphs showing the results of measurements of a depolarization ratio, transmittance, and reflectance according to a change in the thickness of a first metal layer of the polarizer of FIG. 5.
Figure 9:
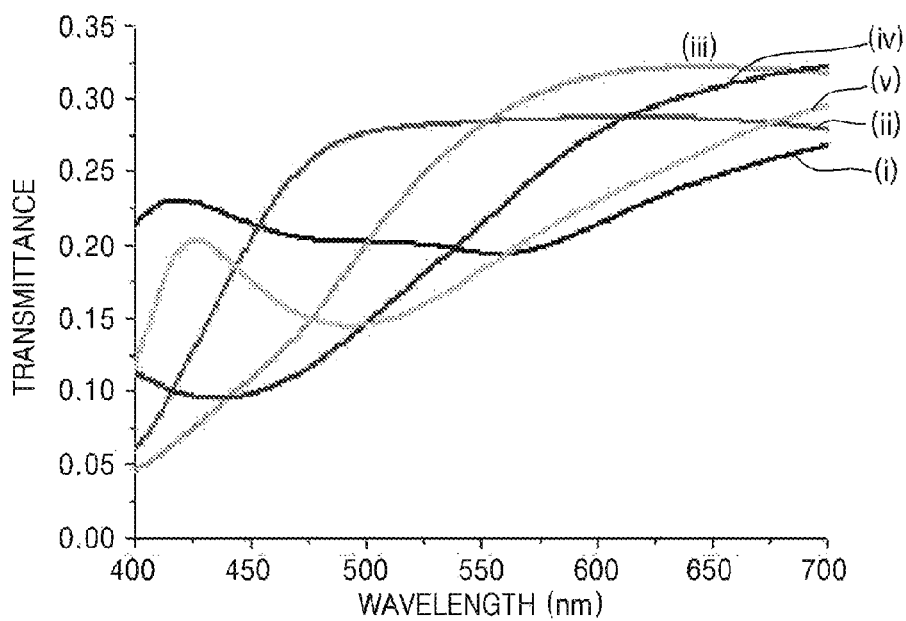
Figure 10:
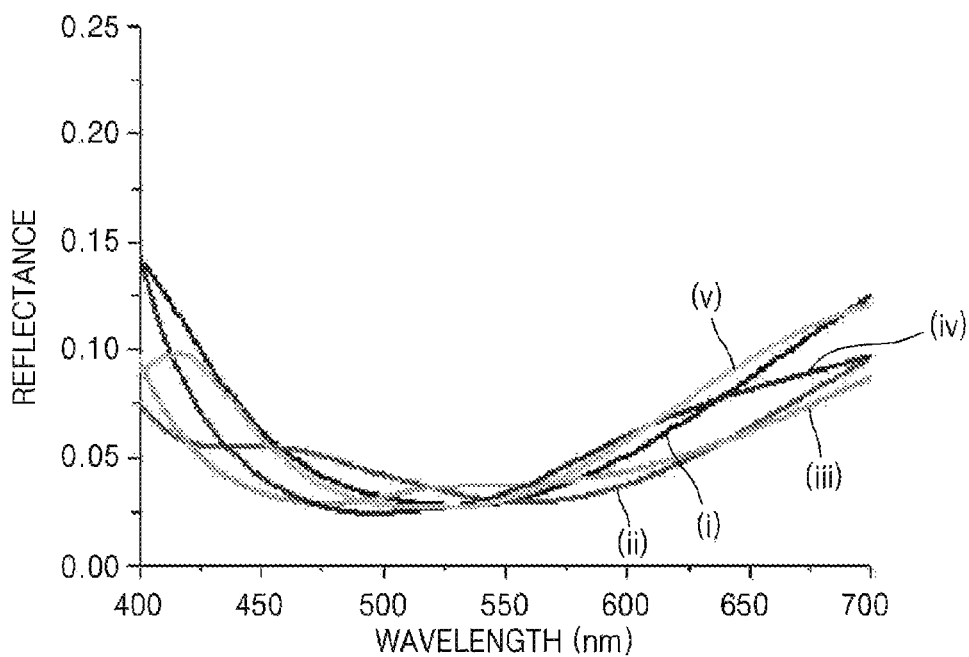

FIGS. 8 through 10 are graphs showing the results of measurements of a depolarization ratio, transmittance, and reflectance according to a change in the thickness of the first metal layer 113 of the polarizer 100 of FIG. 5. For an experiment, the polarizer 100 as shown in FIG. 5 was manufactured. The interval I between the grids 112 was 230 nm and the first metal layer 113 was aluminum (Al). The second metal layer 114 was chromium (Cr) and had a thickness t3 of 6 nm. The intermediate layer 115 was $SiO_2$ and had a thickness t2 of 80 nm. The width W of each of the grids 112 was 115 nm, which is ½ of the interval I between the grids 112.

In FIGS. 8 through 10, a line (i) denotes the grid 112 in which the thickness of the first metal layer 113 is 100 nm, a line (ii) denotes the grid 112 in which the thickness of the first metal layer 113 is 150 nm, a line (iii) denotes the grid 112 in which the thickness of the first metal layer 113 is 200 nm, a line (iv) denotes the grid 112 in which the thickness of the first metal layer 113 is 250 nm, and a line (v) denotes the grid 112 in which the thickness of the first metal layer 113 is 300 nm.

Referring to FIG. 8, it can be seen that the value of the depolarization ratio increased as the thickness of the first metal layer 113 increases. Referring to FIGS. 9 and 10, the transmittance and reflectance appeared to be constant.

Figure 11:
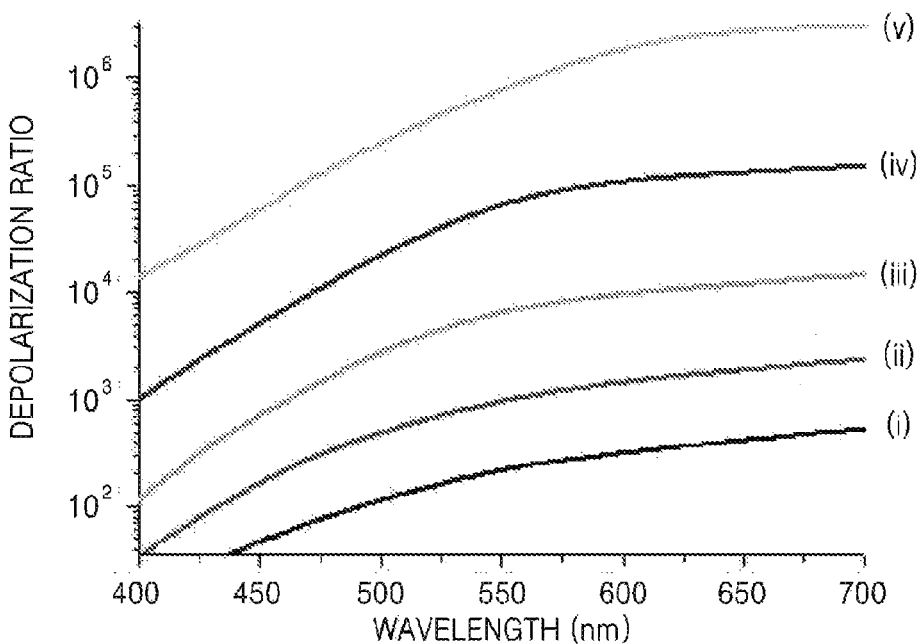
FIGS. 11 through 13 are graphs showing the results of measurements of a depolarization ratio, transmittance, and reflectance according to a change in the width of the grid of the polarizer of FIG. 5.
Figure 12:
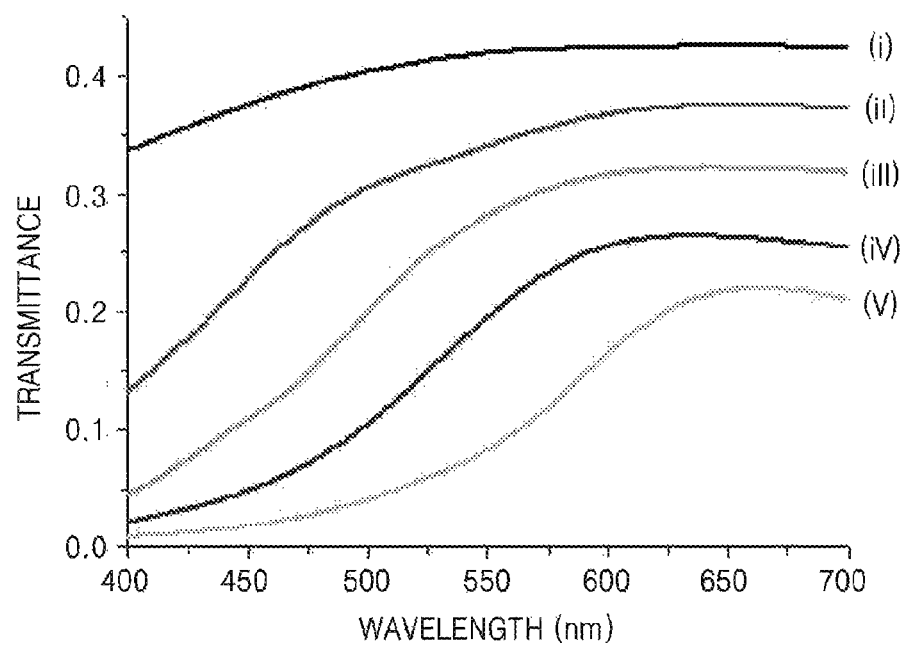
Figure 13:
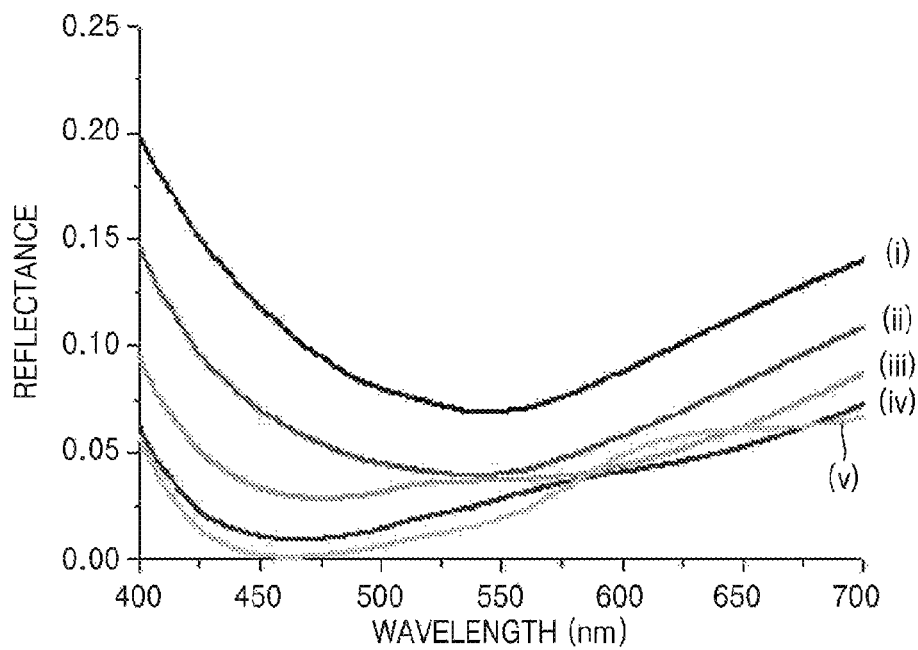

FIGS. 11 through 13 are graphs showing the results of measurements of a depolarization ratio, transmittance, and reflectance according to a change in the width W of each of the grids 112 of the polarizer 100 of FIG. 5. For an experiment, the polarizer 100 as shown in FIG. 5 was manufactured. The interval P between the grids 112 was 230 nm. The first metal layer 113 was aluminum (Al) and had a thickness t1 of 200 nm. The second metal layer 114 was chromium (Cr) and had a thickness t3 of 6 nm. The intermediate layer 115 was $SiO_2$ and had a thickness t2 of 80 nm.

In FIGS. 11 through 13, a line (i) denotes the grids 112 in which the width W of the grid 112 was 69 nm, a line (ii) denotes the grids 112 in which the width W of the grids 112 was 92 nm, a line (iii) denotes the grids 112 in which the width W of the grids 112 was 115 nm, a line (iv) denotes the grids 112 in which the width W of the grids 112 was 138 nm, and a line (v) denotes the grids 112 in which the width W of the grid 112 was 161 nm.

Referring to FIGS. 11 through 13, it can be seen that, as the width W of the grids 112 increased, the value of the depolarization ratio increased, and the transmittance and reflectance decreased.

Figure 14:
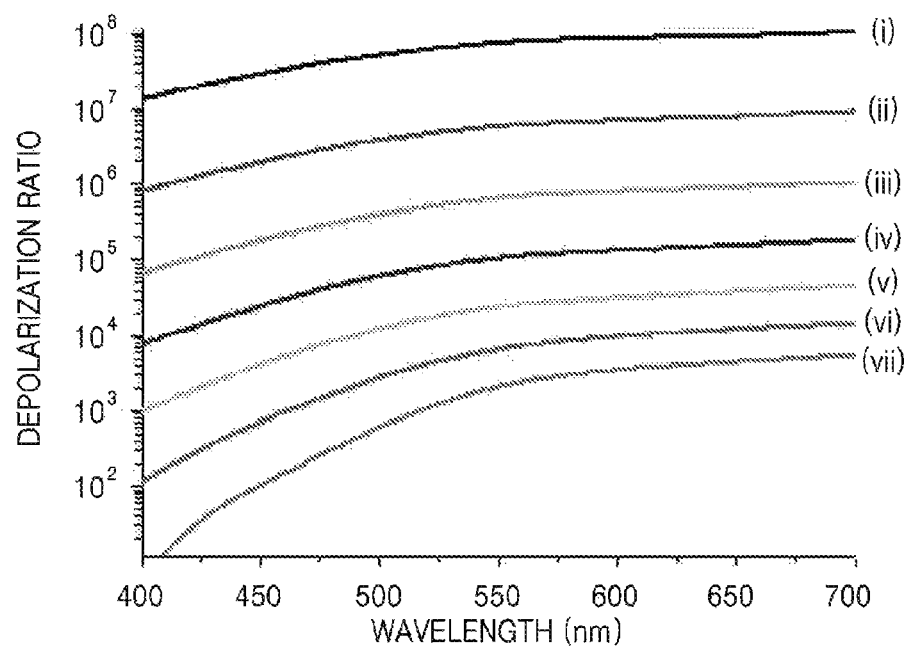
FIGS. 14 through 16 are graphs showing the results of measurements of a depolarization ratio, transmittance, and reflectance according to a change in the interval of the polarizer of FIG. 5.
Figure 15:
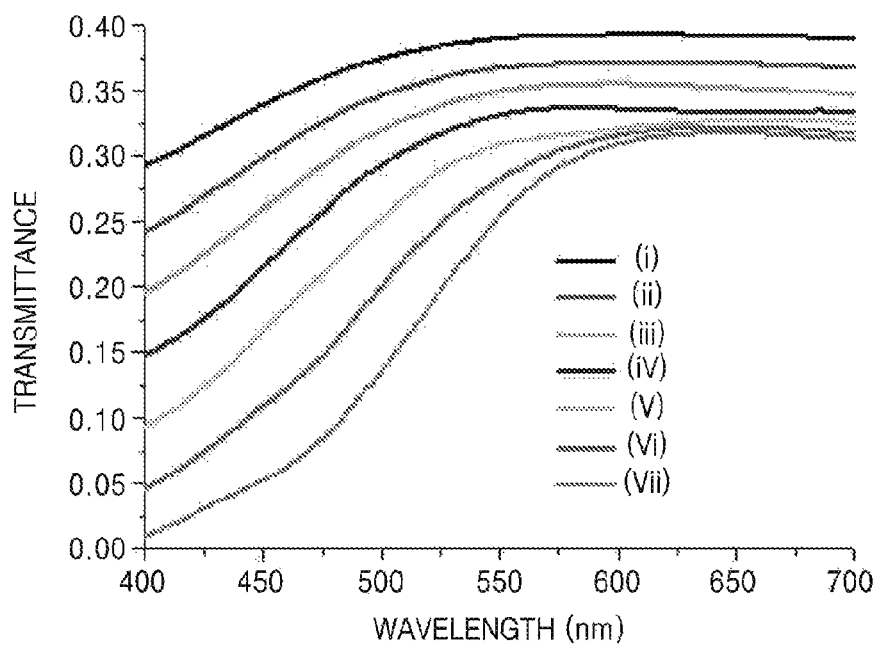
Figure 16:
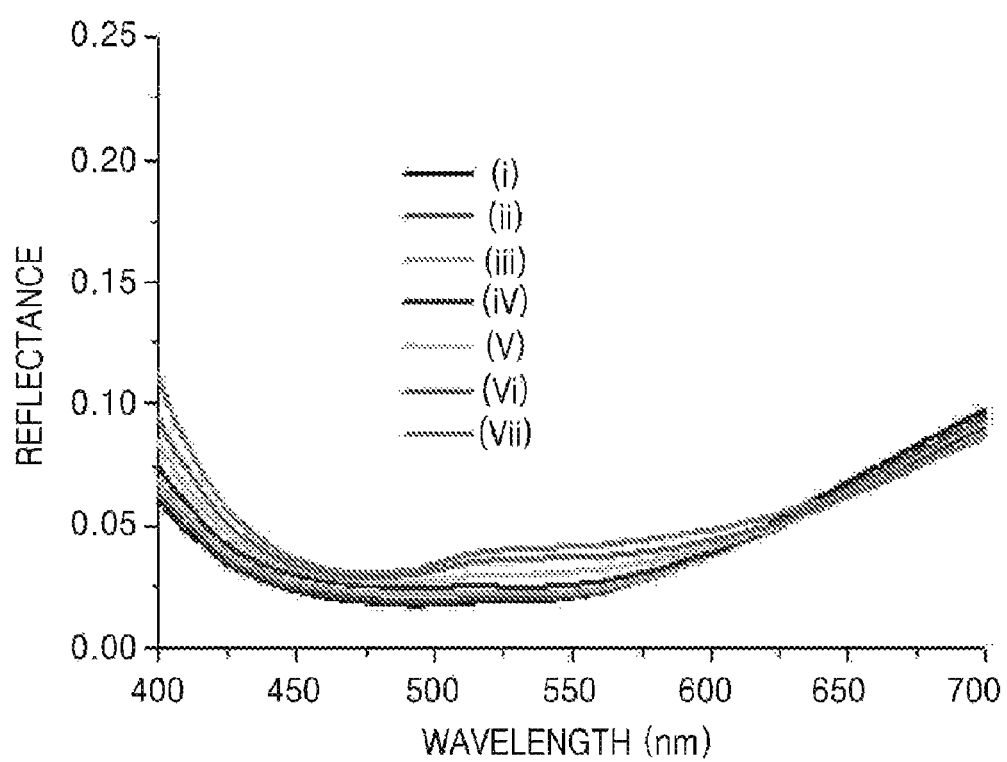

FIGS. 14 through 16 are graphs showing the results of measurements of a depolarization ratio, transmittance, and reflectance according to a change in the interval in the polarizer 100 of FIG. 5. For an experiment, the polarizer 100 as shown in FIG. 5 was manufactured. The first metal layer 113 was aluminum (Al) and had a thickness t1 of 200 nm. The second metal layer 114 was chromium (Cr) and had a thickness t3 of 6 nm. The intermediate layer 115 was $SiO_2$ and had a thickness t2 of 80 nm.

In FIGS. 14 through 16, a line (i) denotes the grids 112 in which the interval I and the width W of the grid 112 were, respectively, 80 nm and 40 nm, a line (ii) denotes the grids 112 in which the interval I and the width W of the grids 112 were, respectively, 110 nm and 55 nm, a line (iii) denotes the grids 112 in which the interval I and the width W of the grids 112 were, respectively, 140 nm and 70 nm, a line (iv) denotes the grids 112 in which the interval I and the width W of the grids 112 were, respectively, 170 nm and 85 nm, a line (v) denotes the grids 112 in which the interval I and the width W of the grids 112 were, respectively, 200 nm and 100 nm, a line (vi) denotes the grids 112 in which the interval I and the width W of the grids 112 were, respectively, 230 nm and 115 nm, and a line (vii) denotes the grids 112 in which the interval I and the width W of the grids 112 were, respectively, 260 nm and 130 nm.

Referring to FIGS. 14 through 16, it can be seen that, as the interval I between the grids 112 increases, the depolarization ratio and transmittance decrease and the reflectance is hardly changed.

The above-described polarizers according to aspects of the present invention may be used for flat panel displays, such as organic light emitting display apparatuses. Currently, only organic light emitting display apparatuses will be discussed; however, aspects of the present invention are not limited thereto such that aspects may be applied to liquid crystal displays, plasma displays, and/or other similar displays. An organic light emitting display apparatus does not need a separate base. A linear polarization layer formed of a plurality of grids may be formed directly on a substrate and a sealing member of the display. Since the grids of the linear polarization layer which will be described layer are the same as the grids 12 of the polarizer 10 of FIG. 1 and the grids 112 of the polarizer 100 of FIG. 5, descriptions about detailed structure, material, and manufacturing method thereof will be omitted.

Figure 17:
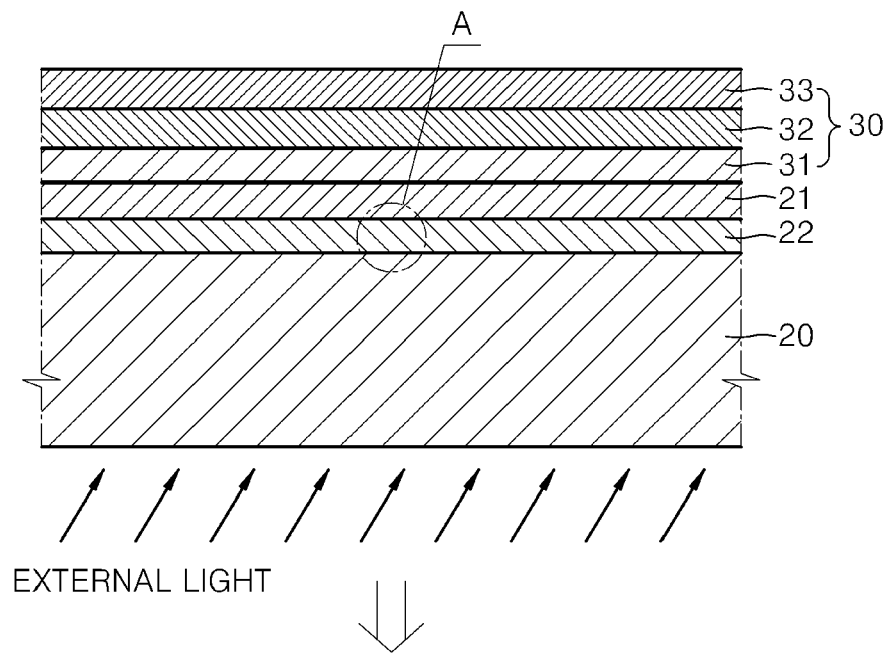
FIGS. 17 through 22 are cross-sectional views schematically showing examples of an organic light emitting display apparatus of a bottom emission type according to an embodiment of the present invention and magnified cross-sectional views respectively showing a linear polarization layer thereof.

FIG. 17 is a cross-sectional view schematically showing an organic light emitting display apparatus according to an embodiment of the present invention. As shown in FIG. 17, an organic light emitting display apparatus according to the present embodiment includes a substrate 20 formed of a transparent material and a linear polarization layer 22, a quarter wave layer 21, an organic light emitting device 30, and a sealing member (not shown) which are sequentially formed on and above the substrate 20 (i.e., opposite the substrate 20 from the external light).

The substrate 20 may be formed of a transparent glass material including $SiO_2$ as a major ingredient. Although it is not shown, a buffer layer (not shown) may be further provided on the upper surface of the transparent substrate 20 to secure flatness of the substrate 20 and prevent intrusion of impurity elements, and the buffer layer may be disposed between the substrate 20 and the linear polarization layer 22. The buffer layer may be formed of $SiO_2$ and/or $SiN_x$. The substrate 20 is not limited thereto and may be formed of a transparent plastic material.

Figure 18:
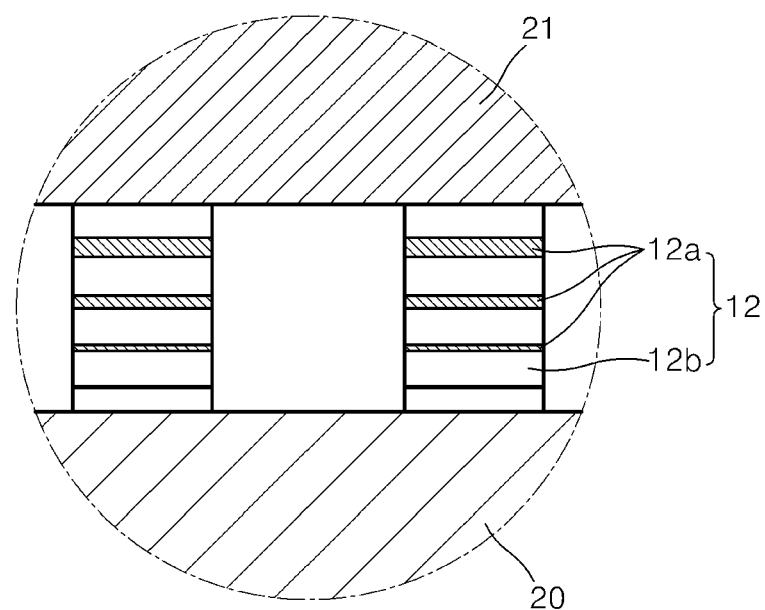

The linear polarization layer 22 is formed on the upper surface of the substrate 20 or on the buffer layer (not shown), if included. FIG. 18 is an enlarged view of a portion A of FIG. 17 which shows in detail the structure of the linear polarization layer 22. The linear polarization layer 22 includes a plurality of the grids 12 which are formed between the quarter wave layer 21 and the substrate 20. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed to generate destructive interference in the external light reflected by the semi-transmissive metal layers 12a. The thickness and/or reflectance of each of the semi-transmissive metal layers 12a increases in a direction away from the external light, i.e., the semi-transmissive metal layers 12a that are closer to the quarter wave layer 21 are thicker than the semi-transmissive metal layers 12a that are closer to the substrate 20. Although described herein as the grids 12, the linear polarization layer 22 is not limited thereto such that the linear polarization layer 22 may include the grids 112 as described with reference to FIGS. 5-7.

Thus, the reflection of the external light, when the external light is incident on the grids 12 in a direction from the substrate 20 to the grids 12, is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

The quarter wave layer 21 is formed on the linear polarization layer 22. The quarter wave layer 21 may be formed by depositing an inorganic material in an inclined direction. In such case, fine columns extend from a surface of the quarter wave layer 21 in an inclined direction, i.e., not perpendicular to the surface of the quarter wave layer 21. The direction of the columns is a column growth direction. When an inorganic material is deposited, the inorganic material grows in a circular column shape. Thus, when the inorganic material is deposited in an inclined direction, the circular column shape is also inclined at a predetermined angle with respect to a horizontal direction, i.e., the circular column shape is not a right circular cylinder. Further, although the columns are described as circular, aspects of the present invention are not limited thereto such that the columns may be elliptical, parabolic, or polygonal. Accordingly, the quarter wave layer 21 exhibits a birefringence characteristic or double refraction. The quarter wave layer 21 may be formed of a variety of materials, such as, $TiO_2$ or $TaO_x$. Also, the quarter wave layer 21 may be formed of GaO or BaO so as to provide for moisture absorption.

The organic light emitting device 30 is formed on the quarter wave layer 21. In the deposition order of the linear polarization layer 22 and the quarter wave layer 21, the linear polarization layer 22 is arranged close to the external light and the quarter wave layer 21 is arranged next to the linear polarization layer 22 so as to be farther from the external light. Another light transmissive member may be disposed between the linear polarization layer 22 and the quarter wave layer 21.

The organic light emitting device 30 includes a first electrode 31, a second electrode 33, and an organic light emitting layer 32, which are arranged to face one another. The first electrode 31 may be formed of a transparent conductive material, for example, ITO, IZO, $In_2O_3$ and ZnO, in a predetermined pattern using, for example, a photolithography method. When the first electrode 31 is of a passive matrix (PM) type, the pattern of the first electrode 31 may be formed of lines in strips separated at a predetermined interval from one another. When the first electrode 31 is of an active matrix (AM) type, the pattern of the first electrode 31 may be formed to correspond to pixels (not shown). The second electrode 33 is arranged above the first electrode 31, i.e., away from the external light. The second electrode 33 may be formed of a reflection type electrode and formed of aluminum, silver, and/or calcium. Also, the second electrode 33 may be connected to an external port (not shown) and may be a cathode electrode. When the second electrode 33 is of the passive matrix type, the pattern of the second electrode 33 may be a shape of strips arranged perpendicular to the pattern of the first electrode 31. When the second electrode 33 is of the active matrix type, the pattern of the second electrode 33 may be formed across all of an active area where an image is displayed. The polarities of the first and second electrodes 31 and 33 may be opposite to each other.

The organic light emitting layer 32 disposed between the first and second electrodes 31 and 33 emits light in response to a voltage potential between the first and second electrodes 31 and 33. A low molecular weight or high molecular weight substance may be used for the organic light emitting layer 32. When the organic light emitting layer 32 is formed of a low molecular weight organic substance, a hole transfer layer and a hole injection layer are deposited on the organic light emitting layer 32 in a direction toward the first electrode 31 and an electron transfer layer and an electron injection layer are deposited in a direction toward the second electrode 33. A variety of layers may be deposited as necessary. A variety of organic substances, such as copper phthalocyanine (CuPc), N,N'-Di(naphthalene-1-yl)-N,N'-diphenyl-benzidine (NPB), or tris-8-hydroxyquinoline aluminum (Alq3) may be used.

For a high molecular organic layer formed of a high molecular organic substance, only a hole transfer layer (HTL) is deposited on the organic light emitting layer 32 in a direction toward the first electrode 31. The high molecular weight hole transfer layer is formed in an upper portion of the first electrode 31 in an inkjet printing or spin coating method using poly-(2,4)-ethylene-dihydroxy thiophene (PEDOT) or polyaniline (PANI). The organic light emitting layer 32 that is formed to have a high molecular weight may be formed of PPV, Soluble PPV's, Cyano-PPV, polyfluorene. A color pattern may be formed by a typical method, such as by inkjet printing, spin coating, or a thermal transfer method using laser.

In the present embodiment, the light radiated by the organic light emitting device 30 is emitted through the substrate 20. A user of the organic light emitting device 30 can view an image from the lower surface of the substrate 20, i.e., from the lower side of FIG. 17. In such an emission type display, the external light, such as sunlight, is incident on the substrate 20 so that contrast is deteriorated. However, according to the present embodiment, the reflection of the external light can be minimized as the linear polarization layer 22 and the quarter wave layer 21 together form a circular polarization layer. Of the external light incident on the lower surface of the substrate 20, a component of the external light in a direction along an absorption axis of the linear polarization layer 22 is absorbed, and a component of the external light in a direction along a transmission axis of the linear polarization layer 22 is transmitted through the linear polarization layer 22. The component of the external light in the transmission axis direction is changed to a circularly polarized light that rotates in a direction as the component of the external light in the transmission axis direction passes through the quarter wave layer 21. The circularly polarized light is reflected by the second electrode 33 of the organic light emitting device 30. Upon reflection by the second electrode 33, the circularly polarized light rotating in a direction becomes a circularly polarized light rotating in the other direction. As the circularly polarized light passes through the quarter wave layer 21, the circularly polarized light is changed to a linearly polarized light in a direction perpendicular to the original transmission axis. The linearly polarized light is absorbed by the absorption axis of the linear polarization layer 22 so as to not be transmitted from the lower surface of the substrate 20. Thus, the reflection of the external light is minimized and the contrast is further improved.

Also, the linear polarization layer 22 of the present embodiment includes a plurality of the grids 12. When the external light incident on the substrate 20 arrives at the linear polarization layer 22, the effect of destructive interference of the external light reflected by the grids 12 having the semi-transmissive layers 12a and the intermediate layers 12b is improved. Although described herein as the grids 12, the linear polarization layer 22 is not limited thereto such that the linear polarization layer 22 may include the grids 112 as described with reference to FIGS. 5-7.

Further, since the linear polarization layer 22 and the quarter wave layer 21 are formed directly on the substrate 20, an adhesion layer is not needed and an organic light emitting display apparatus having a decreased thickness can be provided. Since an image emitted from the light emitting layer does not pass through the adhesion layer, brightness is improved.

The linear polarization layer 22 and the quarter wave layer 21 may be formed by a variety of methods. Not only for the above-described bottom emission type but also for a top emission type display, the structure may be modified considering the direction in which the external light is incident.

Figure 19:
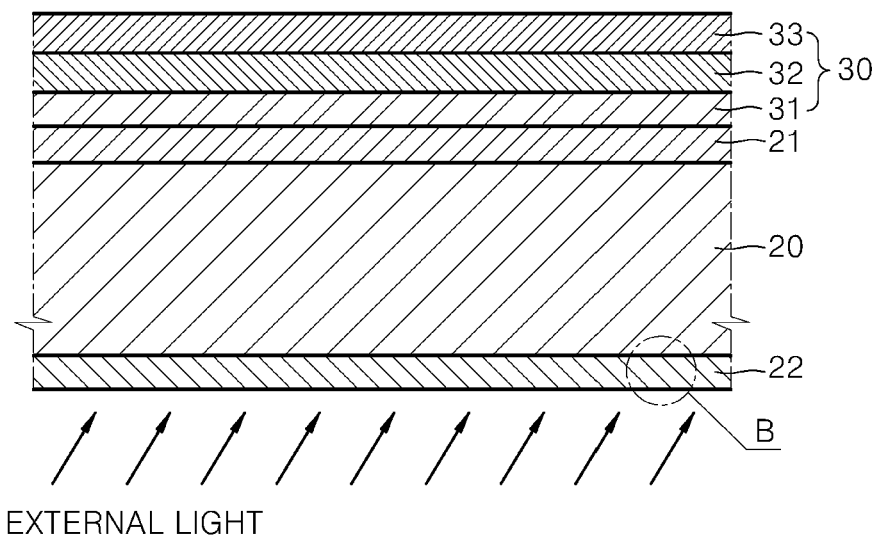
Figure 20:
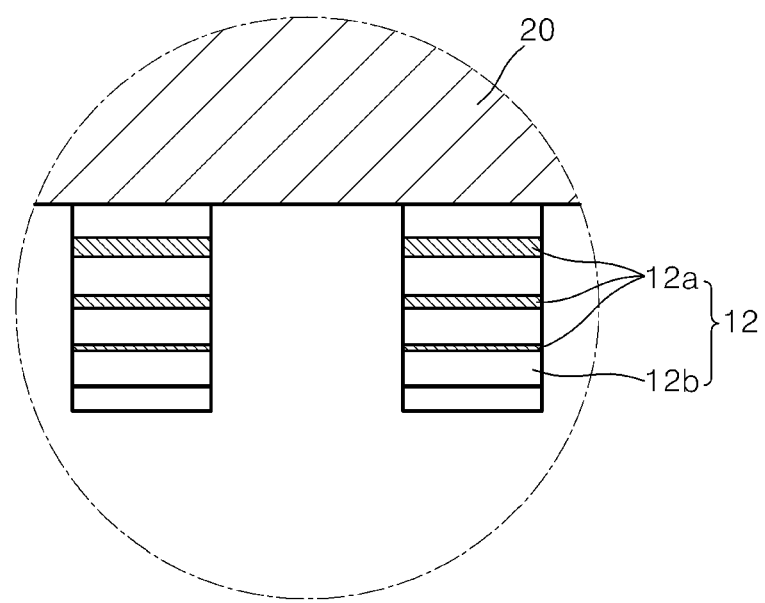

FIG. 19 is a cross-sectional view schematically showing an organic light emitting display apparatus of a bottom emission type according to another embodiment of the present invention. The linear polarization layer 22 is formed on a surface of the substrate 20 facing the external light and the quarter wave layer 21 is formed on the other surface of the substrate 20, i.e., the external light is firstly incident upon the linear polarization layer 22, then portions of the external light not reflected by the linear polarization layer 22 are incident upon the substrate 20 and the quarter wave layer 21. The organic light emitting device 30 is formed on the quarter wave layer 21. The detailed structure of the linear polarization layer 22 is illustrated in detail in FIG. 20, which is an enlarged view of a portion B of FIG. 19. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the substrate 20. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 in a direction from a light source toward the substrate 20 is decreased by increasing the destructive interference of the reflected external light reflected by the semi-transmissive metal layers 12a. As a result, contrast is improved. Since the detailed structure and effect of the grids 12 are the same as those as described above, descriptions thereof will be omitted herein.

Figure 21:
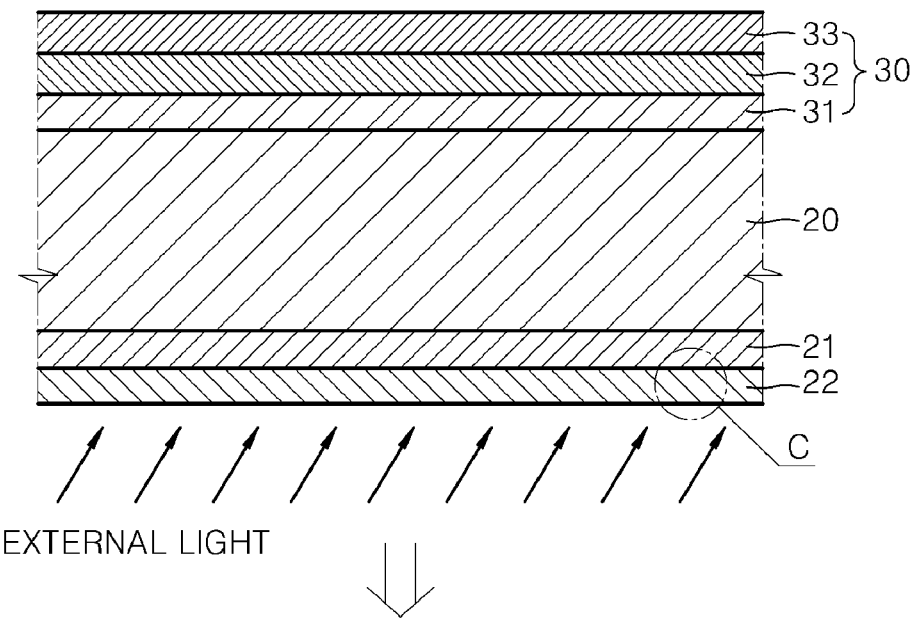

FIG. 21 is a cross-sectional view schematically showing an organic light emitting display apparatus of a bottom emission type according to another embodiment of the present invention. The quarter wave layer 21 and the linear polarization layer 22 are sequentially formed on a surface of the substrate 20 facing the external light. The organic light emitting device 30 is formed on the opposite surface of the substrate 20. The detailed descriptions of the respective elements are similar as those described above.

Figure 22:
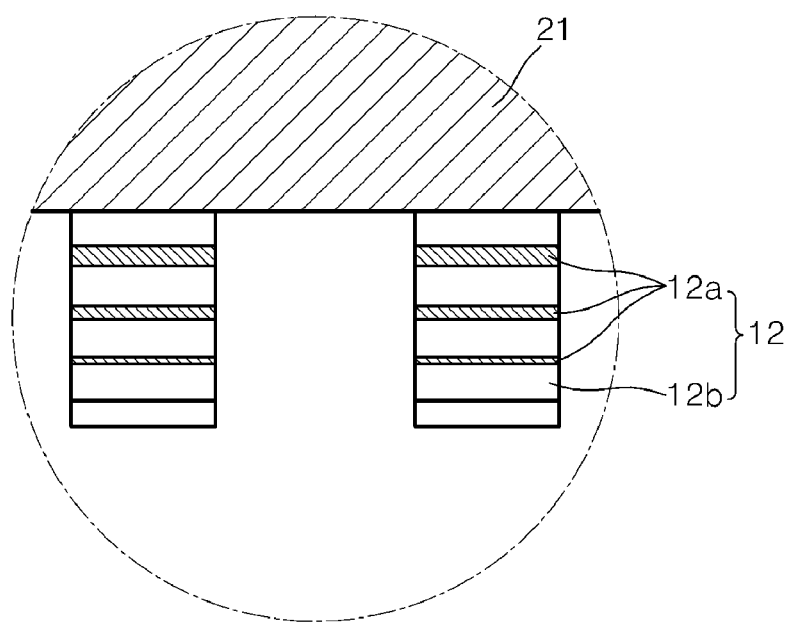

The detailed structure of the linear polarization layer 22 is illustrated in detail in FIG. 22, which is an enlarged view of a portion C of FIG. 21. The linear polarization layer 22 includes a plurality of the grids 12. Although described herein as the grids 12, the linear polarization layer 22 is not limited thereto such that the linear polarization layer 22 may include the grids 112 as described with reference to FIGS. 5-7. The grids 12 are formed on a surface of the quarter wave layer 21 that does not face the substrate 20. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, i.e., closer to the quarter wave layer 21.

Thus, the reflection of the external light when the external light is incident on the grids 12 in a direction from a light source toward the substrate 20 is decreased by increasing the destructive interference within the external light reflected by the semi-transmissive metal layers 12a. As a result, contrast is improved. Since the detailed structure and effect of the grids 12 are the same as described above, descriptions thereof will be omitted herein.

Although the bottom emission type organic light emitting display apparatus in which an image is displayed in a direction toward the substrate 20 is described above, aspects of the present invention are not limited thereto. Aspects of the present invention can be applied to a front surface light emitting structure in which an image formed in the light emitting layer is transmitted in the opposite direction to the substrate 20, not in a direction toward the substrate 20.

Figure 23:
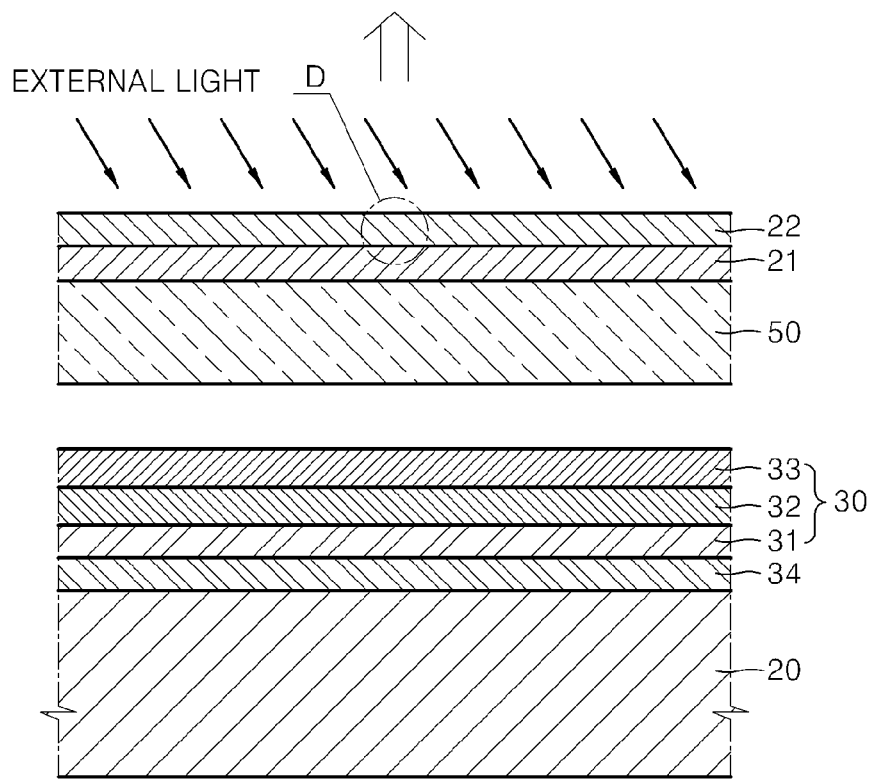
FIGS. 23 through 33 are cross-sectional views schematically showing examples of an organic light emitting display apparatus of a top emission type according to another embodiment of the present invention and magnified cross-sectional views respectively showing a linear polarization layer thereof.

FIG. 23 is a cross-sectional view schematically showing an organic light emitting display apparatus of a top emission type according to another embodiment of the present invention. The organic light emitting display apparatus includes the substrate 20 and a reflection film 34, the organic light emitting device 30, and a sealing member 50 which are formed on the substrate 20.

The substrate 20 may be a transparent glass substrate as described above, but aspects of the present invention are not limited thereto. Also, plastic or metal may be used for the substrate 20 so as to provide a flexible substrate 20. An insulating film may be further formed on substrate 20.

The reflection film 34 formed on the surface of the substrate 20 may be formed of Ag, Mg, Al, Pt, Pd, Au, Ni, Nd, Ir, Cr, or compounds thereof. The first electrode 31 may be formed of ITO, IZO, ZnO, or $In_2O_3$ having a high work function, and the first electrode 31 may be formed on the reflection film 34. The first electrode 31 may be an anode. If the first electrode 31 is a cathode, the first electrode 31 may be formed of Ag, Mg, Al, Pt, Pd, Au, Ni, Nd, Ir, Cr, or compounds thereof so as to reflect light emitted from the organic light emitting layer 32. In the following description, the first electrode 31 is an anode. However, aspects of the present invention are not limited thereto such that the first electrode 31 may be an anode or a cathode and may be reflective or transmissive.

The second electrode 33 may be a transmissive electrode. The second electrode 33 may be formed of metal such as Li, Ca, LiF/Al, Al, Mg, or Ag having a low work function, and the second electrode 33 may be formed into a thin semi-transmissive film. Further, a transparent conductive body, such as ITO, IZO, ZnO, or $In_2O_3$, may be formed on the metal semi-transmissive film to increase conductivity of the second electrode 33. The organic light emitting layer 32 formed between the first electrode 31 and the second electrode 33 is similar to as described above.

The sealing member 50 sealing the organic light emitting device 30 is formed on the organic light emitting device 30. The sealing member 50 is formed of a transparent material and protects the organic light emitting device 30 from external moisture and/or oxygen. The sealing member 50 may be a glass substrate, a plastic substrate, or a compound structure of an organic material and an inorganic material.

Figure 24:
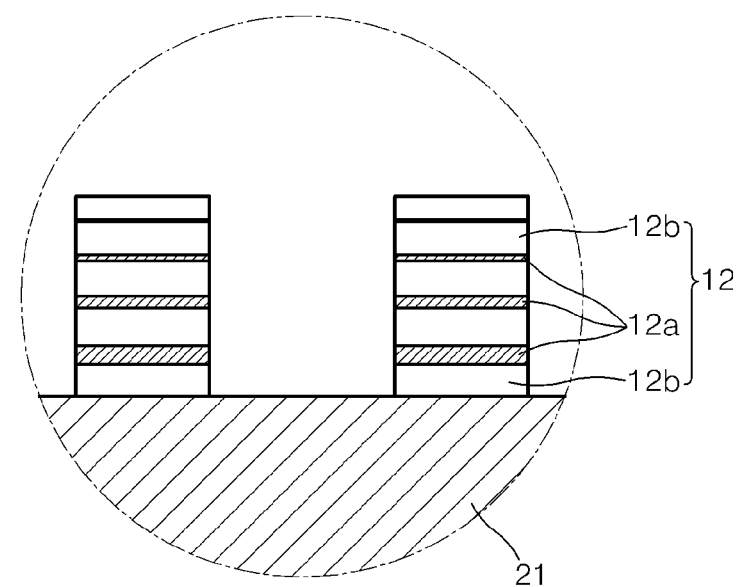

The quarter wave layer 21 and the linear polarization layer 22 are sequentially formed on an upper surface of the sealing member 50 facing the external light, i.e., on a surface of the sealing member 50 opposite the organic light emitting device 30. The structure of the linear polarization layer 22 is illustrated in detail in FIG. 24, which is an enlarged view of a portion D of FIG. 23. The linear polarization layer 22 includes a plurality of the grids 12. The grids 12 are formed on a surface of the quarter wave layer 21 opposite the sealing member 50. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 in a direction from a light source toward the sealing member 50 is decreased by increasing the destructive interference of the external light reflected by the semi-transmissive metal layers 12a. As a result, contrast is improved. Since the detailed structure and effect of the grids 12 are the same as described above, descriptions thereof will be omitted herein.

According to the present embodiment, the external light input in a direction in which an image is viewed, i.e., the light input from the upper side of FIG. 23, sequentially passes through the linear polarization layer 22 and the quarter wave layer 21 and is reflected by the reflection film 34. In doing so, the external light does not finally pass through the linear polarization layer 22 and a principle thereof is the same as described above.

Figure 25:
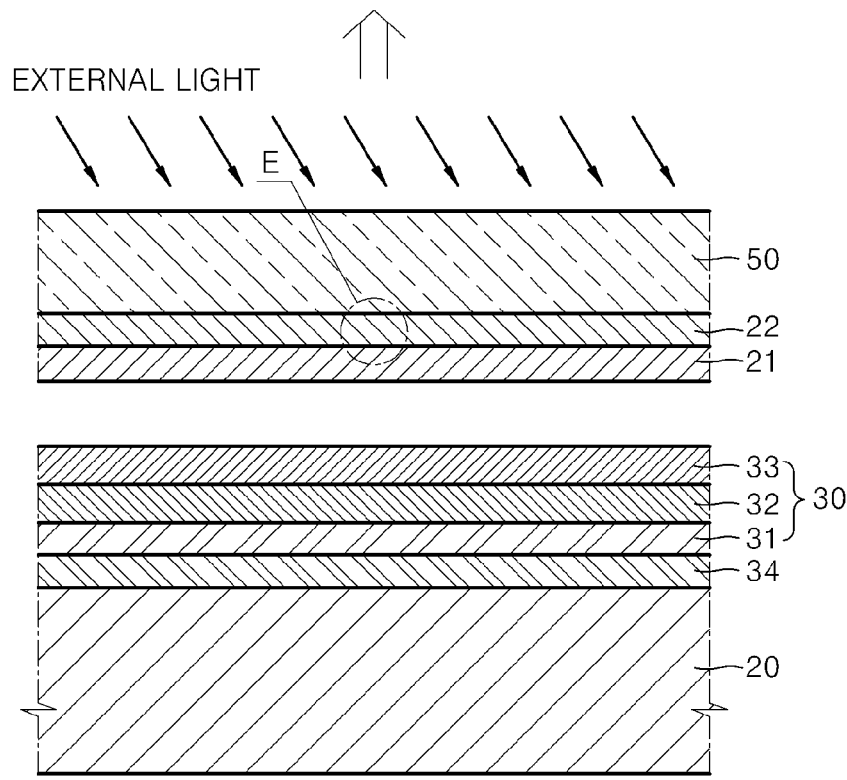
Figure 26:
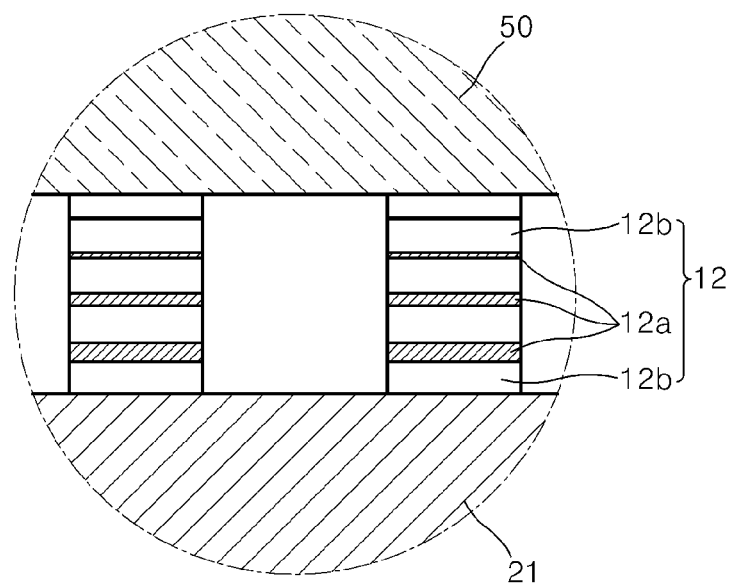

FIG. 25 is a cross-sectional view schematically showing an organic light emitting display apparatus of a top emission type according to another embodiment of the present invention. The quarter wave layer 21 and the linear polarization layer 22 are sequentially formed on a surface of the sealing member 50 facing the organic light emitting device 30. The structure of the linear polarization layer 22 is illustrated in detail in FIG. 26, which is an enlarged view of a portion E of FIG. 25. The linear polarization layer 22 includes a plurality of the grids 12. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 in a direction from a light source toward the sealing member 50 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

Figure 27:
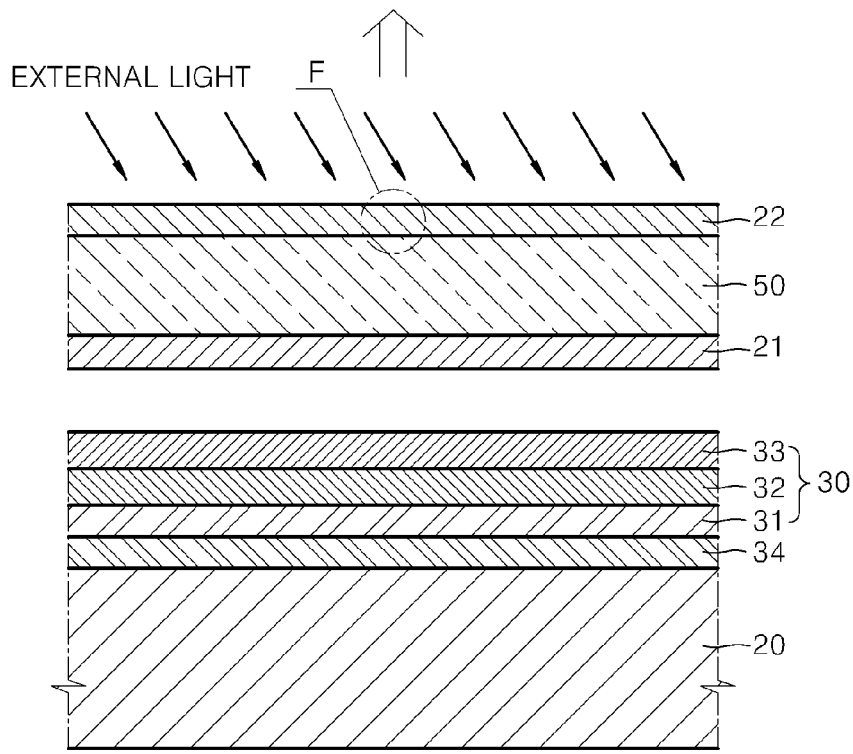
Figure 28:
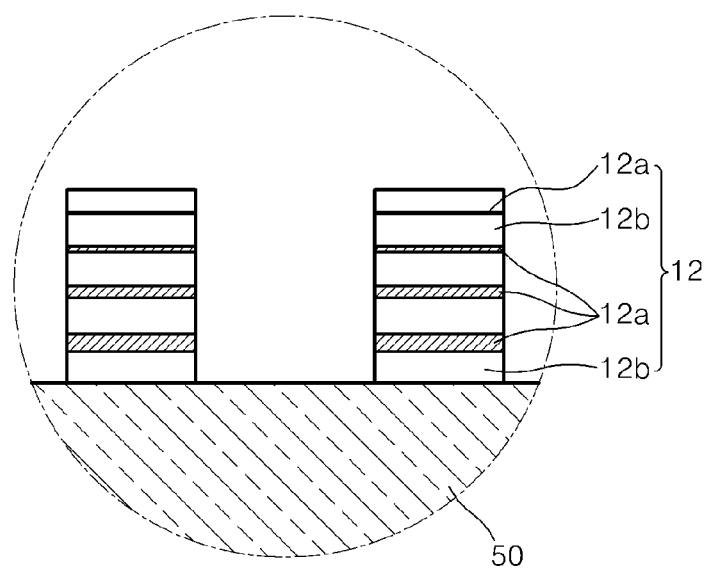

FIG. 27 is a cross-sectional view schematically showing an organic light emitting display apparatus of a top emission type according to another embodiment of the present invention. The linear polarization layer 22 is formed on a surface of the sealing member 50 facing the external light and the quarter wave layer 21 is formed on the opposite surface of the sealing member 50 facing the organic light emitting device 30. The structure of the linear polarization layer 22 is illustrated in detail in FIG. 28, which is an enlarged view of a portion F of FIG. 27. The linear polarization layer 22 includes a plurality of the grids 12. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the sealing member 50. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 in a direction from a light source toward the sealing member 50 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

Figure 29:
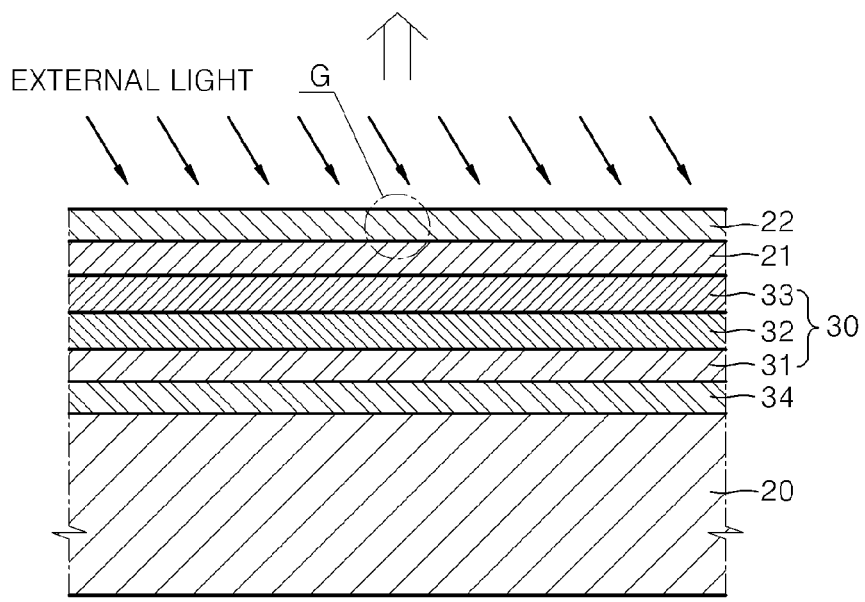
Figure 30:
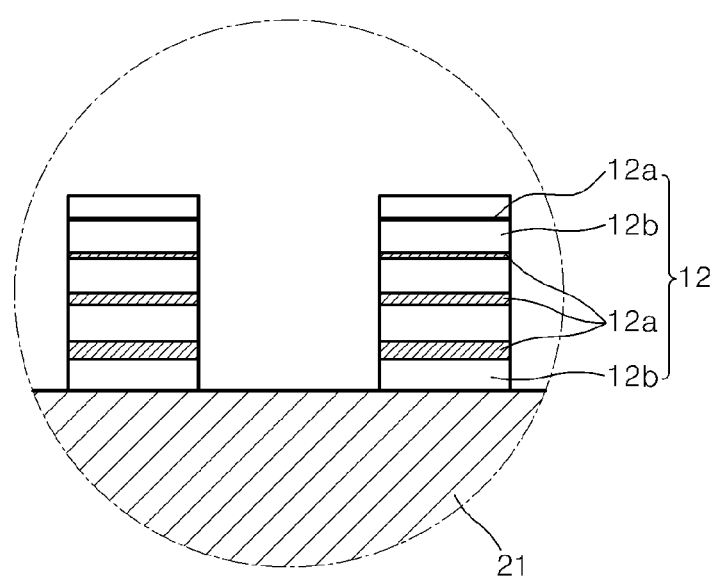

FIG. 29 is a cross-sectional view schematically showing an organic light emitting display apparatus of a top emission type according to another embodiment of the present invention. The reflection film 34 is formed on the substrate 20. The organic light emitting device 30 is formed on the reflection film 34. The quarter wave layer 21 is formed on the organic light emitting device 30. The linear polarization layer 22 is formed on the quarter wave layer 21. The structure of the linear polarization layer 22 is illustrated in detail in FIG. 30, which is an enlarged view of a portion G of FIG. 29. A plurality of the grids 12 are formed on the quarter wave layer 21. Although described herein as the grids 12, the linear polarization layer 22 is not limited thereto such that the linear polarization layer 22 may include the grids 112 as described with reference to FIGS. 5-7.

The linear polarization layer 22 includes the grids 12. The grids 12 are formed on a surface opposite to the surface of the quarter wave layer 21 facing the second electrode 33. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21.

Thus, the reflection of the external light when the external light is incident on the grids 12 in a direction from a light source toward the substrate 20 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

Figure 31:
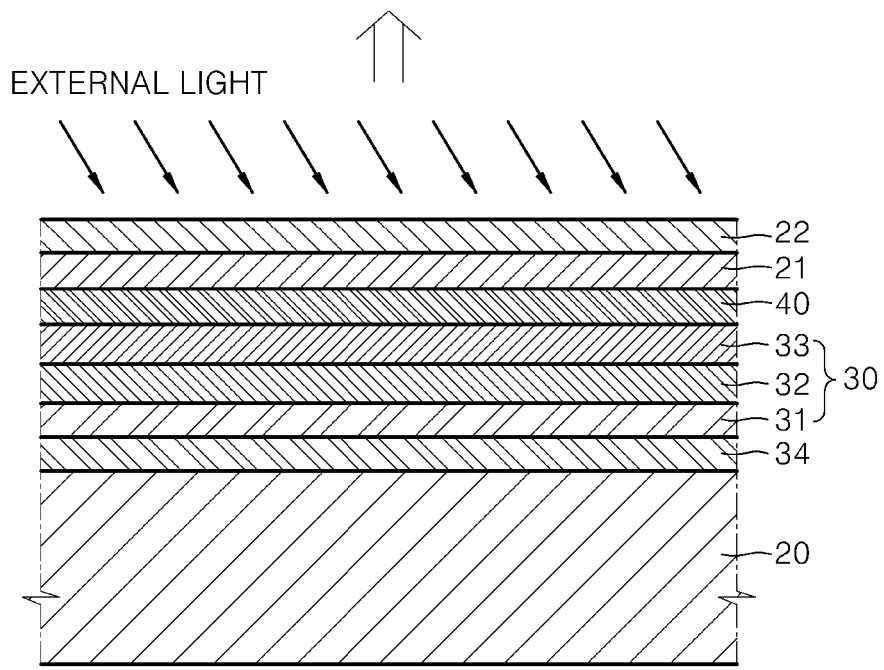

A protection layer may be further provided between the second electrode 33 and the quarter wave layer 21. Referring to FIG. 31, a protection layer 40 is formed between the second electrode 33 of the organic light emitting device 30 and the quarter wave layer 21. Since the structure of FIG. 31 is the same as that of FIG. 29, except for the protection layer 40, only the protection layer 40 is described herein.

The protection layer 40 is formed to prevent the second electrode 33 from being damaged in a process during which the quarter wave layer 21 is formed. The protection layer 40 is formed of inorganic material or organic material. The inorganic material may include metal oxide, metal nitride, metal carbide, metal oxynitride, and/or compounds thereof. The metal oxide may include silicon oxide, aluminum oxide, titanium oxide, indium oxide, tin oxide, indium tin oxide, and/or compounds thereof. The metal nitride may include aluminum nitride, silicon nitride, and/or compounds thereof. Silicon carbide may be used for the metal carbide. Silicon oxynitride may be used for the metal oxynitride. The inorganic material may include silicon and ceramic derivatives of each of the silicon and the metals. In addition, diamond-like carbon (DLC) may be used for the inorganic material. The organic material includes organic polymer, inorganic polymer, organometallic polymer, and/or hybrid organic/inorganic polymer. Also, acrylic resin may be used for the organic material. Since the detailed structure and effect of the grids 12 (grids 112) are the same as described above, descriptions thereof will be omitted herein.

Figure 32:
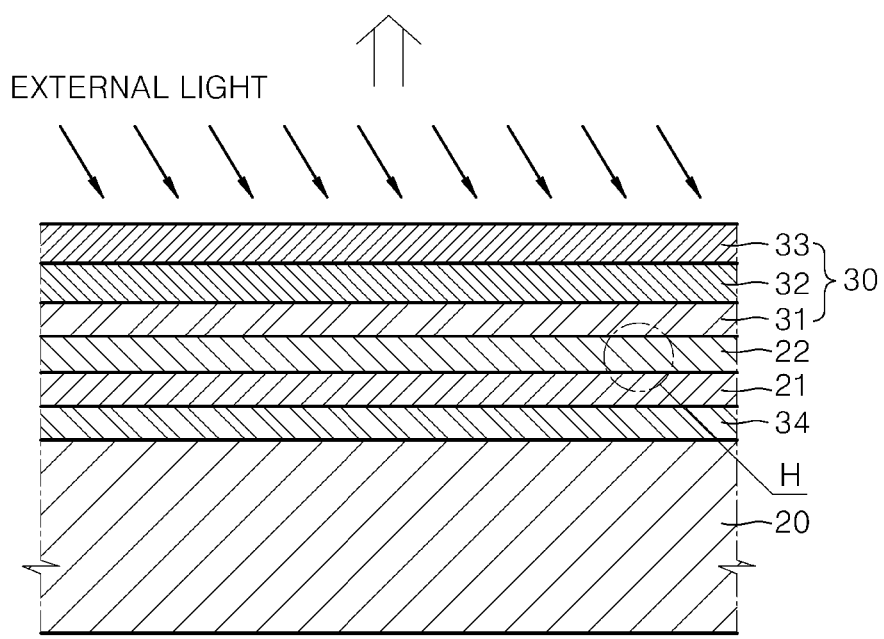
Figure 33:
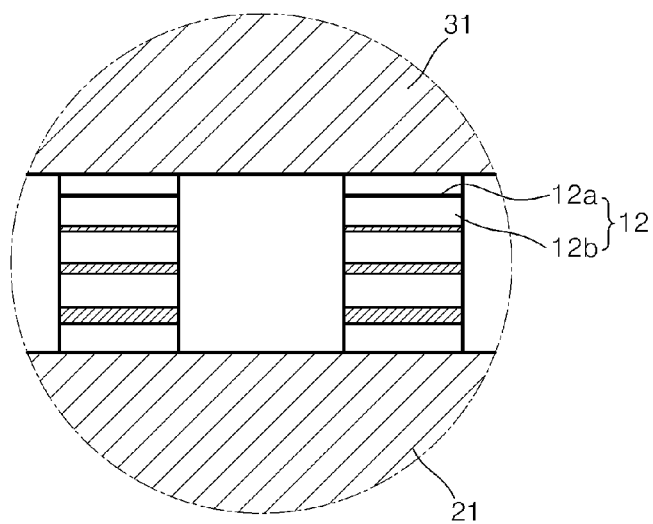

FIG. 32 is a cross-sectional view schematically showing an organic light emitting display apparatus of a top emission type according to another embodiment of the present invention. The quarter wave layer 21 and the linear polarization layer 22 are formed between the reflection film 34 and the organic light emitting device 30. The structure of the linear polarization layer 22 is illustrated in detail in FIG. 33, which is an enlarged view of a portion H of FIG. 32. A plurality of the grids 12 are formed on the quarter wave layer 21. Although described herein as the grids 12, the linear polarization layer 22 is not limited thereto such that the linear polarization layer 22 may include the grids 112 as described with reference to FIGS. 5-7.

The linear polarization layer 22 includes the grids 12. The grids 12 are formed between the quarter wave layer 21 and the first electrode 31. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21.

Thus, the reflection of the external light when the external light is incident on the grids 12 in a direction from a light source toward the substrate 20 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

Further, the quarter wave layer 21 may be formed on the upper surface of the reflection film 34, the organic light emitting device 30 may be formed on the quarter wave layer 21, and the linear polarization layer 22 may be formed on the organic light emitting device 30.

Figure 34:
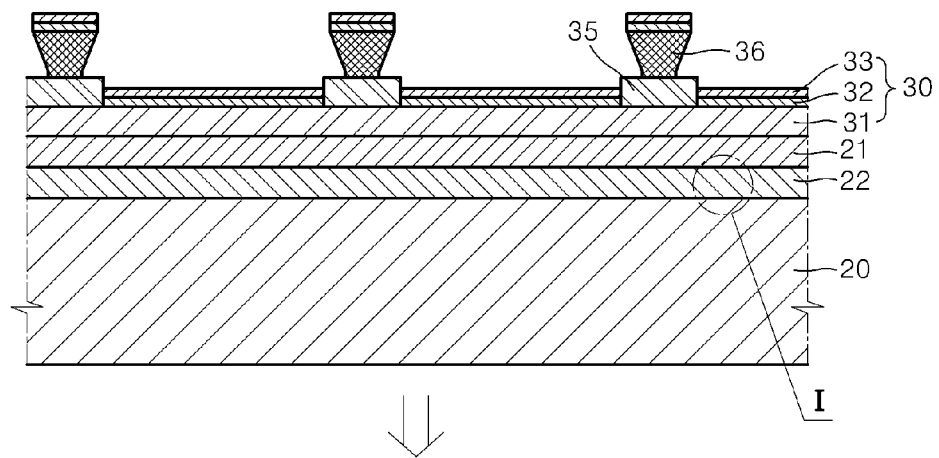
FIGS. 34 and 35, respectively, are a cross-sectional view schematically showing an organic light emitting display apparatus of a bottom emission type in a passive matrix type according to another embodiment of the present invention and a magnified cross-sectional view showing a linear polarization layer thereof.
Figure 35:
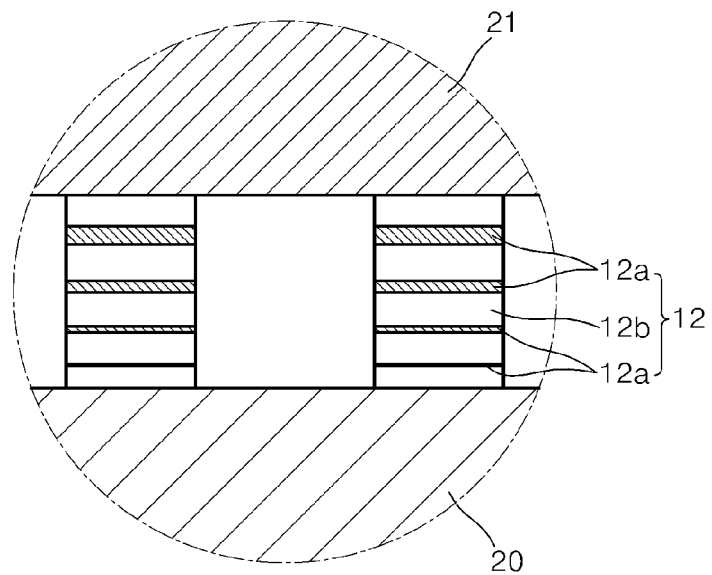

FIG. 34 is a cross-sectional view schematically showing an organic light emitting display apparatus of a bottom emission type in a passive matrix type according to another embodiment of the present invention. In the organic light emitting display apparatus of FIG. 34, the linear polarization layer 22 and the quarter wave layer 21 are sequentially formed on the upper surface of the substrate 20. The organic light emitting device 30 is formed on the quarter wave layer 21. The structure of the linear polarization layer 22 is illustrated in detail in FIG. 35, which is an enlarged view of a portion I of FIG. 34. The linear polarization layer 22 includes a plurality of the grids 12. The grids 12 are formed between the quarter wave layer 21 and the substrate 20. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 in a direction from a light source toward the substrate 20 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

The first electrode 31 is formed on the quarter wave layer 21 in a predetermined stripe pattern. An inner insulating film 35 is formed on the first electrode 31 to section the first electrode 31. A separator 36 provides a pattern for the organic light emitting layer 32 and the second electrode 33, and the separator 36 is formed on the inner insulating film 35 in a direction perpendicular to a direction in which the first electrode 31 is disposed. The organic light emitting layer 32 and the second electrode 33 are patterned by the separator 36. A sealing member (not shown) is disposed on the second electrode 33 to seal the organic light emitting device 30 from the external air. In some cases, the organic light emitting layer 32 and the second electrode 33 may be patterned without the separator 36.

In the embodiment of FIG. 34, as in the above-described embodiments, since the linear polarization layer 22 and the quarter wave layer 21 are sequentially deposited on the substrate 20, the linear polarization layer 22 and the quarter wave layer 21 can prevent the reflection of the external light so that the thickness of the overall display may be decreased. Also, by restricting the reflection on a boundary surface generated due to the difference in the index of refraction, the reflection of the external light is decreased by absorbing the external light when the external light is incident on the grids 12. Although it is not shown, the structure as shown in FIGS. 19 and 21 may be applied to the organic light emitting display apparatus of a bottom emission type in a passive matrix type.

Figure 36:
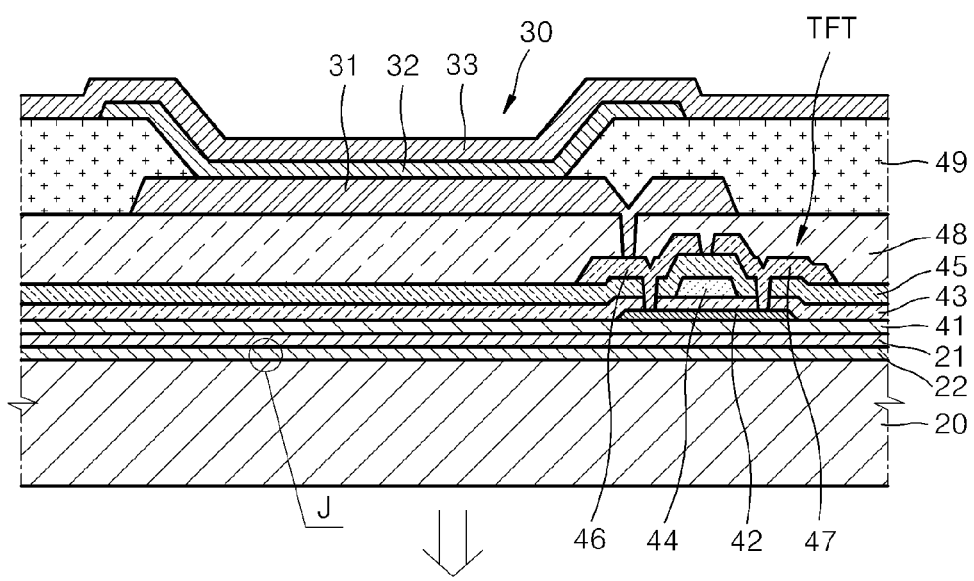
FIGS. 36 and 37, respectively, are a cross-sectional view schematically showing an organic light emitting display apparatus of a bottom emission type in an active matrix type according to another embodiment of the present invention and a magnified cross-sectional view showing a linear polarization layer thereof.

FIG. 36 is a cross-sectional view schematically showing an organic light emitting display apparatus of a bottom emission type in an active matrix type according to another embodiment of the present invention. Referring to FIG. 36, a thin film transistor (TFT) is formed on the upper surface of the substrate 20. At least one TFT is formed for each pixel and is electrically connected to the organic light emitting device 30.

Figure 37:
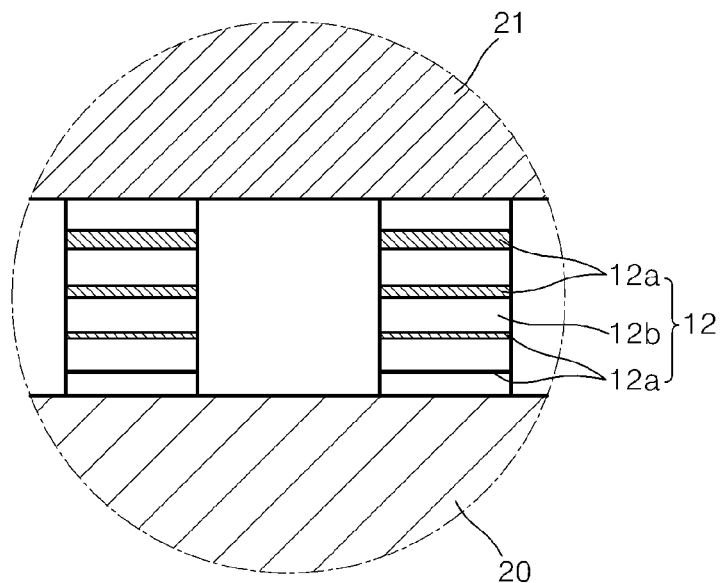

In detail, the linear polarization layer 22 and the quarter wave layer 21 are sequentially formed on the substrate 20. The structure of the linear polarization layer 22 is illustrated in detail in FIG. 37, which is an enlarged view of a portion J of FIG. 36. The linear polarization layer 22 includes a plurality of the grids 12. The grids 12 are formed between the quarter wave layer 21 and the substrate 20. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 in a direction from a light source toward the substrate 20 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

A buffer layer 41 is formed on the quarter wave layer 21 and a semiconductor layer 42 is formed in a predetermined pattern on the buffer layer 41. A gate insulating film 43 formed of $SiO_2$ or $SiN_x$ is formed on the semiconductor layer 42. A gate electrode 44 is formed on a predetermined area on the upper surface of the gate insulating film 43. The gate electrode 44 is connected to a gate line (not shown) for applying a TFT on/off signal. An interlayer insulating film 45 is formed on the gate electrode 44 such that a source electrode 46 and a drain electrode 47 can respectively contact source and drain regions of the semiconductor layer 42 through contact holes. The TFT formed as above is covered and protected by a passivation film 48.

The first electrode 31 that may be an anode electrode is formed on the upper surface of the passivation film 48. A pixel definition layer 49 is formed of an insulating material to cover the first electrode 31. After forming a predetermined opening in the pixel definition layer 49, the organic light emitting layer 32 is formed in an area defined by the opening. The second electrode 33 is formed to cover the organic light emitting layer 32.

In the structure of the active matrix type, since the linear polarization layer 22 and the quarter wave layer 21 are sequentially deposited on the substrate 20, the linear polarization layer 22 and the quarter wave layer 21 can prevent the reflection of the external light input from the lower side of the substrate 20 in FIG. 36.

In the organic light emitting display apparatus of a bottom emission type in an active matrix type, the linear polarization layer 22 and the quarter wave layer 21 may be formed on any of surfaces formed by the substrate 20, the TFT, and the organic light emitting device 30 as far as the linear polarization layer 22 is arranged close to the external light and the quarter wave layer 21 is arranged close to the organic light emitting device 30. That is, although it is not separately illustrated, as shown in FIGS. 19 and 21, after the linear polarization layer 22 and the quarter wave layer 21 are formed on a surface and/or the other surface of the substrate 20, the TFT and the organic light emitting device 30 may be formed. Also, the linear polarization layer 22 and/or the quarter wave layer 21 may be arranged at an interface between layers of the TFT.

Figure 38:
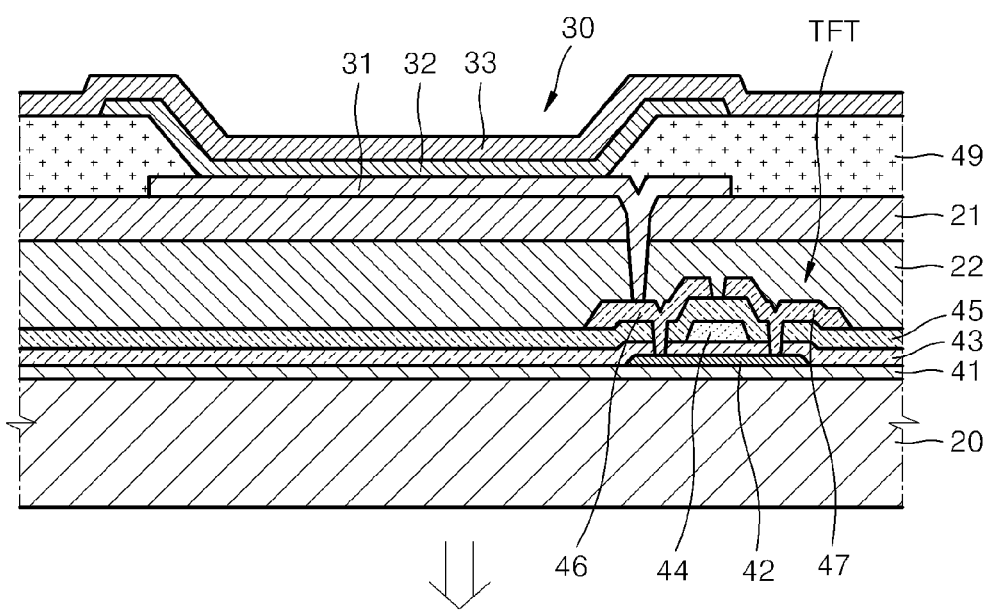
FIG. 38 is a cross-sectional view schematically showing an organic light emitting display apparatus of a bottom emission type in an active matrix type according to another embodiment of the present invention.

Instead of forming the passivation film 48 as shown in FIG. 36, the linear polarization layer 22 and the quarter wave layer 21 may be used therefor. Referring to FIG. 38, the passivation film 48 is not separately formed of an organic material and/or an inorganic material on the upper surface of the TFT and the linear polarization layer 22 and the quarter wave layer 21 are sequentially formed on the interlayer insulating film 45 instead of the passivation film 48. Since the detailed structure and effect are the same as described above, descriptions thereof will be omitted herein.

Figure 39:
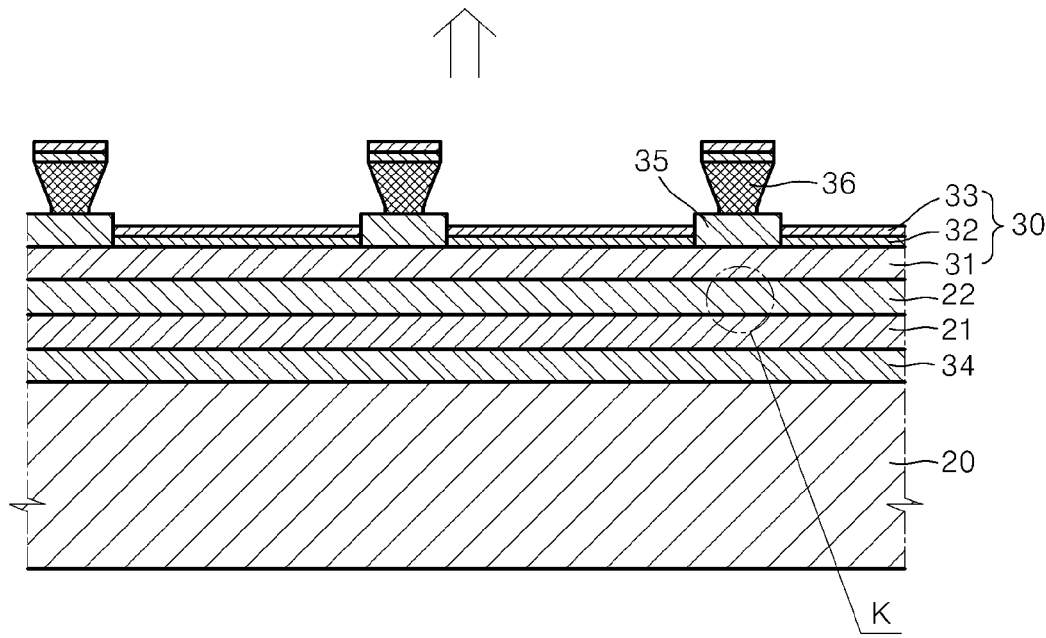
FIGS. 39 and 40, respectively, are a cross-sectional view schematically showing an organic light emitting display apparatus of a top emission type in a passive matrix type according to another embodiment of the present invention and a magnified cross-sectional view showing a linear polarization layer thereof.

FIG. 39 is a cross-sectional view schematically showing an organic light emitting display apparatus of a top emission type in a passive matrix type according to another embodiment of the present invention. The reflection film 34 is formed on the upper surface of the substrate 20. The quarter wave layer 21 and the linear polarization layer 22 are sequentially formed on the upper surface of the reflection film 34. The organic light emitting device 30 is formed on the linear polarization layer 22.

Figure 40:
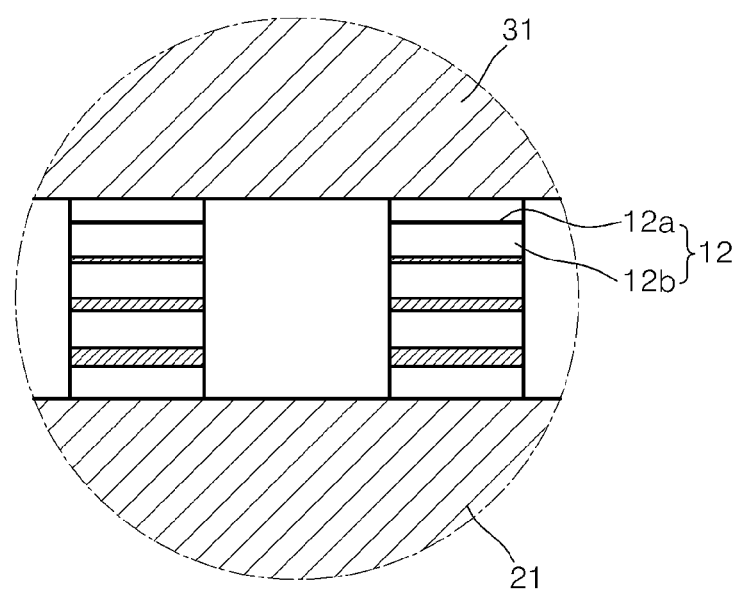

The structure of the linear polarization layer 22 is illustrated in detail in FIG. 40, which is an enlarged view of a portion K of FIG. 39. The linear polarization layer 22 includes a plurality of the grids 12. The grids 12 are formed between the quarter wave layer 21 and the first electrode 31. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

The first electrode 31 is formed on the linear polarization layer 22 in a predetermined stripe pattern. The inner insulating film 35 is formed on the first electrode 31 to section the first electrode 31. The separator 36 provides a pattern for the organic light emitting layer 32 and the second electrode 33, and the separator 36 is formed on the inner insulating film 35 in a direction perpendicular to a direction of the first electrode 31. The organic light emitting layer 32 and the second electrode 33 are patterned in the direction perpendicular to the direction of the first electrode 31 by the separator 36. A sealing member (not shown) is formed on the second electrode 33 so that the organic light emitting device 30 is blocked from the external air. In some cases, the organic light emitting layer 32 and the second electrode 33 may be patterned without the separator 36.

In the present embodiment, since the reflection of the external light is decreased, contrast may be improved and the thickness of the overall display may be decreased. Since the detailed structure and effect are the same as described above, descriptions thereof will be omitted herein.

Although it is not shown in a separate drawing, in a display apparatus of the top emission type in a passive matrix type, the structures as shown in FIGS. 23 through 30 can be applied as they are.

Figure 41:
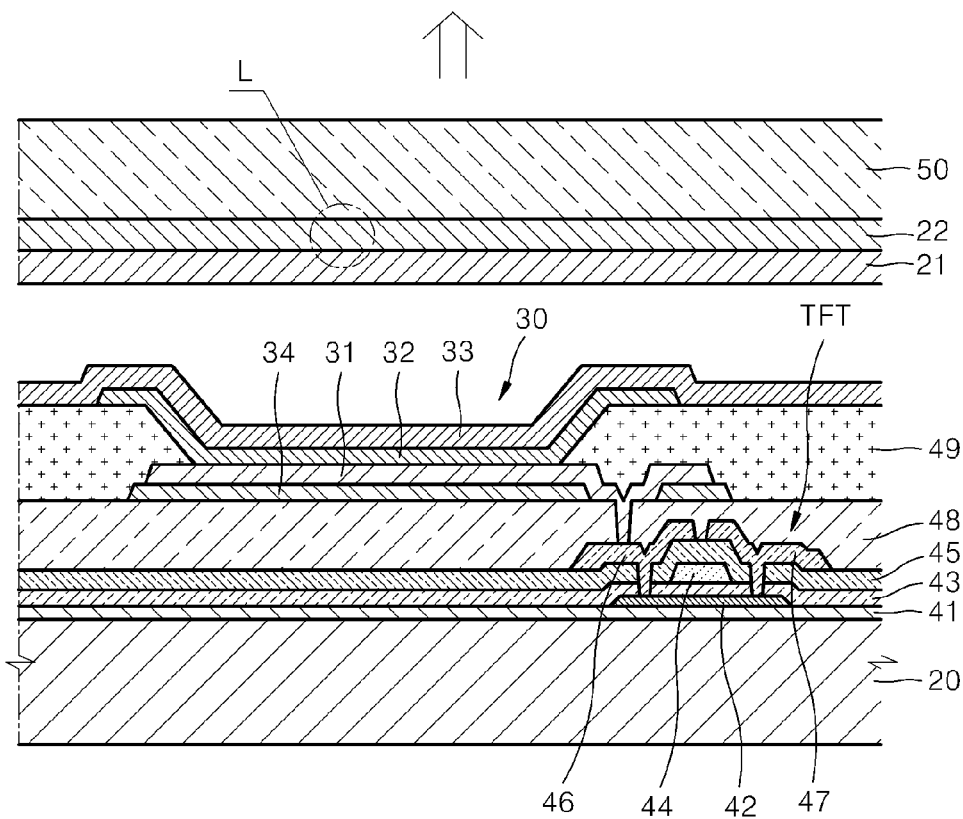
FIGS. 41 and 42, respectively, are a cross-sectional view schematically showing an organic light emitting display apparatus of a top emission type in an active matrix type according to another embodiment of the present invention and a magnified cross-sectional view showing a linear polarization layer thereof.

FIG. 41 is a cross-sectional view schematically showing an organic light emitting display apparatus of a top emission type in an active matrix type according to another embodiment of the present invention. Referring to FIG. 41, a thin film transistor (TFT) is formed on the upper surface of the substrate 20. At least one TFT is formed for each pixel and is electrically connected to the organic light emitting device 30.

Since the structure of the TFT is the same as described above with reference to FIG. 36, a detailed description thereof will be omitted herein.

The passivation film 48 is formed on the TFT to cover the TFT. The reflection film 34 is formed on the passivation film 48. The first electrode 31 that works as an anode electrode is formed on the reflection film 34. The pixel definition film 49 is formed of an insulating material and formed to cover the first electrode 31. After forming a predetermined opening in the pixel definition layer 49, the organic light emitting layer 32 is formed in an area defined by the opening. The second electrode 33 is then formed thereon.

Figure 42:
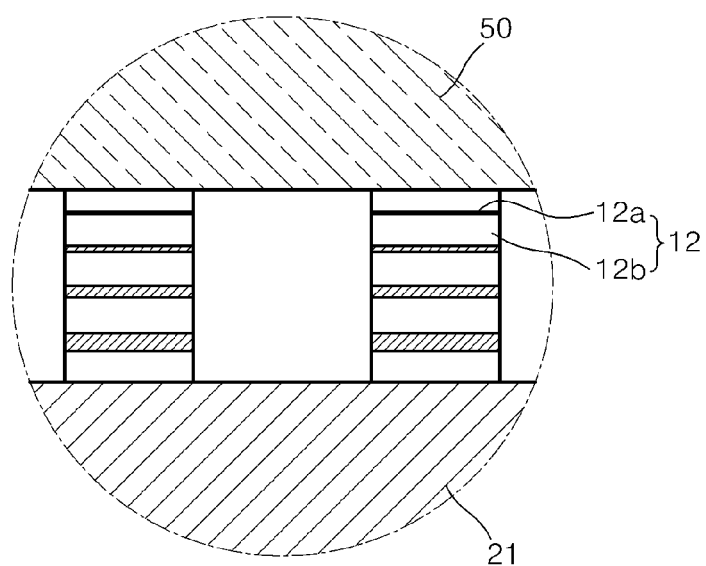

In the embodiment according to FIG. 41, the linear polarization layer 22 and the quarter wave layer 21 are sequentially formed on a surface of the sealing member 50 facing the organic light emitting device 30. The structure of the linear polarization layer 22 is illustrated in detail in FIG. 42, which is an enlarged view of a portion L of FIG. 41. The linear polarization layer 22 includes a plurality of the grids 12. The grids 12 are formed between the quarter wave layer 21 and the substrate 20. Each of the grids 12 includes a plurality of the semi-transmissive metal layers 12a and the intermediate layers 12b. The semi-transmissive metal layers 12a and the intermediate layers 12b are alternately deposited in each of the grids 12. The grids 12 are formed such that the external light reflected by the semi-transmissive metal layers 12a generates destructive interference. The thickness and/or reflectance of each of the semi-transmissive metal layers 12a increases in a direction in which the semi-transmissive metal layers 12a are away from the external light, that is, closer to the quarter wave layer 21. Although described herein as the grids 12, the linear polarization layer 22 is not limited thereto such that the linear polarization layer 22 may include the grids 112 as described with reference to FIGS. 5-7.

Thus, the reflection of the external light when the external light is incident on the grids 12 in a direction from a light source toward the sealing member 50 is decreased by increasing the effect of the destructive interference of the external light reflected by the semi-transmissive metal layers 12a. As a result, contrast is improved. Since the detailed structure and effect of the grids 12 are as described above, descriptions thereof will be omitted herein.

In FIG. 41, the linear polarization layer 22 and the quarter wave layer 21 are can substantially decrease the reflection of the external light input from above the sealing member 50 that is located in the upper side of the drawing. The grids 12 improve the destructive interference of the reflected external light. As a result, the reflection of the external light is decreased so that contrast is improved. Although it is not shown in a separate drawing, in the display apparatus of a top emission type in an active matrix type, the structures as shown in FIGS. 23 through 33 may be applied thereto.

Figure 43:
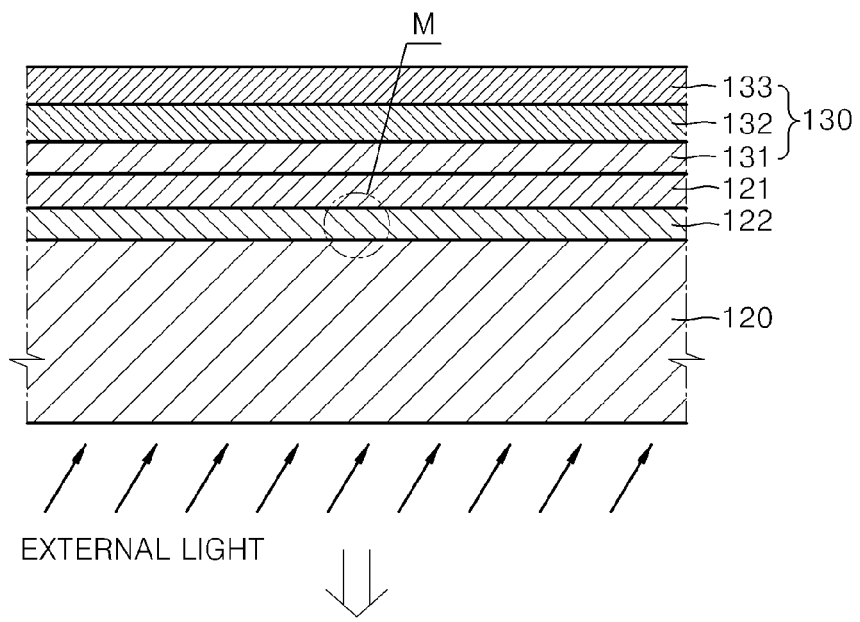
FIGS. 43 through 48, respectively, are cross-sectional views schematically showing examples of an organic light emitting display apparatus of a bottom emission type according to another embodiment of the present invention and magnified cross-sectional views respectively showing a linear polarization layer thereof.

FIG. 43 is a cross-sectional view of an organic light emitting display apparatus according to another embodiment of the present invention. As shown in FIG. 43, the organic light emitting display apparatus according to the present embodiment includes a substrate 120 formed of a transparent material and a linear polarization layer 122, a quarter wave layer 121, an organic light emitting device 130, and a sealing member (not shown) which are sequentially formed on the substrate 120.

The substrate 120 may be formed of a transparent glass material including $SiO_2$. Although it is not shown, a buffer layer may be further provided on the upper surface of the transparent substrate 120 so as to ensure flatness of the substrate 120 and to prevent intrusion of impurity elements. The buffer layer may be formed of $SiO_2$ and/or $SiN_x$. The substrate 120 is not limited thereto and may be formed of a transparent plastic material.

Figure 44:
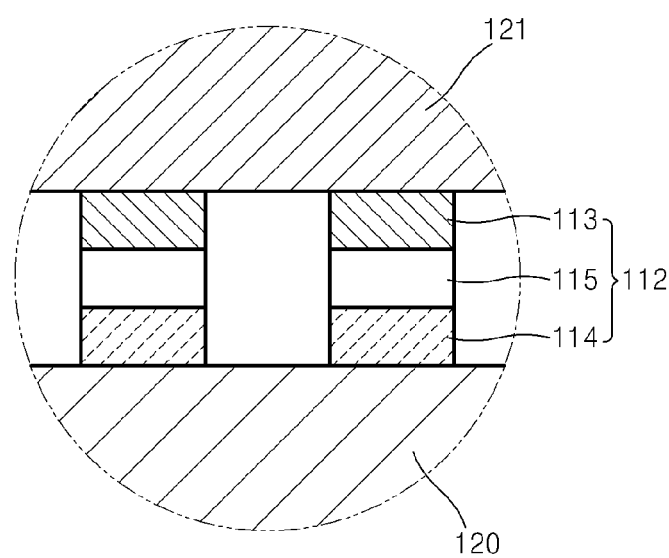

The linear polarization layer 122 is formed on the upper surface of the substrate 120. The structure of the linear polarization layer 122 is illustrated in detail in FIG. 44, which is an enlarged view of a portion M of FIG. 43. The linear polarization layer 122 includes a plurality of grids 112. The grids 12 are formed between the quarter wave layer 121 and the substrate 120. Each of the grids 112 includes the first and second metal layers 113 and 114 and the intermediate layer 115. Although described herein as the grids 112, the linear polarization layer 122 is not limited thereto such that the linear polarization layer 122 may include the grids 12 as described with reference to FIGS. 1-4. The first metal layer 113 is formed between the intermediate layer 115 and the quarter wave layer 121. The second metal layer 114 is formed between the substrate 120 and the intermediate layer 115. Although described as having the first and second metal layers 113 and 114, the grids 112 is not limited thereto such that aspects of the present invention may include a different number of metal layers.

The grids 112 are formed such that the external light reflected by the first metal layer 113 and the second metal layer 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 12 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein.

The quarter wave layer 121 is formed on the linear polarization layer 122. The quarter wave layer 121 may be formed by depositing an inorganic material in an inclined direction. In this case, fine columns extend from a surface of the quarter wave layer 121 in an inclined direction, i.e., not perpendicular to the surface of the quarter wave layer 121. The inclined direction of the columns is a column growth direction. When an inorganic material is deposited, the inorganic material grows in a circular column shape. Thus, when the inorganic material is deposited in an inclined direction, the circular column shape is also inclined at a predetermined angle with respect to a horizontal direction, i.e., the circular column shape is not a right circular cylinder. Further, although the columns are described as circular, aspects of the present invention are not limited thereto such that the columns may be elliptical, parabolic, or polygonal. Accordingly, the quarter wave layer 121 exhibits a birefringence characteristic. The quarter wave layer 121 may be formed of a variety of inorganic materials, such as, TiO2 or TaOx. Also, the quarter wave layer 121 may be formed of GaO or BaO so as to absorb moisture absorption.

The organic light emitting device 130 is formed on the quarter wave layer 121. In the deposition order of the linear polarization layer 122 and the quarter wave layer 121, the linear polarization layer 122 is arranged nearer to the external light and the quarter wave layer 121 is arranged nearer to the linear polarization layer 122 so as to be farther from the external light than the linear polarization layer 122. Another light transmissive member may be disposed between the linear polarization layer 122 and the quarter wave layer 121.

The organic light emitting device 130 includes a first electrode 131, a second electrode 133, and an organic light emitting layer 132 which are arranged to face one another. The first electrode 131 may be formed of a transparent conductive material, for example, ITO, IZO, $In_2O_3$ and ZnO, in a predetermined pattern using a photolithography method. When the first electrode 131 is of a passive matrix type, the pattern of the first electrode 131 may be formed of lines in strips separated at a predetermined interval from one another. When the first electrode 131 is of an active matrix type, the pattern of the first electrode 131 may be formed to correspond to pixels. The second electrode 133 is arranged above the first electrode 131. The second electrode 133 may be of a reflection type electrode and formed of aluminum, silver, and/or calcium. Also, the second electrode 133 is connected to an external port (not shown) and may be a cathode electrode. When the second electrode 133 is of the passive matrix type, the pattern of the second electrode 133 may be a shape of strips arranged perpendicular to the pattern of the first electrode 131. When the second electrode 133 is of an active matrix type, the pattern of the second electrode 133 may be formed across all of an active area where an image is displayed. The polarities of the first and second electrodes 131 and 133 may be opposite to each other.

The organic light emitting layer 132 disposed between the first and second electrodes 131 and 133 emits light by electric drive of the first and second electrodes 131 and 133. A low molecular weight or high molecular weight substance may be used for the organic light emitting layer 132. When the organic light emitting layer 132 is formed of a low molecular weight organic substance, a hole transfer layer and a hole injection layer are deposited on the organic light emitting layer 132 in a direction toward the first electrode 131 and an electron transfer layer and an electron injection layer are deposited in a direction toward the second electrode 133. A variety of layers may be deposited as necessary. A variety of organic substances such as copper phthalocyanine (CuPc), N,N'-Di(naphthalene-1-yl)-N,N'-diphenyl-benzidine (NPB), or tris-8-hydroxyquinoline aluminum (Alq3) may be used.

For a high molecular weight organic layer formed of a high molecular weight organic substance, only a hole transfer layer (HTL) is deposited on the organic light emitting layer 132 in a direction toward the first electrode 131. The high molecular weight hole transfer layer is formed in an upper portion of the first electrode 131 in an inkjet printing or spin coating method using poly-(2,4)-ethylene-dihydroxy thiophene (PEDOT) or polyaniline (PANI). The organic light emitting layer 132 that is of a high molecular weight may be formed of PPV, Soluble PPV's, Cyano-PPV, polyfluorene. A color pattern may be formed in a typical method such as inkjet printing, spin coating, or a thermal transfer method using laser.

In the present embodiment, the light radiated by the organic light emitting device 130 proceeds toward the substrate 120 as shown in FIG. 43. A user of the organic light emitting device 130 can view an image from the lower surface of the substrate 120, that is, from the lower side of FIG. 43. In the bottom emission type, the external light, such as sunlight, is input through the substrate 120 so that contrast is deteriorated.

However, according to aspects of the present invention, the reflection of the external light can be minimized as the linear polarization layer 122 and the quarter wave layer 121 form a circular polarization layer. Of the external light incident on the lower surface of the substrate 120, a component of the external light in a direction along the absorption axis of the linear polarization layer 122 is absorbed and a component of the external light in a direction along the transmission axis of the linear polarization layer 122 is transmitted to the substrate 120. The component of the external light in the transmission axis direction is changed to be a circularly polarized light that rotates in a direction as the component of the external light in the transmission axis direction passes through the quarter wave layer 121. The circularly polarized light is reflected by the second electrode 133 of the organic light emitting device 130. Upon reflection, the circularly polarized light rotating in a direction becomes a circularly polarized light rotating in the other direction. As the circularly polarized light passes through the quarter wave layer 121, the circularly polarized light is changed to a linearly polarized light in a direction perpendicular to the original transmission axis. The linearly polarized light is absorbed by the absorption axis of the linear polarization layer 122 so as to not be transmitted from the lower surface of the substrate 120. Thus, the reflection of the external light is minimized and the contrast is further improved.

Also, the linear polarization layer 122 of the present embodiment includes a plurality of the grids 112. When the external light input through the substrate 120 arrives at the linear polarization layer 122, the effect of destructive interference of the eternal light reflected by the grids 112 having the first and second metal layers 113 and 114 and the intermediate layer 115 is improved. As a result, the reflection of the external light is minimized and contrast is improved. Although described herein as the grids 112, the linear polarization layer 122 is not limited thereto such that the linear polarization layer 122 may include the grids 12 as described with reference to FIGS. 1-4

Also, since the linear polarization layer 122 and the quarter wave layer 121 are formed directly on the substrate 120, an adhesion layer is not needed and an organic light emitting display apparatus having a decreased thickness may be formed. Since an image implemented by the light emitting layer does not pass through the adhesion layer, brightness is improved.

The linear polarization layer 122 and the quarter wave layer 121 may be formed in a variety of methods. Not only for the above-described bottom emission type but also for the top emission type, the structure may be modified considering the direction in which the external light is incident.

Figure 45:
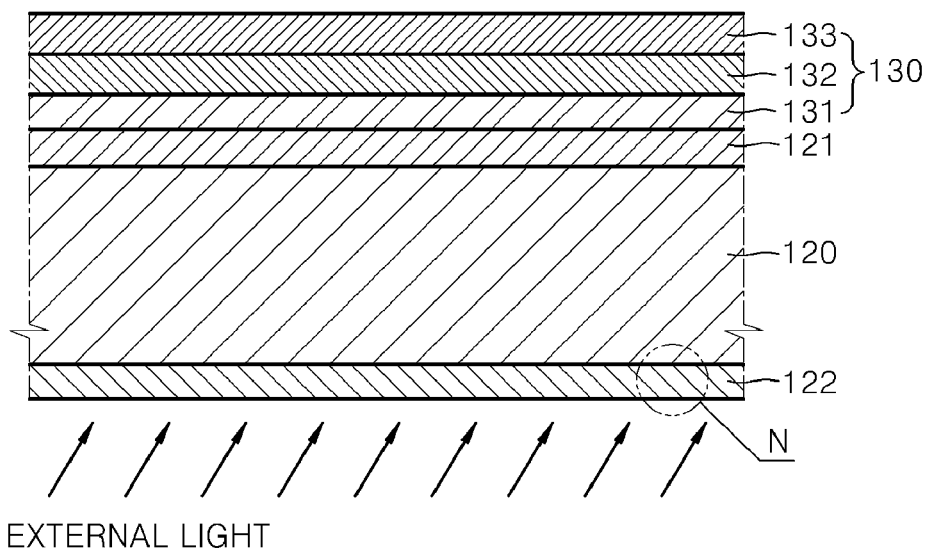
Figure 46:
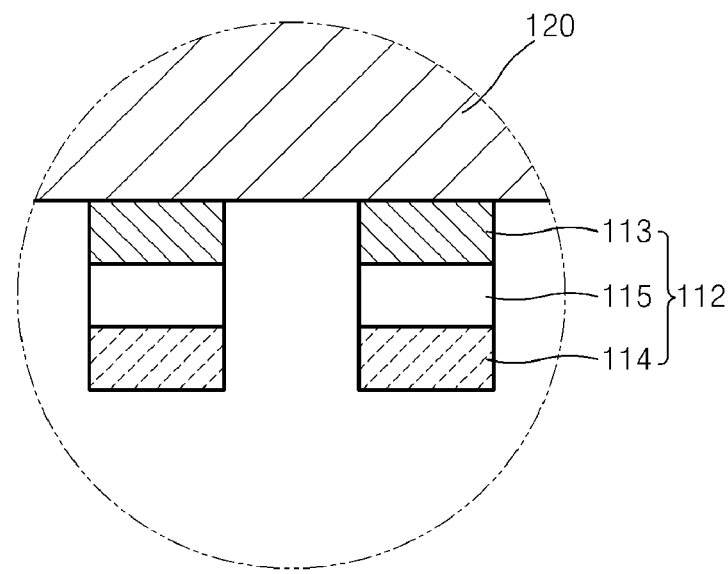

FIG. 45 is a cross-sectional view schematically showing an organic light emitting display apparatus of a bottom emission type according to another embodiment of the present invention. Referring to FIG. 45, the linear polarization layer 122 is formed on a surface of the substrate 120 and the quarter wave layer 121 is formed on the other surface. The organic light emitting device 130 is formed on the quarter wave layer 121. The detailed structure of the linear polarization layer 122 is illustrated in detail in FIG. 46, which is an enlarged view of a portion N of FIG. 45.

The linear polarization layer 122 includes a plurality of the grids 112. Each of the grids 112 includes the first and second metal layers 113 and 114 and the intermediate layer 115. The first metal layer 113 is formed between the substrate 120 and the intermediate layer 115 and the second metal layer 114 is formed on the intermediate layer 115. As described above, aspects of the present invention are not limited to two metal layers.

The grids 112 are formed such that the external light reflected by the first metal layer 113 and the second metal layer 114 generates destructive interference with each other. Also, the grids 112 are formed such that the reflectance of the second metal layer 114 arranged close to the external light is lower than that of the first metal layer 113 so as to make the amplitudes of the reflected external light identical. Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

Figure 47:
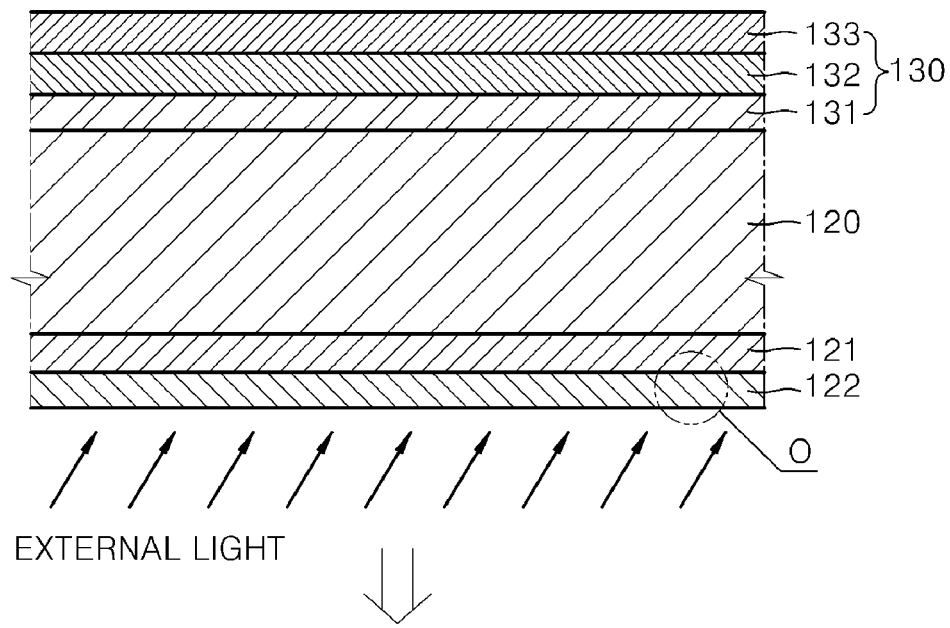

FIG. 47 is a cross-sectional view schematically showing an organic light emitting display apparatus of a bottom emission type according to another embodiment of the present invention. Referring to FIG. 47, the quarter wave layer 121 and the linear polarization layer 122 are sequentially formed on a surface of the substrate 120 facing the external light. The organic light emitting device 130 is formed on the other surface of the substrate 120. The detailed descriptions on the constituent elements are the same as described above.

Figure 48:
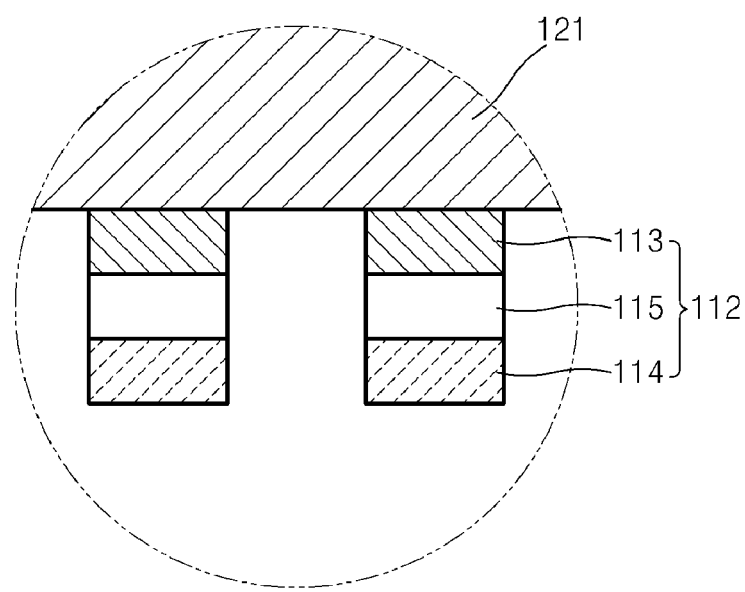

The detailed structure of the linear polarization layer 122 is illustrated in detail in FIG. 48, which is an enlarged view of a portion O of FIG. 47. The linear polarization layer 122 includes a plurality of the grids 112. The grids 112 are formed on a surface of the quarter wave layer 121 that does not face the substrate 120. Each of the grids 112 includes the first and second metal layers 113 and 114 and the intermediate layer 115. The first metal layer 113 is formed between the quarter wave layer 121 and the intermediate layer 115 and the second metal layer 114 is formed on the intermediate layer 115.

The grids 112 are formed such that the external light reflected by the first metal layer 113 and the second metal layer 114 generates destructive interference. Also, the grids 112 are formed such that the reflectance of the second metal layer 114 arranged close to the external light is lower than that of the first metal layer 113 so as to make the amplitudes of the reflected external light identical. Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

The above descriptions focus on the organic light emitting device of a bottom emission type in which an image is implemented in a direction toward the substrate 120, but aspects of the present invention are not limited thereto. Aspects of the present invention may be applied to the top emission type in which the image formed in the light emitting layer is implemented in a direction opposite to the substrate 120 instead of the direction toward the substrate 120.

Figure 49:
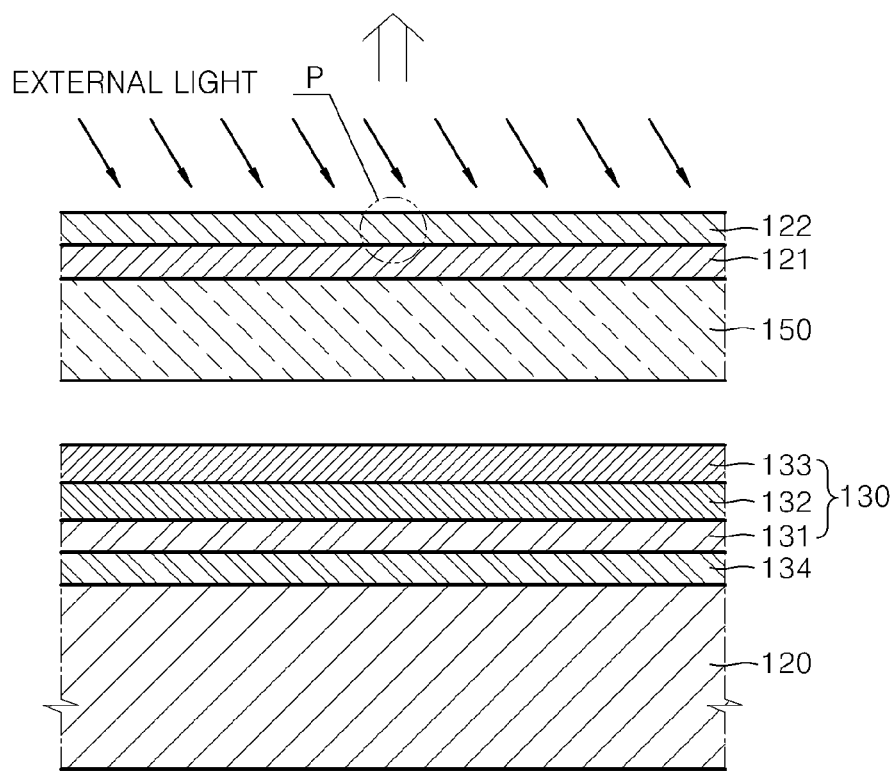
FIGS. 49 through 59, respectively, are cross-sectional views schematically showing examples of an organic light emitting display apparatus of a top emission type according to another embodiment of the present invention and magnified cross-sectional views respectively showing a linear polarization layer thereof.

FIG. 49 is a cross-sectional view schematically showing an organic light emitting display apparatus of a top emission type according to another embodiment of the present invention. The organic light emitting display apparatus includes the substrate 120 and a reflection film 134, the organic light emitting device 130, and a sealing member 150 which are formed on the substrate 120.

The substrate 120 may be a transparent glass substrate as described above, but according to aspects of the present invention, the substrate 120 need not be transparent. Also, plastic or metal may be used for the substrate 120 so as to provide a flexible characteristic. An insulating film may be further formed on a surface of the reflection film 134.

The reflection film 134 formed on the surface of the substrate 120 may be formed of Ag, Mg, Al, Pt, Pd, Au, Ni, Nd, Ir, Cr, or compounds thereof. The first electrode 131 may be formed of ITO, IZO, ZnO, or $In_2O_3$ having a high work function, and the first electrode 131 may be formed on the reflection film 134. The first electrode 131 may be an anode. If the first electrode 131 is a cathode, the first electrode 131 may be formed of Ag, Mg, Al, Pt, Pd, Au, Ni, Nd, Ir, Cr, or compounds thereof, and the first electrode 131 may be formed to replace the reflection film 134. In the following description, the first electrode 131 is an anode.

The second electrode 133 is formed as a transmissive electrode. The second electrode 133 is formed of metal such as Li, Ca, LiF/Al, Al, Mg, or Ag having a low work function, and the second electrode 133 is formed into a thin semi-transmissive film. A problem of high resistance due to a decrease in the thickness may be solved by forming a transparent conductive body such as ITO, IZO, ZnO, or $In_2O_3$ on the second electrode 133. The organic light emitting layer 132 formed between the first electrode 131 and the second electrode 133 is the same as described above.

The sealing member 150 that seals the organic light emitting device 130 is formed on the organic light emitting device 130 and may be separated therefrom by spacers (not shown). The sealing member 150 is formed of a transparent material in order to protect the organic light emitting device 130 from external moisture or oxygen. To this end, the sealing member 150 may be a glass substrate, a plastic substrate, or a compound structure of an organic material and an inorganic material.

Figure 50:
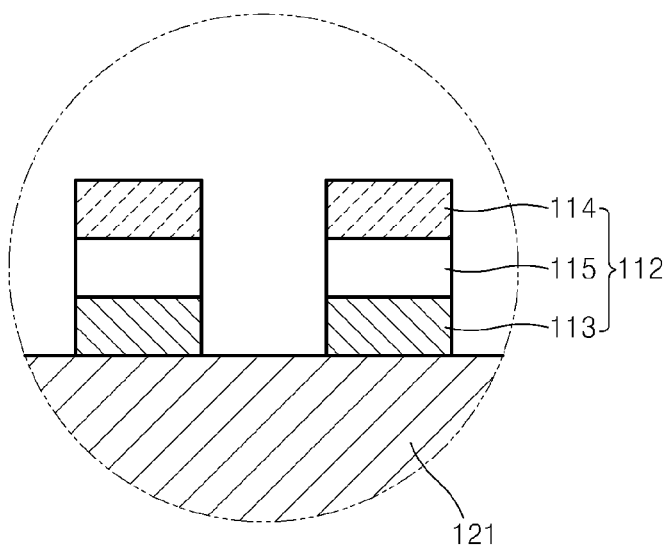

The quarter wave layer 121 and the linear polarization layer 122 are sequentially formed on an upper surface of the sealing member 150 facing the external light, i.e., not facing the organic light emitting device 130. The structure of the linear polarization layer 122 is illustrated in detail in FIG. 50, which is an enlarged view of a portion P of FIG. 49. The linear polarization layer 122 includes a plurality of the grids 112. The grids 112 are formed on a surface of the quarter wave layer 121 that does not face the sealing member 150. Each of the grids 112 includes a plurality of the first and second metal layers 113 and 114 and the intermediate layer 115. The first metal layer 113 is formed between the quarter wave layer 121 and the intermediate layer 115 and the second metal layer 114 is formed on the intermediate layer 115.

The grids 112 are formed such that the external light reflected by the first and second metal layers 113 and 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the sealing member 150 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

According to the present embodiment, the external light input in a direction in which an image is implemented, that is, the light input from the upper side of FIG. 49, sequentially passes through the linear polarization layer 122 and the quarter wave layer 121 and is reflected by the surface of the reflection film 134. In doing so, the external light does not finally pass through the linear polarization layer 122 and the destructive interference thereof is the same as described above.

Figure 51:
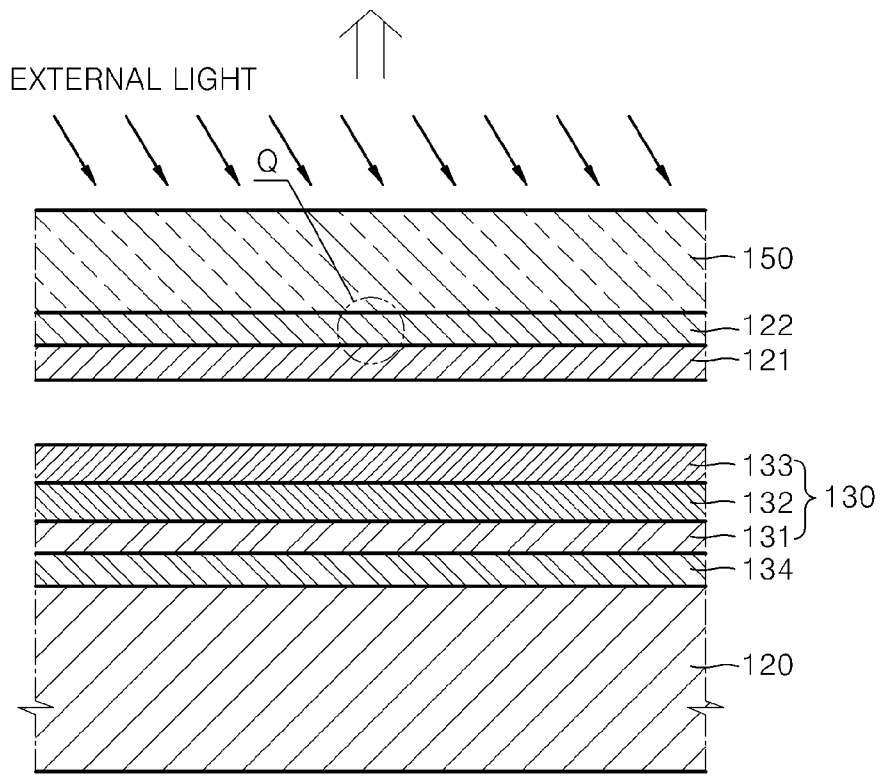
Figure 52:
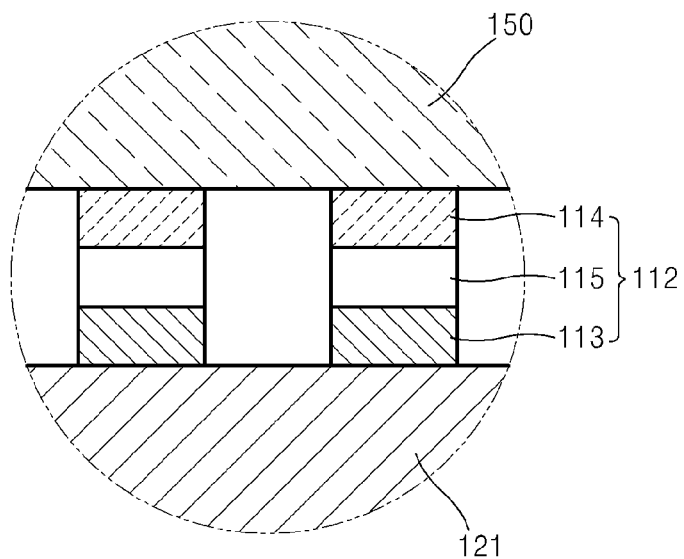

FIG. 51 is a cross-sectional view schematically showing an organic light emitting display apparatus of a top emission type according to another embodiment of the present invention. Referring to FIG. 51, the linear polarization layer 122 and the quarter wave layer 121 are sequentially formed on a surface of the sealing member 150 facing the organic light emitting device 130. The detailed structure of the linear polarization layer 122 is illustrated in detail in FIG. 52, which is an enlarged view of a portion Q of FIG. 51. The linear polarization layer 122 includes a plurality of the grids 112. The grids 112 are formed between the sealing member 150 and the quarter wave layer 121. Each of the grids 112 includes the first and second metal layers 113 and 114 and the intermediate layer 115. The first metal layer 113 is formed between the quarter wave layer 121 and the intermediate layer 115 and the second metal layer 114 is formed between the sealing member 150 and the intermediate layer 115.

The grids 112 are formed such that the external light reflected by the first metal layer 113 and the second metal layer 114 generates destructive interference with each other. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the sealing member 150 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

Figure 53:
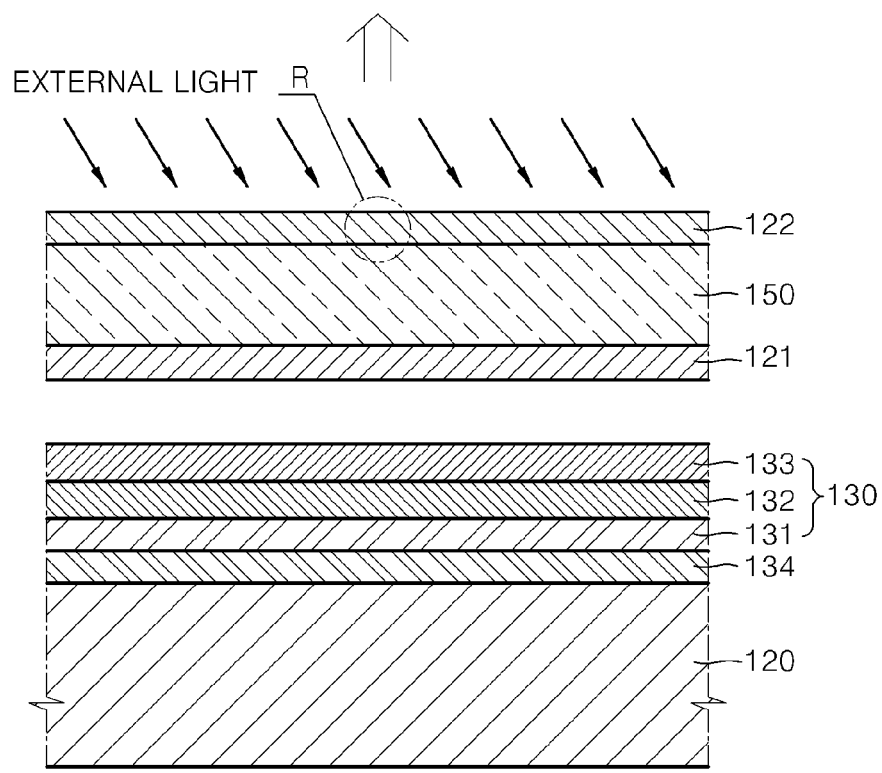
Figure 54:
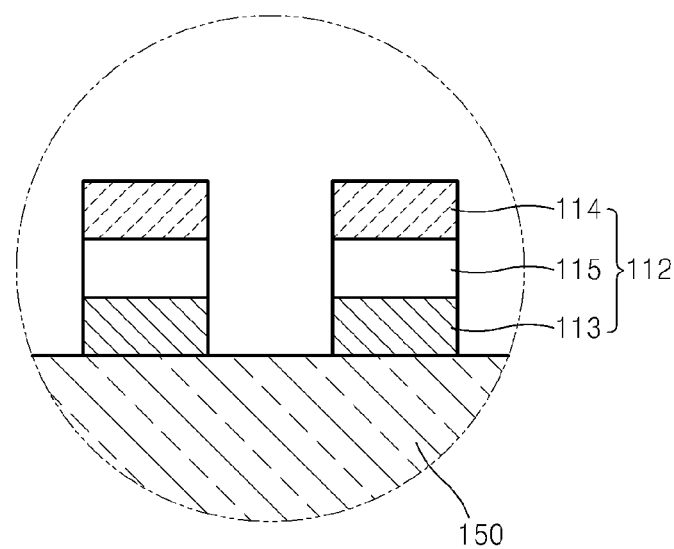

FIG. 53 is a cross-sectional view schematically showing an organic light emitting display apparatus of a top emission type according to another embodiment of the present invention. Referring to FIG. 53, the linear polarization layer 122 is formed on a surface of the sealing member 150 facing the external light. The quarter wave layer 121 is formed on the other surface of the sealing member 150 facing the organic light emitting device 130. The detailed structure of the linear polarization layer 122 is illustrated in detail in FIG. 54, which is an enlarged view of a portion R of FIG. 53. The linear polarization layer 122 includes a plurality of the grids 112. The grids 112 are formed on a surface of the sealing member 150 that does not face the organic light emitting device 130.

Each of the grids 112 includes the first and second metal layers 113 and 114 and the intermediate layer 115. The first metal layer 113 is formed on the sealing member 150 and the second metal layer 114 is formed on the intermediate layer 115. The grids 112 are formed such that the external light reflected by the first metal layer 113 and the second metal layer 114 can generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

Figure 55:
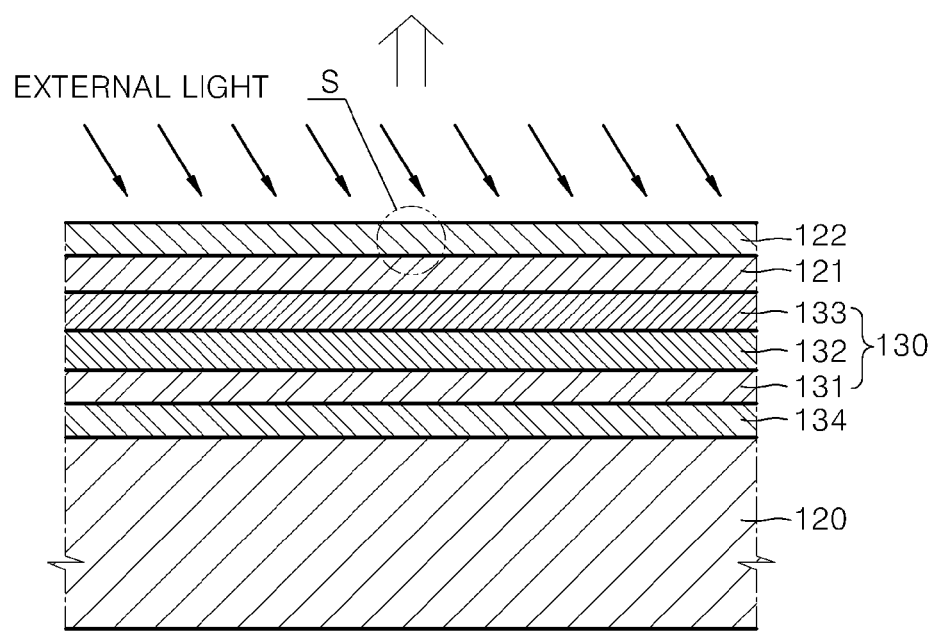
Figure 56:
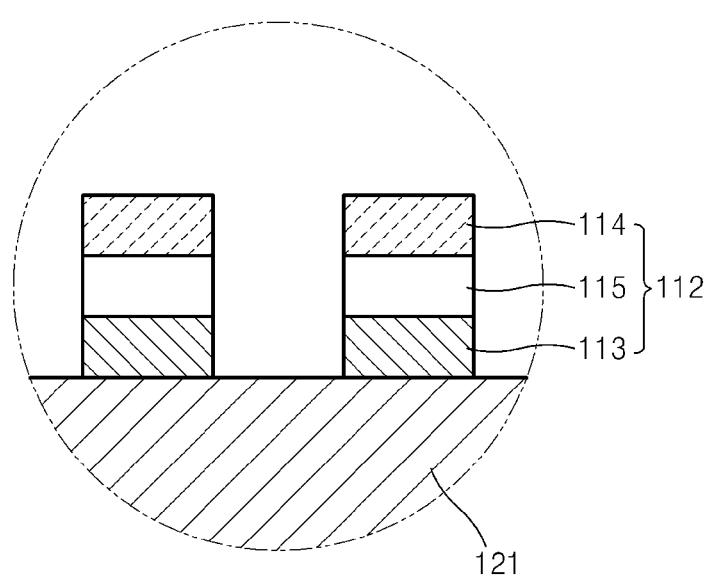

FIG. 55 is a cross-sectional view schematically showing an organic light emitting display apparatus of a top emission type according to another embodiment of the present invention. Referring to FIG. 55, the reflection film 134 is formed on the substrate 120. The organic light emitting device 130 is formed on the reflection film 134. The quarter wave layer 121 is formed on the organic light emitting device 130, which is formed on the reflection film 134. The linear polarization layer 122 is formed on the quarter wave layer 121. The detailed structure of the linear polarization layer 122 is illustrated in detail in FIG. 56, which is an enlarged view of a portion S of FIG. 55. A plurality of the grids 112 are formed on the quarter wave layer 121.

The linear polarization layer 122 includes a plurality of the grids 112. The grids 112 are formed on a surface of the quarter wave layer 121 that is opposite the quarter wave layer 121 from the second electrode 133. Each of the grids 112 includes the first and second metal layers 113 and 114 and the intermediate layer 115. The first metal layer 113 is formed on the quarter wave layer 121 and the second metal layer 114 is formed on the intermediate layer 115. The intermediate layer 115 is formed on the first metal layer 113. The grids 112 are formed such that the external light reflected by the first metal layer 113 and the second metal layer 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

Figure 57:
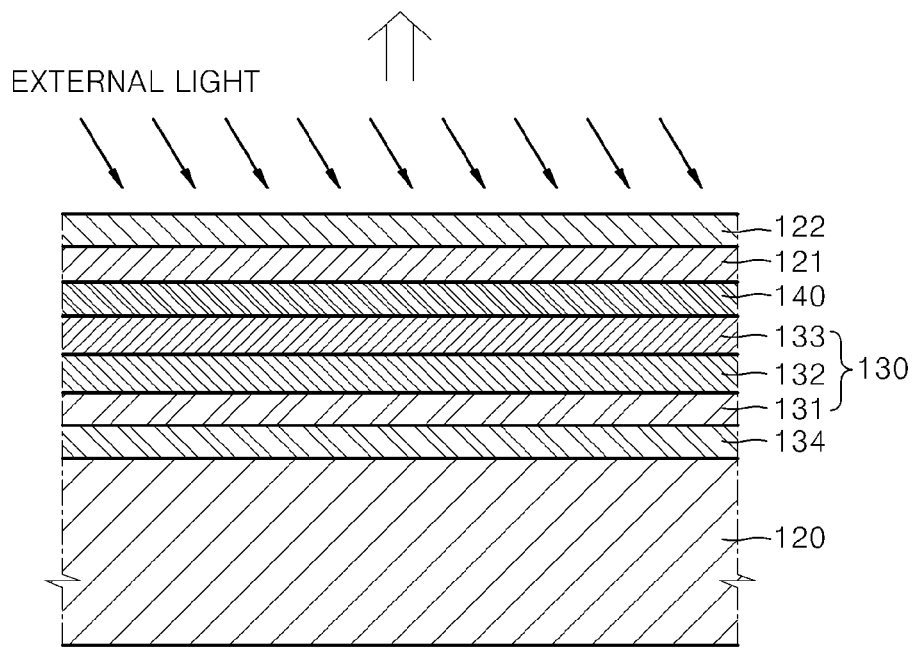

A protection layer may be formed between the second electrode 133 and the quarter wave layer 121. Referring to FIG. 57, a protection layer 140 is formed between the quarter wave layer 121 and the second electrode 133 of the organic light emitting device 130. Since the structure of the organic light emitting display apparatus of FIG. 57 is the same as that of the organic light emitting display apparatus of FIG. 55, except for the protection layer 140, only the protection layer 140 is described below.

The protection layer 140 is formed to prevent the second electrode 133 from being damaged during a process of forming the quarter wave layer 121. The protection layer 140 is formed of an inorganic material or an organic material. The inorganic material may include metal oxide, metal nitride, metal carbide, metal oxynitride, and/or compounds thereof. The metal oxide may include silicon oxide, aluminum oxide, titanium oxide, indium oxide, tin oxide, indium tin oxide, and/or compounds thereof. The metal nitride may include aluminum nitride, silicon nitride, and/or compounds thereof. Silicon carbide may be used for the metal carbide. Silicon oxynitride may be used for the metal oxynitride. The inorganic material may also include silicon and/or ceramic derivatives of each of the silicon and the metals. In addition, diamond-like carbon (DLC) may be used for the inorganic material. The organic material may include organic polymer, inorganic polymer, organometallic polymer, and/or hybrid organic/inorganic polymer. Also, acrylic resin may be used for the organic material. Since the detailed structure and effect of the protection layer 140 are the same as described above, descriptions thereof will be omitted herein.

Figure 58:
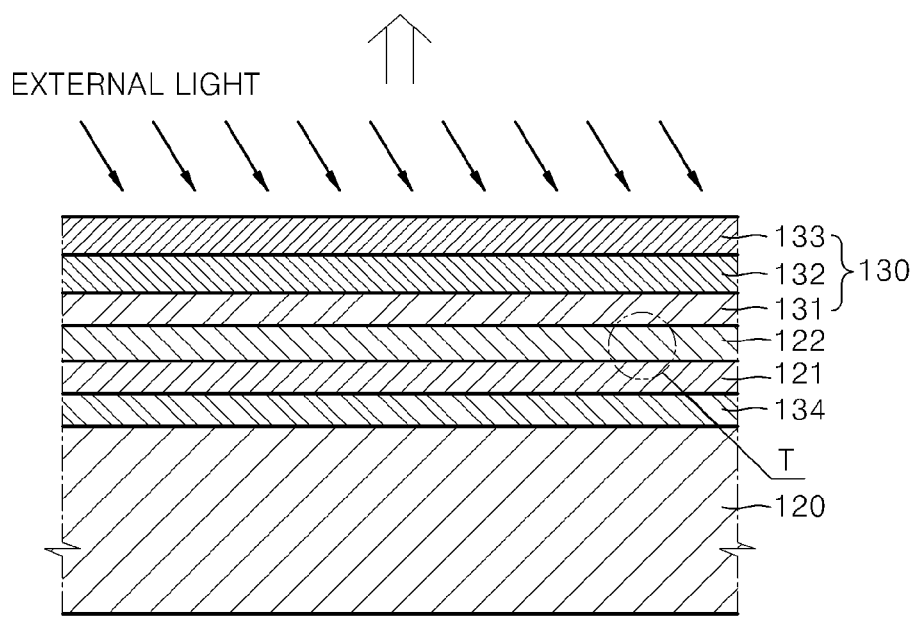
Figure 59:
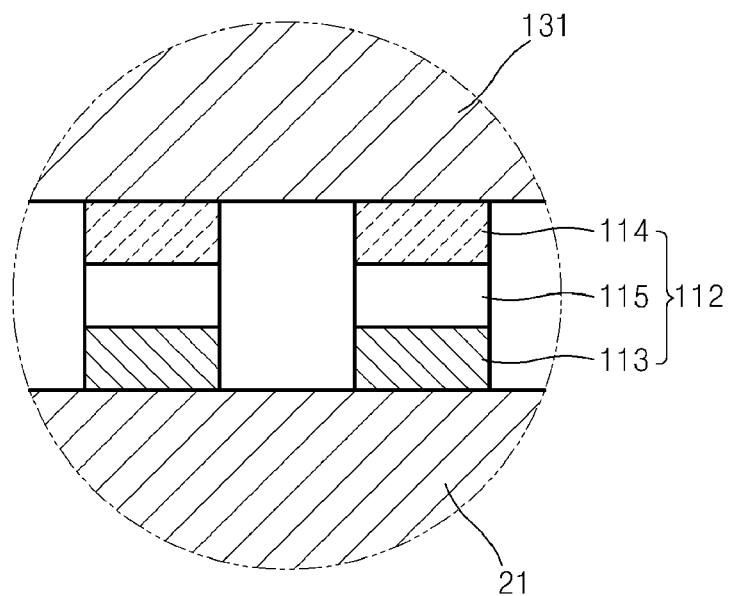

FIG. 58 is a cross-sectional view schematically showing an organic light emitting display apparatus of a top emission type according to another embodiment of the present invention. Referring to FIG. 58, the quarter wave layer 121 and the linear polarization layer 122 are formed between the reflection film 134 and the organic light emitting device 130. The detailed structure of the linear polarization layer 122 is illustrated in detail in FIG. 59, which is an enlarged view of a portion T of FIG. 58. A plurality of the grids 112 are formed on the quarter wave layer 121.

The linear polarization layer 122 includes a plurality of the grids 112. The grids 112 are formed between the quarter wave layer 121 and the first electrode 131. Each of the grids 112 includes the first and second metal layers 113 and 114 and the intermediate layer 115. The first metal layer 113 is formed between the quarter wave layer 121 and the intermediate layer 115 and the second metal layer 114 is formed between the intermediate layer 115 and the first electrode 131. The grids 112 are formed such that the external light reflected by the first metal layer 113 and the second metal layer 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

Although it is not shown, the quarter wave layer 121 may be formed on the upper surface of the reflection film 134, the organic light emitting device 130 may be formed on the quarter wave layer 121, and the linear polarization layer 122 may be formed on the organic light emitting device 130.

Figure 60:
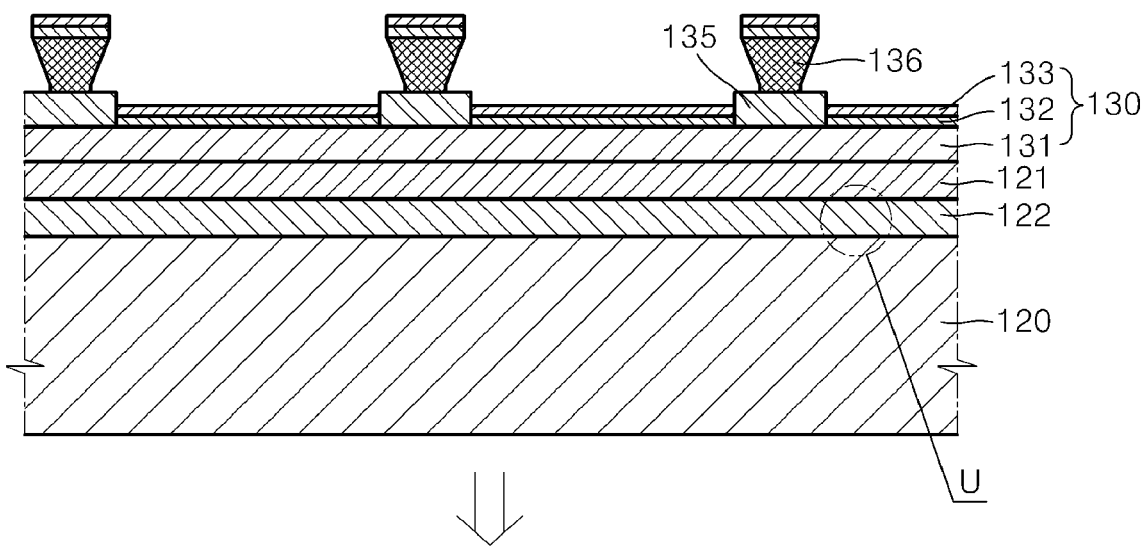
FIGS. 60 and 61, respectively, are a cross-sectional view schematically showing an organic light emitting display apparatus of a bottom emission type in a passive matrix type according to another embodiment of the present invention and a magnified cross-sectional view showing a linear polarization layer thereof.
Figure 61:
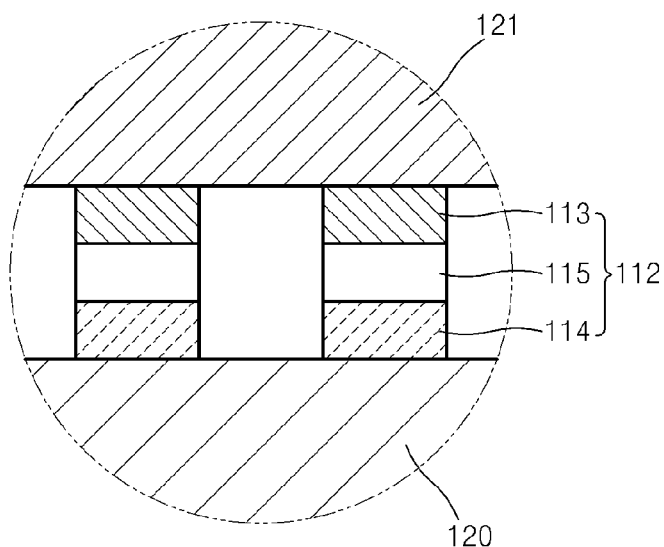

FIG. 60 is a cross-sectional view schematically showing an organic light emitting display apparatus of a bottom emission type in a passive matrix type according to another embodiment of the present invention. In the organic light emitting display apparatus of FIG. 60, the linear polarization layer 122 and the quarter wave layer 121 are sequentially formed on the upper surface of the substrate 120. The organic light emitting device 130 is formed on the quarter wave layer 121. The detailed structure of the linear polarization layer 122 is illustrated in detail in FIG. 61, which is an enlarged view of a portion U of FIG. 60.

The linear polarization layer 122 includes a plurality of the grids 112. The grids 112 are formed between the quarter wave layer 121 and the substrate 120. Each of the grids 112 includes the first and second metal layers 113 and 114 and the intermediate layer 115. The first metal layer 113 is formed between the quarter wave layer 121 and the intermediate layer 115 and the second metal layer 114 is formed between the substrate 120 and the intermediate layer 115. The grids 112 are formed such that the external light reflected by the first metal layer 113 and the second metal layer 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

The first electrode 131 is formed on the quarter wave layer 121 in a predetermined stripe pattern. The inner insulating film 135 is formed on the first electrode 131 to section the first electrode 131. The separator 136 provides a pattern for the organic light emitting layer 132, and the second electrode 133, and the separator 136 is formed on the inner insulating film 135 in a direction perpendicular to a direction in which the first electrode 131 is formed. The organic light emitting layer 132 and the second electrode 133 are patterned to be perpendicular to the first electrode 131 by the separator 136. A sealing member (not shown) may be formed on the second electrode 133 so that the organic light emitting device 130 is blocked from the external air. In some cases, the organic light emitting layer 132 and the second electrode 133 may be patterned without the separator 136.

In the embodiment of FIG. 60, as in the above-described embodiments, since the linear polarization layer 122 and the quarter wave layer 121 are sequentially deposited on the substrate 120, the linear polarization layer 122 and the quarter wave layer 121 can decrease the reflection of the external light input from the lower side of the substrate 120 in FIG. 60 so that the thickness of the overall display may be decreased. Also, by restricting the reflection on a boundary surface generated due to the difference in the index of refraction, the reflection of the external light is decreased by absorbing the external light when the external light is incident on the grids 112. Although it is not shown, the structure as shown in FIGS. 45 and 47 may be applied to the organic light emitting display apparatus of a bottom emission type in a passive matrix type.

Figure 62:
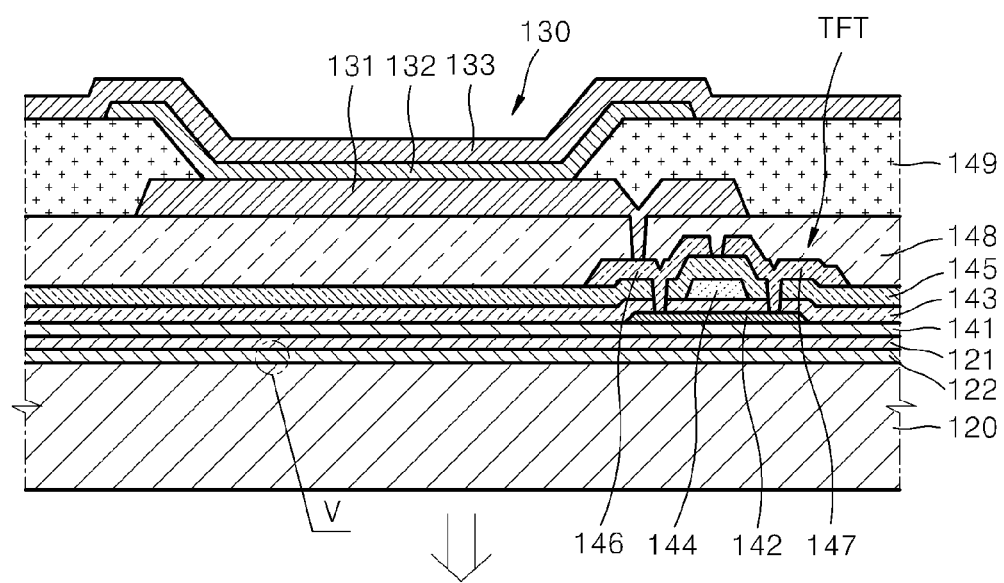
FIGS. 62 and 63, respectively, are a cross-sectional view schematically showing an organic light emitting display apparatus of a bottom emission type in an active matrix type according to another embodiment of the present invention and a magnified cross-sectional view showing a linear polarization layer thereof.

FIG. 62 is a cross-sectional view schematically showing an organic light emitting display apparatus of a bottom emission type in an active matrix type according to another embodiment of the present invention. Referring to FIG. 62, a thin film transistor (TFT) is formed on the upper surface of the substrate 120. At least one TFT is formed for each pixel and is electrically connected to the organic light emitting device 130.

Figure 63:
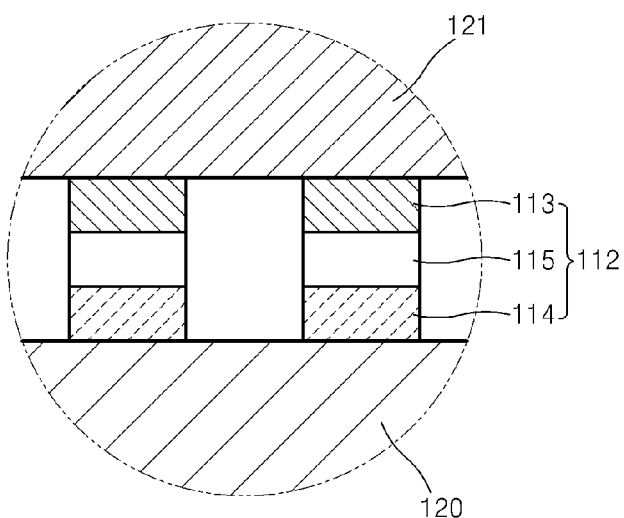

In detail, the linear polarization layer 122 and the quarter wave layer 121 are sequentially formed on the substrate 120. The structure of the linear polarization layer 122 is illustrated in detail in FIG. 63, which is an enlarged view of a portion V of FIG. 62. The linear polarization layer 122 includes a plurality of the grids 112. The grids 112 are formed between the quarter wave layer 121 and the substrate 120. Each of the grids 112 includes a plurality of the first and second metal layers 113 and 114 and the intermediate layer 115. The first metal layer 113 is formed between the quarter wave layer 121 and the intermediate layer 115. The second metal layer 114 is formed between the substrate 120 and the intermediate layer 115.

The grids 112 are formed such that the external light reflected by the first and second metal layers 113 and 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

A buffer layer 141 is formed on the quarter wave layer 121 and a semiconductor layer 142 is formed in a predetermined pattern on the buffer layer 141. Agate insulating film 143 formed of $SiO_2$ or $SiN_x$ is formed on the upper surface of the semiconductor layer 142. A gate electrode 144 is formed on a predetermined area on the upper surface of the gate insulating film 143. The gate electrode 144 is connected to a gate line (not shown) to receive a TFT on/off signal. An interlayer insulating film 145 is formed on the upper surface of the gate electrode 144 and the buffer layer 141. A source electrode 146 and a drain electrode 147 are respectively formed to contact source and drain regions of the semiconductor layer 142 through contact holes. The TFT formed as above is covered and protected by a passivation film 148.

The first electrode 131 may be an anode electrode is formed on the upper surface of the passivation film 148. A pixel definition layer 149 is formed of an insulating material to cover the first electrode 131. After forming a predetermined opening in the pixel definition layer 149, the organic light emitting layer 132 is formed in an area defined by the opening. The second electrode 133 is formed thereon.

In the structure of the active matrix type, since the linear polarization layer 122 and the quarter wave layer 121 are sequentially deposited on the substrate 120, the linear polarization layer 122 and the quarter wave layer 121 can decrease the reflection of the external light input from the lower side of the substrate 120 in FIG. 62.

In the organic light emitting display apparatus of a bottom emission type in an active matrix type, the linear polarization layer 122 and the quarter wave layer 121 may be formed on any of surfaces of the substrate 120, the TFT, and the organic light emitting device 130 as long as the linear polarization layer 122 is arranged closer to the external light and the quarter wave layer 121 is arranged farther from the external light. That is, although it is not separately illustrated, as shown in FIGS. 45 and 47, after the linear polarization layer 122 and the quarter wave layer 121 are formed on a surface and/or the other surface of the substrate 120, the TFT and the organic light emitting device 130 may be formed. Also, the quarter wave layer 121 and/or the linear polarization layer 122 may be arranged at an interface between layers of the TFT.

Figure 64:
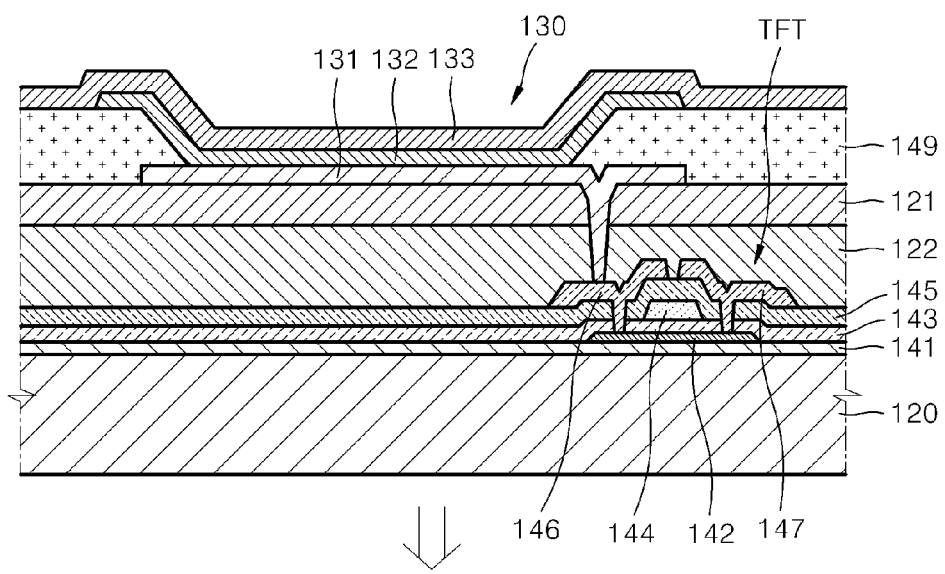
FIG. 64 is a cross-sectional view schematically showing an organic light emitting display apparatus of a bottom emission type in an active matrix type according to another embodiment of the present invention.

Without forming the passivation film 148 of FIG. 62, the linear polarization layer 122 and the quarter wave layer 121 are used therefor. Referring to FIG. 64, the passivation film 148 is not separately formed of an organic material and/or an inorganic material on the upper surface of the TFT, and the linear polarization layer 122 and the quarter wave layer 121 are sequentially formed on the interlayer insulating film 145 and used instead of the passivation film 148. Since the detailed structure and effect are the same as described above, descriptions thereof will be omitted herein.

Figure 65:
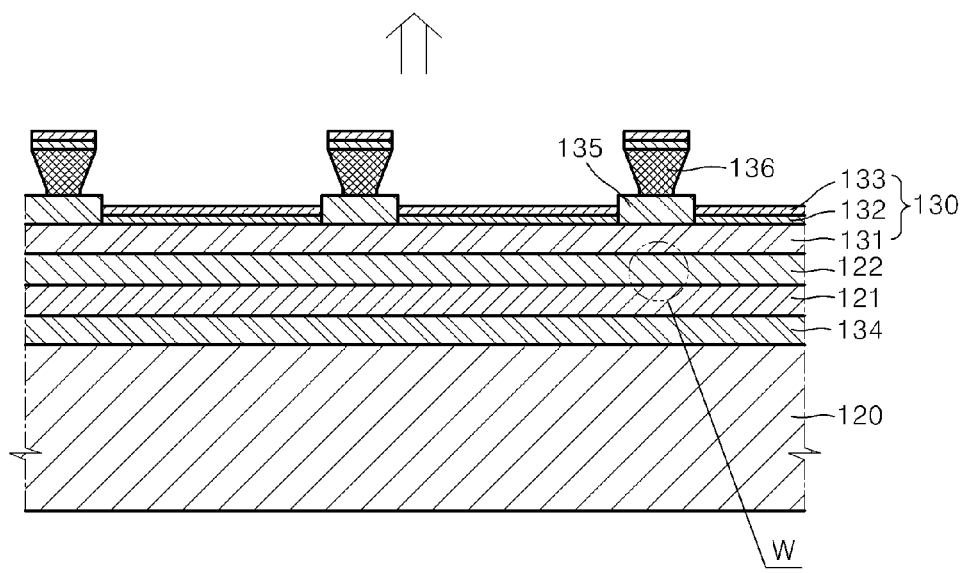
FIGS. 65 and 66, respectively, are a cross-sectional view schematically showing an organic light emitting display apparatus of a top emission type in a passive matrix type according to another embodiment of the present invention and a magnified cross-sectional view showing a linear polarization layer thereof.

FIG. 65 is a cross-sectional view schematically showing an organic light emitting display apparatus of a top emission type in a passive matrix type according to another embodiment of the present invention. Referring to FIG. 65, the reflection film 134 is formed on the upper surface of the substrate 120. The quarter wave layer 121 and the linear polarization layer 122 are sequentially formed on the upper surface of the reflection film 134. The organic light emitting device 130 is formed on the linear polarization layer 122.

Figure 66:
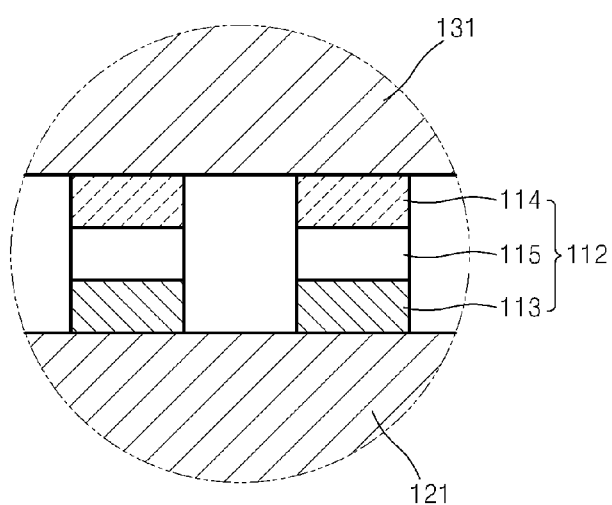

The detailed structure of the linear polarization layer 122 is illustrated in detail in FIG. 66, which is an enlarged view of a portion W of FIG. 65. The linear polarization layer 122 includes a plurality of the grids 112. The grids 112 are formed between the quarter wave layer 121 and the first electrode 131. Each of the grids 112 includes the first and second metal layers 113 and 114 and the intermediate layer 115. The first metal layer 113 is formed between the quarter wave layer 121 and the intermediate layer 115, and the second metal layer 114 is formed between the first electrode 131 and the intermediate layer 115.

The grids 112 are formed such that the external light reflected by the first metal layer 113 and the second metal layer 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

The first electrode 131 is formed on the linear polarization layer 122 in a predetermined stripe pattern. The inner insulating film 135 is formed on the first electrode 131 to section the first electrode 131. The separator 136 provides a pattern for the organic light emitting layer 132 and the second electrode 133, and the separator 136 is formed on the inner insulating film 135 in a direction perpendicular to a direction in which the first electrode 131 is formed. The organic light emitting layer 132 and the second electrode 133 are patterned to be perpendicular to the first electrode 131 by the separator 136. A sealing member (not shown) may be formed on the second electrode 133 so that the organic light emitting device 130 is blocked from the external air. In some cases, the organic light emitting layer 132 and the second electrode 133 may be patterned without the separator 136.

In the present embodiment, since the external light input from the outside is substantially not reflected, contrast may be improved and the thickness of the overall display may be decreased. The descriptions on the detailed structure and effect that are the same as described above will be omitted herein. Although it is not shown in a separate drawing, the structures shown in FIGS. 49 through 57 may be directly applied to the organic light emitting display apparatus of a top emission type in a passive matrix type.

Figure 67:
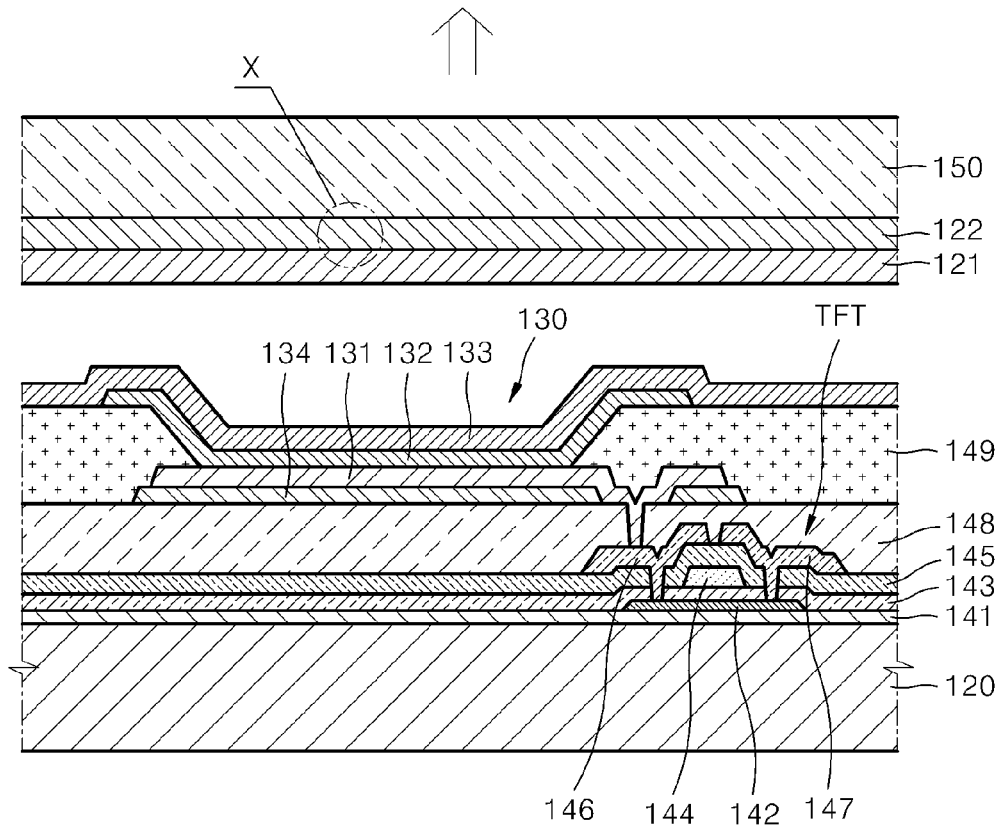
FIGS. 67 and 68, respectively, are a cross-sectional view schematically showing an organic light emitting display apparatus of a top emission type in an active matrix type according to another embodiment of the present invention and a magnified cross-sectional view showing a linear polarization layer thereof.

FIG. 67 is a cross-sectional view schematically showing an organic light emitting display apparatus of a top emission type in an active matrix type according to another embodiment of the present invention. Referring to FIG. 67, a thin film transistor (TFT) is formed on the upper surface of the substrate 120. At least one TFT is formed for each pixel and is electrically connected to the organic light emitting device 130. Since the structure of the TFT is the same as described above with reference to FIG. 62, a detailed description thereof will be omitted herein.

The passivation film 148 is formed on the TFT to cover the TFT. The reflection film 134 is formed on the passivation film 148. The first electrode 131 that works as an anode electrode is formed on the reflection film 134. The pixel definition film 149 is formed of an insulating material to cover the first electrode 131. After forming a predetermined opening in the pixel definition layer 149, the organic light emitting layer 132 is formed in an area defined by the opening. The second electrode 133 is formed thereon.

Figure 68:
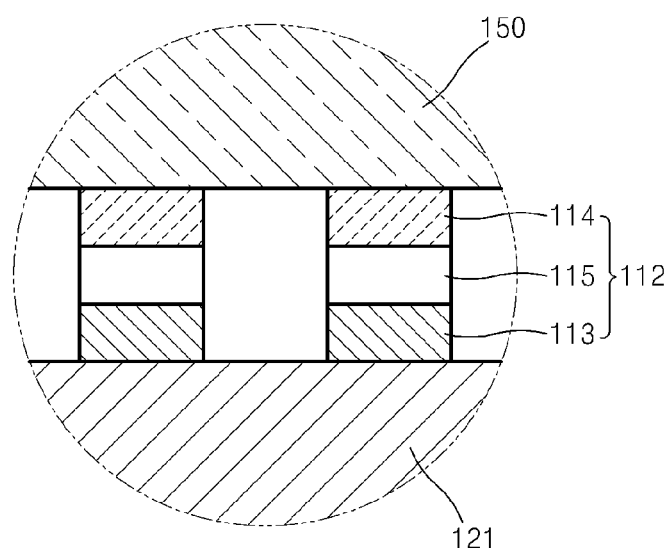

In the embodiment of FIG. 67, the linear polarization layer 122 and the quarter wave layer 121 are sequentially formed on a surface of the sealing member 150 facing the organic light emitting device 130. The detailed structure of the linear polarization layer 122 is illustrated in detail in FIG. 68, which is an enlarged view of a portion X of FIG. 67. The linear polarization layer 122 includes a plurality of the grids 112. The grids 112 are formed between the quarter wave layer 121 and the sealing member 150. Each of the grids 112 includes the first and second metal layers 113 and 114 and the intermediate layer 115. The first metal layer 113 is formed between the quarter wave layer 121 and the intermediate layer 115, and the second metal layer 114 is formed between the sealing member 150 and the intermediate layer 115.

The grids 112 are formed such that the external light reflected by the first metal layer 113 and the second metal layer 114 generates destructive interference. Also, the grids 112 are formed such that the reflectance of the second metal layer 114 arranged closer to the external light is lower than that of the first metal layer 113 so as to make the amplitudes of the reflected external light identical.

Thus, the reflection of the external light when the external light is incident on the grids 112 in a direction from a light source toward the substrate 120 is decreased by increasing the effect of the destructive interference of the external light reflected by the first and second metal layers 113 and 114. As a result, contrast is improved. Since the detailed structure and effect of the grids 112 are the same as those of the embodiment described with reference to FIGS. 5 through 7, descriptions thereof will be omitted herein. Although described herein as the grids 112, the linear polarization layer 122 is not limited thereto such that the linear polarization layer 122 may include the grids 12 as described with reference to FIGS. 1-4.

In the embodiment of FIG. 67, the linear polarization layer 122 and the quarter wave layer 121 can decrease the reflection of the external light input from the upper side of the sealing member 150 that is located in the upper portion of the drawing. The grids 112 improve the destructive interference effect of the reflected external light. As a result, contrast may be improved by preventing decreasing reflection of the external light Although it is not shown in a separate drawing, the structures as shown in FIGS. 49 through 59 may be applied directly to the organic light emitting display apparatus of a top emission type in a passive matrix type.

The above-described embodiments of the present invention are not limited to the organic light emitting display apparatus. Aspects of the present invention can be applied to any flat panel display apparatuses using an organic light emitting device, an LCD, or an electronic emission apparatus as a light emitting device. Further, the reflectance of the grids as described herein may be manipulated by using reflecting layers of different reflectances and/or thicknesses.

The polarizer and the organic light emitting display apparatus according to aspects of the present invention exhibit improved contrast and visibility.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:
1. A polarizer, comprising:
a base; and
a plurality of grids arranged on a surface of the base parallel to one another,
wherein each of the grids comprises:
at least two intermediate layers, and
at least two semi-transmissive metal layers that each reflects a part of external light incident thereon and each transmits a part of the external light incident thereon,
wherein the semi-transmissive metal layers and the intermediate layers are alternately disposed, one of the intermediate layers being positioned to be an outermost layer facing an exterior of the polarizer, and thicknesses of the semi-transmissive metal layers increase as the semi-transmissive metal layers are disposed farther away from the external light,
wherein each of the semi-transmissive metal layers is between two intermediate layers, the semi-transmissive metal layers and the intermediate layers being arranged to generate destructive interference within the external light reflected by the grids, and
wherein each of the intermediate layers is formed of a transparent conductive material, the transparent conductive material being at least one selected from a group consisting of ITO, IZO, ZnO, $In_2O_3$, and combinations thereof.
2. The polarizer of claim 1, wherein each of the semi-transmissive metal layers includes at least one of Fe, Co, V, Ti, Al, Ag, Si, Cr, Mo, Ge, Y, Zn, Zr, W, Ta, Cu, Pt, and combinations thereof.

3. A polarizer, comprising:
a base; and
a grid comprising:
- a first metal layer formed on a surface of the base,
- a second metal layer formed on the first metal layer, and
- an intermediate layer arranged between the first and second metal layers,
- wherein one of the first and second metal layers that is located closer to external light is a semi-transmissive film that reflects a part of the external light incident thereon, transmits a part of the external light incident thereon, and has a reflectance lower than a reflectance of the other metal layer,
- wherein each of the semi-transmissive metal layers is between two intermediate layers, the semi-transmissive metal layers and the intermediate layers being arranged to generate destructive interference within the external light reflected by the grids, and
- wherein each of the intermediate layers is formed of a transparent conductive material, the transparent conductive material being at least one selected from a group consisting of ITO, IZO, ZnO, $In_2O_3$, and combinations thereof.

4. The polarizer of claim 3, wherein the first metal layer is formed of aluminum, and the second metal layer is formed of chromium and is closer to the external light.

5. An organic light emitting display apparatus, comprising:
a substrate;
an organic light emitting device formed on the substrate to form an image;
a sealing member formed on the organic light emitting device;
a quarter wave layer formed on a surface of at least one of the substrate, the organic light emitting device, and the sealing member; and
a linear polarization layer formed on a surface corresponding to at least one of the substrate, the organic light emitting device, the sealing member, and the quarter wave layer, and the linear polarization layer is located closer to a side of the organic light emitting display apparatus that displays the image than the quarter wave layer,
wherein the linear polarization layer includes a plurality of grids arranged parallel to one another, each of the grids comprises:
- at least two intermediate layers, and
- at least two semi-transmissive metal layers that each reflects a part of external light incident thereon and each transmits a part of the external light incident thereon,
- wherein the semi-transmissive metal layers and the intermediate layers are alternately disposed, one of the intermediate layers being positioned to be an outermost layer facing an exterior of the linear polarization layer, and thicknesses of the semi-transmissive metal layers increase as the semi-transmissive metal layers are disposed farther away from the external light,
- wherein the semi-transmissive metal layers and the intermediate layers are formed to generate destructive interference within the external light reflected by the grids, and
- wherein each of the intermediate layers is formed of a transparent conductive material, the transparent conductive material being at least one selected from a group consisting of ITO, IZO, ZnO, $In_2O_3$, and combinations thereof.

6. The organic light emitting display apparatus of claim 5, wherein the semi-transmissive metal layers include at least one of Fe, Co, V, Ti, Al, Ag, Si, Cr, Mo, Ge, Y, Zn, Zr, W, Ta, Cu, Pt, and combinations thereof.

7. The organic light emitting display apparatus of claim 5, wherein the image formed by the organic light emitting device is transmitted in a direction toward the substrate, the linear polarization layer is formed on the substrate, the quarter wave layer is formed on the linear polarization layer, and the organic light emitting device is formed on the quarter wave layer.

8. The organic light emitting display apparatus of claim 5, wherein the image formed by the organic light emitting device is transmitted in a direction toward the substrate, the quarter wave layer is formed on the substrate, the organic light emitting device is formed on the quarter wave layer, and the linear polarization layer is formed on a surface of the substrate opposite to the surface on which the quarter wave layer is formed.

9. The organic light emitting display apparatus of claim 5, wherein the image formed by the organic light emitting device is transmitted in a direction toward the substrate, and the quarter wave layer and the linear polarization layer are sequentially formed on a surface of the substrate opposite to the surface on which the organic light emitting device is formed.

10. The organic light emitting display apparatus of claim 5, wherein the image formed by the organic light emitting device is transmitted in a direction toward the sealing member, the quarter wave layer is formed on the organic light emitting device, and the linear polarization layer is formed on the quarter wave layer.

11. The organic light emitting display apparatus of claim 10, further comprising a protection film disposed between the organic light emitting device and the quarter wave layer.

12. The organic light emitting display apparatus of claim 5, wherein the image formed by the organic light emitting device is transmitted in a direction toward the sealing member, and the quarter wave layer and the linear polarization layer are sequentially formed on a surface of the sealing member opposite to the surface on which the organic light emitting device is formed.

13. The organic light emitting display apparatus of claim 5, wherein the image formed by the organic light emitting device is transmitted in a direction toward the sealing member, the quarter wave layer is formed on a surface of the sealing member that faces the organic light emitting device, and the linear polarization layer is formed on a surface of the sealing member opposite to the surface on which the quarter wave layer is formed.

14. The organic light emitting display apparatus of claim 5, wherein the image formed by the organic light emitting device is transmitted in a direction toward the sealing member, the linear polarization layer is formed on a surface of the sealing member that faces the organic light emitting device, and the quarter wave layer is formed on a surface of the linear polarization layer that faces the organic light emitting device.

15. The organic light emitting display apparatus of claim 5, wherein the image formed by the organic light emitting device is transmitted in a direction toward the sealing member, a reflection film is disposed on the organic light emitting device on a side of the organic light emitting device opposite to the direction toward the sealing member, the quarter wave layer is formed between the reflection film and the organic light emitting device, and the linear polarization layer is formed on the organic light emitting device.

16. An organic light emitting display apparatus, comprising:
  a substrate;
  an organic light emitting device formed on the substrate to form an image;
  a sealing member formed on the organic light emitting device;
  a quarter wave layer formed on a surface of at least one of the substrate, the organic light emitting device, and the sealing member; and
  a linear polarization layer formed on a surface corresponding to at least one of the substrate, the organic light emitting device, the sealing member, and the quarter wave layer, and the linear polarization layer is located closer to a side of the organic light emitting display apparatus that displays the image than the quarter wave layer,
  wherein the linear polarization layer includes a plurality of grids, each grid comprising:
    a first metal layer,
    a second metal layer formed on the first metal layer, and
    an intermediate layer arranged between the first and second metal layers,
    wherein one of the first and second metal layers that is located closer to external light is a semi-transmissive film that reflects a part of the external light incident thereon, transmits a part of the external light incident thereon, and has a reflectance lower than a reflectance of the other metal layer,
    wherein the first metal layer, the second metal layer, and the intermediate layer are formed to generate destructive interference within the external light reflected by the grids, and
    wherein each of the intermediate layers is formed of a transparent conductive material, the transparent conductive material being at least one selected from a group consisting of ITO, IZO, ZnO, $In_2O_3$, and combinations thereof.

17. The organic light emitting display apparatus of claim 16, wherein the first metal layer is formed of aluminum, and the second metal layer is formed of chromium and is closer to the external light.

18. The organic light emitting display apparatus of claim 16, wherein the image formed by the organic light emitting device is transmitted in a direction toward the substrate, the linear polarization layer is formed on the substrate, the quarter wave layer is formed on the linear polarization layer, and the organic light emitting device is formed on the quarter wave layer.

19. The organic light emitting display apparatus of claim 16, wherein the image formed by the organic light emitting device is transmitted in a direction toward the substrate, the quarter wave layer is formed on the substrate, the organic light emitting device is formed on the quarter wave layer, and the linear polarization layer is formed on a surface of the substrate opposite to the surface on which the quarter wave layer is formed.

20. The organic light emitting display apparatus of claim 16, wherein the image formed by the organic light emitting device is transmitted in a direction toward the substrate, and the quarter wave layer and the linear polarization layer are sequentially formed on a surface of the substrate opposite to the surface on which the organic light emitting device is formed.

21. The organic light emitting display apparatus of claim 16, wherein the image formed by the organic light emitting device is transmitted in a direction toward the sealing member, the quarter wave layer is formed on the organic light emitting device, and the linear polarization layer is formed on the quarter wave layer.

22. The organic light emitting display apparatus of claim 21, further comprising a protection film disposed between the organic light emitting device and the quarter wave layer.

23. The organic light emitting display apparatus of claim 16, wherein the image formed by the organic light emitting device is transmitted in a direction toward the sealing member, and the quarter wave layer and the linear polarization layer are sequentially formed on a surface of the sealing member opposite to the surface on which the organic light emitting device is formed.

24. The organic light emitting display apparatus of claim 16, wherein the image formed by the organic light emitting device is transmitted in a direction toward the sealing member, the quarter wave layer is formed on a surface of the sealing member that faces the organic light emitting device, and the linear polarization layer is formed on a surface of the sealing member opposite to the surface on which the quarter wave layer is formed.

25. The organic light emitting display apparatus of claim 16, wherein the image formed by the organic light emitting device is transmitted in a direction toward the sealing member, the linear polarization layer is formed on a surface of the sealing member that faces the organic light emitting device, and the quarter wave layer is formed on a surface of the linear polarization layer that faces the organic light emitting device.

26. The organic light emitting display apparatus of claim 16, wherein the image formed by the organic light emitting device is transmitted in a direction toward the sealing member, a reflection film is disposed on the organic light emitting device on a side of the organic light emitting device opposite to the direction toward the sealing member, the quarter wave layer is formed between the reflection film and the organic light emitting device, and the linear polarization layer is formed on the organic light emitting device.

* * * * *